United States Patent
Tomida et al.

(10) Patent No.: US 8,345,031 B2
(45) Date of Patent: Jan. 1, 2013

(54) DISPLAY DEVICE, DRIVING METHOD FOR DISPLAY DEVICE, AND ELECTRONIC APPARATUS

(75) Inventors: Masatsugu Tomida, Kanagawa (JP); Mitsuru Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 940 days.

(21) Appl. No.: 12/385,339

(22) Filed: Apr. 6, 2009

(65) Prior Publication Data

US 2010/0141626 A1     Jun. 10, 2010

(30) Foreign Application Priority Data

May 8, 2008   (JP) ............... P2008-121998
Oct. 27, 2008 (JP) ............... P2008-275095

(51) Int. Cl.
*G06F 3/038* (2006.01)
(52) U.S. Cl. ............... 345/211; 345/50; 345/52; 345/84
(58) Field of Classification Search ............... None
See application file for complete search history.

(56) References Cited

U.S. PATENT DOCUMENTS

| | | |
|---|---|---|
| 2006/0176250 A1 | 8/2006 | Nathan et al. |
| 2007/0247398 A1 | 10/2007 | Nathan et al. |
| 2008/0246747 A1 * | 10/2008 | Taneda et al. ............... 345/204 |

FOREIGN PATENT DOCUMENTS

| | | |
|---|---|---|
| JP | 2003-255897 A | 9/2003 |
| JP | 2003-271095 A | 9/2003 |
| JP | 2004-295131 A | 10/2004 |
| JP | 2006-133542   | 5/2006 |
| JP | 2007-310311 A | 11/2007 |
| JP | 2008-523425 T | 7/2008 |
| JP | 2009-533717 T | 9/2009 |
| WO | WO-2006/060902 A1 | 6/2006 |

OTHER PUBLICATIONS

Japanese Office Action issued May 11, 2010 for corresponding Japanese Application No. 2008-275095.

* cited by examiner

*Primary Examiner* — Muhammad N Edun
(74) *Attorney, Agent, or Firm* — Rader Fishman & Grauer, PLLC

(57) ABSTRACT

A display device includes a pixel array unit including pixels arranged in a matrix, the pixels each including an electrooptical element, a writing transistor for writing an image signal, a storage capacitor for storing the image signal, and a driving transistor for driving the electrooptical element in accordance with the image signal, the pixels each having a threshold correction process function for, before light emission of the electrooptical element, changing a source potential of the driving transistor to a potential obtained by subtracting a threshold voltage of the driving transistor from an initial gate potential of the driving transistor; and a power supply unit configured to set, as a power supply potential of a power supply line for supplying a current to the driving transistor, different potential values for a threshold correction period for execution of the threshold correction process and a light-emission period for the electrooptical element.

13 Claims, 39 Drawing Sheets

BEFORE t=t11 t=t11 t=t12 t=t13 t=t14 t=t15 t=t16 t=t17

SATURATION REGION Vds > Vgs − Vth (a) Ids AFTER THRESHOLD CORRECTION PROCESS (b) Ids DURING LIGHT EMISSION $$I_{ds} = \frac{1}{2}\frac{W}{L} C_{ox}\mu(V_{gs}-V_{th})^2(1+\lambda V_{ds})$$

λ: CHANNEL-LENGTH MODULATION FACTOR (a) Ids AFTER THRESHOLD CORRECTION PROCESS (b) Ids DURING LIGHT EMISSION

SATURATION REGION Vds > Vgs − Vth (a) Ids AFTER THRESHOLD CORRECTION PROCESS
(b) Ids DURING LIGHT EMISSION $$I_{ds} = \frac{1}{2}\frac{W}{L}C_{ox}\mu(V_{gs}-V_{th})^2(1+\lambda V_{ds})$$

λ: CHANNEL-LENGTH MODULATION FACTOR (a) Ids AFTER THRESHOLD CORRECTION PROCESS
(b) Ids DURING LIGHT EMISSION (a) Ids AFTER THRESHOLD CORRECTION PROCESS
(b) Ids DURING LIGHT EMISSION
(c) Ids DURING MOBILITY CORRECTION PERIOD (a) Ids AFTER THRESHOLD CORRECTION PROCESS
(b) Ids DURING LIGHT EMISSION
(c) Ids DURING MOBILITY CORRECTION PERIOD

BEFORE t=t21 t=t21 t=t22 t=t25 t=t25−t26 t=t31 t=t32 t=t33

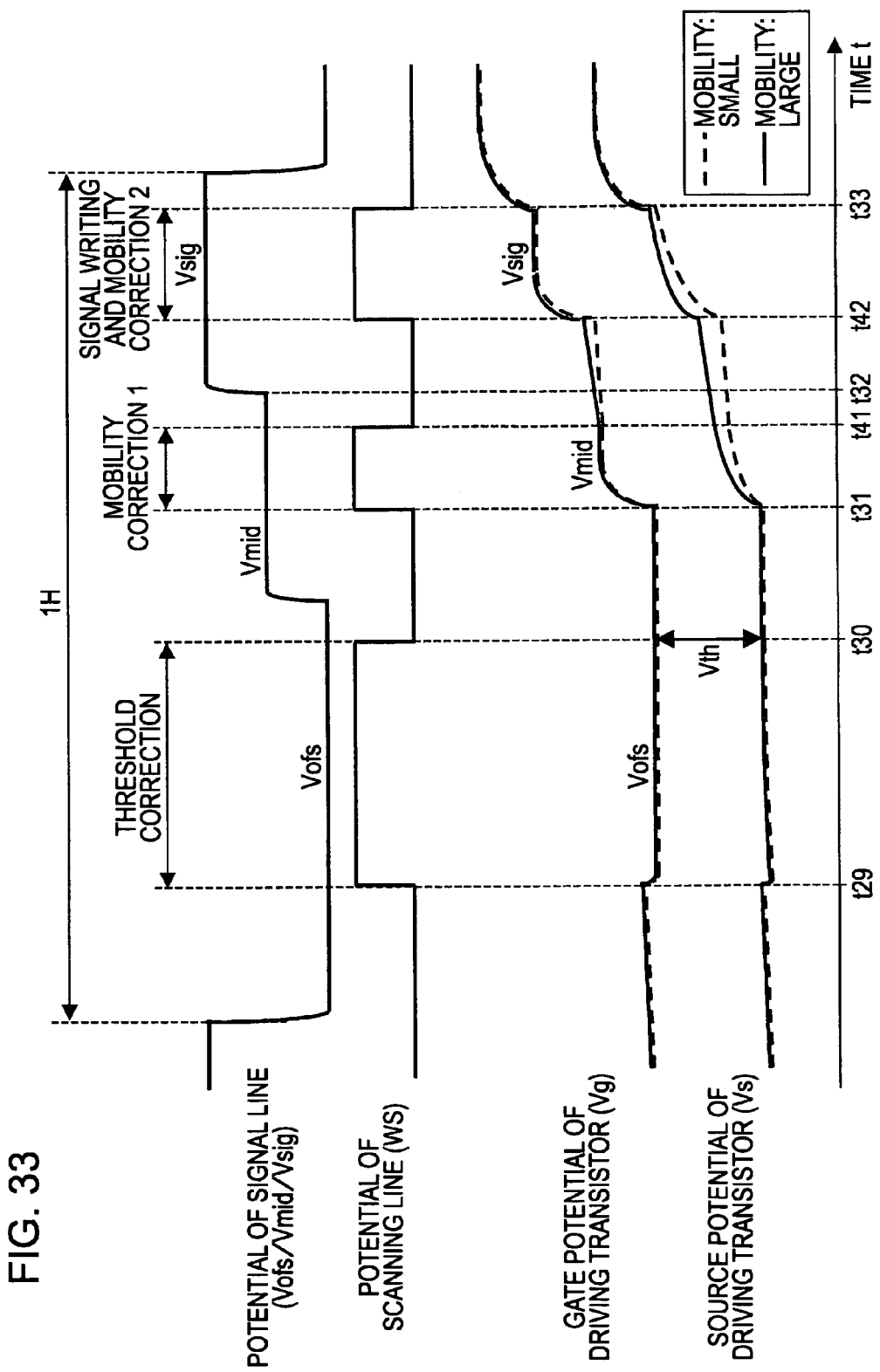

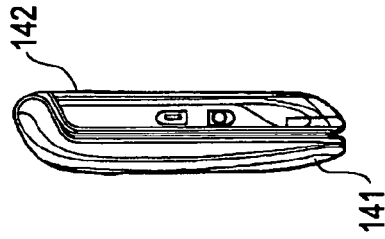
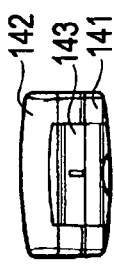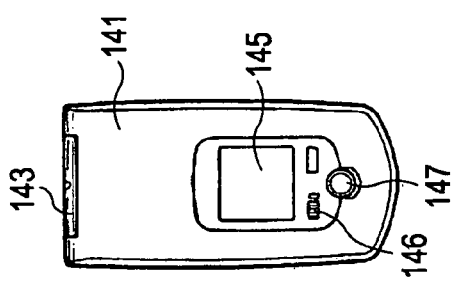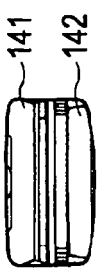
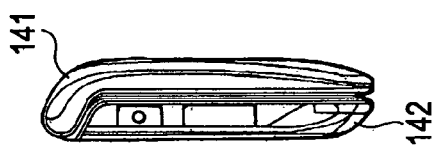
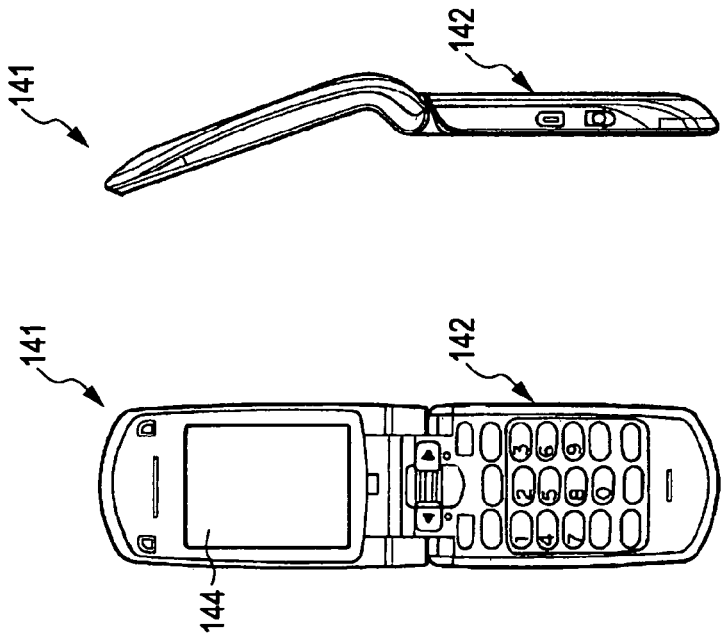
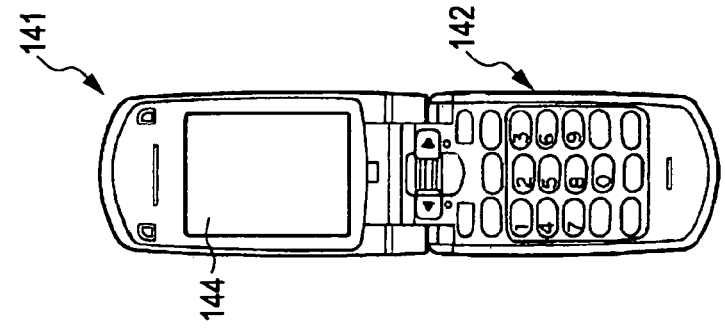

DISPLAY DEVICE, DRIVING METHOD FOR DISPLAY DEVICE, AND ELECTRONIC APPARATUS

BACKGROUND OF THE INVENTION

1. Field of the Invention

The present invention relates to display devices, driving methods for display devices, and electronic apparatuses, and more particularly, to a flat-screen (flat panel) display device in which pixels are two-dimensionally arranged in a matrix, a driving method for the display device, and an electronic apparatus including the display device.

2. Description of the Related Art

In recent years, in the area of display devices that display images, flat-screen display devices in which pixels (pixel circuits) are arranged in a matrix have rapidly become popular. Display devices including, as light-emitting elements of individual pixels, so-called current-driven electrooptical elements whose light emission luminances vary in accordance with the values of currents flowing in the elements, are one type of flat-screen display devices. In addition, organic electroluminescence (EL) elements exhibiting a phenomenon of emitting light when an electric field is applied to an organic thin film, are one type of current-driven electrooptical elements.

Organic EL display devices including organic EL elements as electrooptical elements of individual pixels have the features described below. That is, since organic EL elements are capable of being driven at an applied voltage of 10 V or less, a decrease in power consumption can be realized by using organic EL elements. Organic EL elements are light-emitting elements. Thus, compared with liquid crystal display devices in which the intensity of light from a light source is controlled using liquid crystals for each pixel so that images can be displayed, organic EL elements achieve high image visibility. Furthermore, since illumination equipment, such as a backlight, is not necessary, reductions in weight and thickness can be easily achieved. Moreover, since the response speed of organic EL elements is very high, such as about several microseconds, no afterimage is produced in the case of displaying moving images.

As in liquid crystal display devices, organic EL display devices can employ, as driving methods for organic EL display devices, a simple (passive) matrix method and an active matrix method. However, although simple-matrix display devices have a simple configuration, a light-emission period of an electrooptical element is shortened as the number of scanning lines (that is, the number of pixels) increases. Thus, it is difficult to realize a large-sized and high-definition display device.

Under such circumstances, in recent years, the development of active-matrix display devices in which currents flowing in electrooptical elements are controlled by active elements, such as insulated-gate field-effect transistors, provided in the same pixels where the corresponding electrooptical elements are provided, has been extensively conducted. As insulated-gate field-effect transistors, in general, thin-film transistors (TFTs) are used. In active-matrix display devices, electrooptical elements maintain light emission during a one-frame period. Thus, a large-sized and high-definition display device can be easily realized.

In general, the current-voltage characteristics (I-V characteristics) of organic EL elements deteriorate as the time passes (deteriorate with time). In particular, in a pixel circuit including an N-channel TFT as a transistor that drives an organic EL element by using a current (hereinafter, referred to as a "driving transistor"), when the I-V characteristics of the organic EL element deteriorate with time, the gate-source voltage Vgs of the driving transistor also varies. As a result, the light emission luminance of the organic EL element varies. This is because the organic EL element is connected to the source electrode side of the driving transistor.

More specifically, the source potential of a driving transistor is determined in accordance with an operating point of the driving transistor and an organic EL element. When the I-V characteristics of the organic EL element deteriorate, the operating point of the driving transistor and the organic EL element varies. Thus, even if a constant voltage is applied to the gate electrode of the driving transistor, the source potential of the driving transistor varies. Hence, since the source-gate voltage Vgs of the driving transistor varies, the value of a current flowing in the driving transistor varies. As a result, since the value of a current flowing in the organic EL element also varies, the light emission luminance of the organic EL element varies.

In particular, in a pixel circuit including a polysilicon TFT as a driving transistor, in addition to a deterioration in the I-V characteristics of an organic EL element with time, the transistor characteristics of the driving transistor vary with time and the transistor characteristics differ for each pixel depending on the manufacturing process. That is, the transistor characteristics of a driving transistor are different for each pixel. The transistor characteristics include, for example, the threshold voltage Vth of the driving transistor, the mobility $\mu$ of a semiconductor thin film forming a channel of the driving transistor (hereinafter, simply referred to as "the mobility $\mu$ of a driving transistor"), and the like.

In a case where the transistor characteristics of a driving transistor are different for each pixel, the value of a current flowing in the driving transistor is different for each pixel. Thus, even if the same voltage is applied to the gate electrodes of the driving transistors in individual pixels, a pixel-to-pixel variation occurs in the light emission luminance of the organic EL element. As a result, the uniformity (evenness) of a screen is degraded.

Thus, in order to maintain a constant light emission luminance of an organic EL element without the light emission luminance being affected by a deterioration in the I-V characteristics of the organic EL element with time, a variation in the transistor characteristics of a driving transistor with time, and the like, a pixel circuit has various correction (compensation) functions (for example, see Japanese Unexamined Patent Application Publication No. 2006-133542).

The correction functions include, for example, a compensation function for a variation in the characteristics of an organic EL element, a correction function for a variation in the threshold voltage Vth of a driving transistor, a correction function for a variation in the mobility $\mu$ of a driving transistor, and the like. Hereinafter, the correction of a variation in the threshold voltage Vth of a driving transistor will be referred to as "threshold correction", and the correction of a variation in the mobility $\mu$ of a driving transistor will be referred to as "mobility correction".

As described above, since each pixel circuit has various correction functions, the light emission luminance of an organic EL element can be maintained constant without the light emission luminance being affected by a deterioration in the I-V characteristics of the organic EL element with time and a variation in the transistor characteristics of a driving transistor with time. As a result, the display quality of an organic EL display device can be improved.

SUMMARY OF THE INVENTION

In general, as shown in FIG. 44, transistors have characteristics in which a drain current (drain-source current) considerably increases, until a drain voltage (drain-source voltage) reaches a specific level, and then saturates when the drain voltage exceeds the specific level. However, even after saturation, the drain current linearly increases at a constant gradient as the drain voltage increases. The drain voltage-drain current characteristics shown in FIG. 44 are ideal characteristics.

In actuality, as shown in FIG. 45, a phenomenon in which the linearity of the drain voltage-drain current characteristics is destroyed, more specifically, a drain current considerably increases in a saturation region, that is, a so-called kink phenomenon, occurs. A kink phenomenon is a phenomenon in which some of carriers generated by ionization by collision of channel carriers flow into a floating substrate and a current increases due to a variation in the potential of the substrate and a resultant reduction in the threshold voltage. The kink phenomenon degrades the linearity of the drain voltage-drain current characteristics, and causes distortion of an output waveform. The degree of occurrence of a kink phenomenon varies in accordance with a manufacturing variation.

The driving transistor described above is designed so as to operate in a saturation region. Concerning the drain-source voltage Vds of the driving transistor, the drain-source voltage Vds after performance of a threshold correction process is large, whereas the drain-source voltage Vds during light emission of the organic EL element is small. Here, if the degree of occurrence of a kink phenomenon varies, in a case where a variation in the drain-source voltage Vds occurs inside and outside a region where the kink phenomenon occurs, the variation in the drain-source voltage Vds is affected by the variation in the degree of occurrence of the kink phenomenon (described later in detail). As a result, since the drain-source current Ids differs for each pixel and the driving current for the organic EL element thus differs for each pixel, the luminance differs between individual pixels. Hence, the image quality is degraded.

It is desirable to provide a display device that reduces a variation in a driving current for an electrooptical element caused by a kink phenomenon of a driving transistor and thus improves the quality of a display image, a driving method for driving the display device, and an electronic apparatus including the display device.

According to an embodiment of the present invention, for driving a display device in which pixels are arranged in a matrix, the pixels each including an electrooptical element, a writing transistor for writing an image signal, a storage capacitor for storing the image signal written by the writing transistor, and a driving transistor for driving the electrooptical element in accordance with the image signal stored in the storage capacitor, the pixels each having a function of performing a threshold correction process for, prior to driving the electrooptical element to emit light, changing a potential of a source of the driving transistor to a potential obtained by subtracting a threshold voltage of the driving transistor from an initial potential of a gate of the driving transistor, different potential values are set, as a power supply potential of a power supply line for supplying a current to the driving transistor, for a threshold correction period during which the threshold correction process is performed and for a light-emission period during which the electrooptical element emits light.

When the power supply potential of the power supply line during the threshold correction period during which the threshold correction process is performed is the same as the power supply potential of the power supply line during the light-emission period for the electrooptical element, a difference occurs between the drain-source voltage Vds of the driving transistor after performance of the threshold correction process and the drain-source voltage Vds of the driving transistor during light emission of the electrooptical element. Thus, different potential values are set, as the power supply potential of the power supply line, for the threshold correction period and for the light-emission period. Hence, a difference between the drain-source voltage Vds after performance of the threshold correction process and the drain-source voltage Vds during light emission of the electrooptical element can be reduced compared with a case where the power supply potential of the power supply line during the threshold correction period is the same as the power supply potential of the power supply line during the light-emission period. As a result, even if a kink phenomenon occurs in the driving transistor and the degree of occurrence of the kink phenomenon varies in accordance with a manufacturing variation, a pixel-to-pixel variation in the drain-source current Ids of the driving transistor, furthermore, a variation in the driving current for the electrooptical element can be reduced.

According to an embodiment of the present invention, a variation in a driving current for an electrooptical element caused by a kink phenomenon of a driving transistor can be reduced. Thus, the quality of a display image can be improved.

BRIEF DESCRIPTION OF THE DRAWINGS

FIG. 33 is a waveform timing chart for explaining a circuit operation according to a modification of the second embodiment;

FIG. 43A is a front view showing the external appearance of a cellular phone according to an embodiment of the present invention in an opened state, FIG. 43B is a side view showing the external appearance of the cellular phone in the opened state, FIG. 43C is a front view showing the external appearance of the cellular phone in a closed state, FIG. 43D is a left-side view showing the external appearance of the cellular phone in the closed state, FIG. 43E is a right-side view showing the external appearance of the cellular phone in the closed state, FIG. 43F is a top view showing the external appearance of the cellular phone in the closed state, and FIG. 43G is a bottom view showing the external appearance of the cellular phone in the closed state;

DESCRIPTION OF THE PREFERRED EMBODIMENTS

Figure 1:
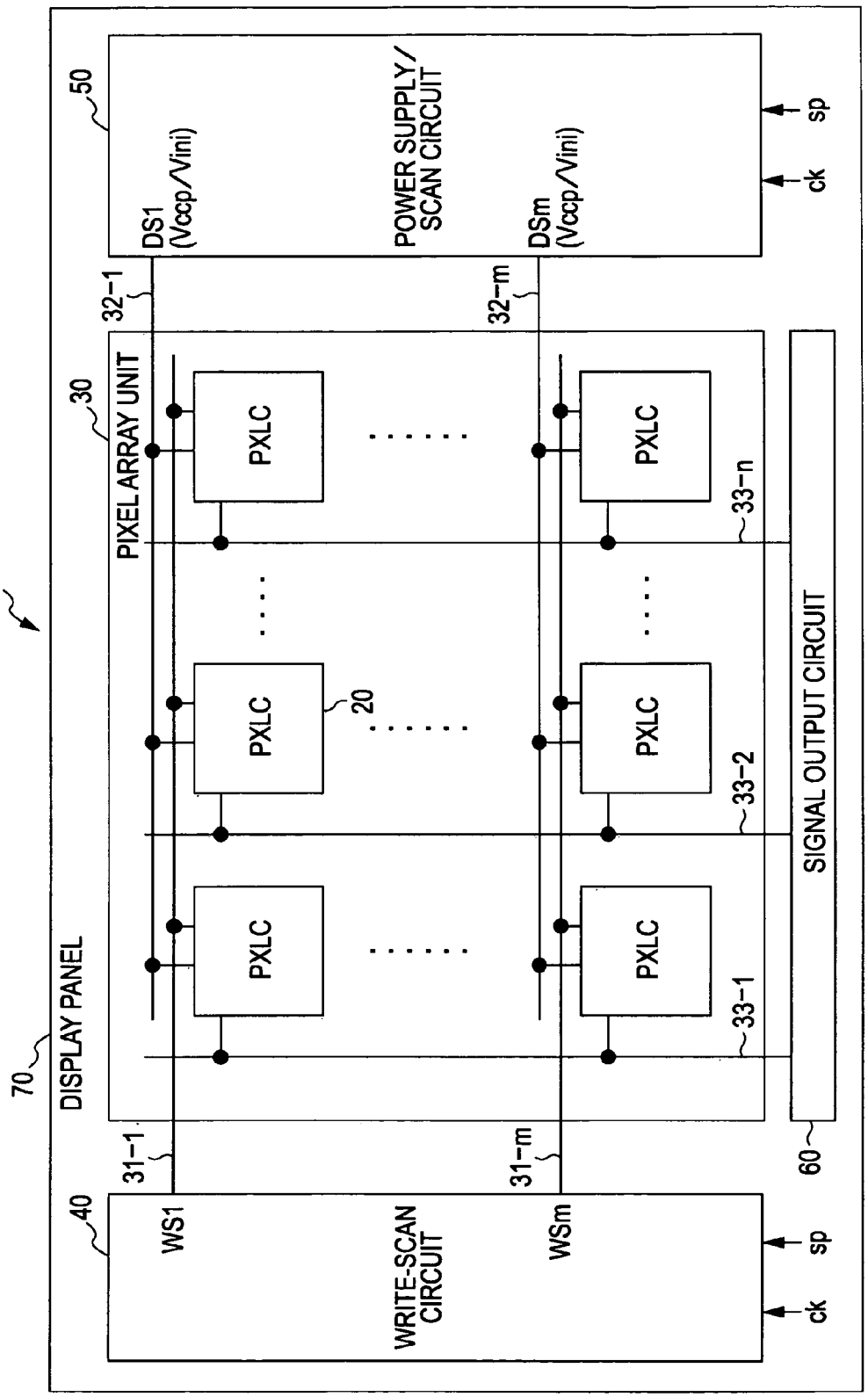
FIG. 1 schematically shows an example of the system configuration of an organic EL display device according to an embodiment of the present invention.

Preferred embodiments (hereinafter, referred to as "embodiments") of the present invention will be described with reference to the drawings. Descriptions will be provided in the following order:
Organic EL display device according to an embodiment of the present invention
First embodiment
Second embodiment
Modifications
Applications
Organic EL Display Device According to an Embodiment of the Present Invention
System Configuration FIG. 1 schematically shows an example of the system configuration of an active-matrix display device according to an embodiment of the present invention. An active-matrix organic EL display device including, as light-emitting elements of individual pixels (pixel circuits), current-driven electrooptical elements, such as organic EL elements, whose light emission luminances vary in accordance with the values of currents flowing in the elements, will be described by way of example.

Referring to FIG. 1, an organic EL display device 10 according to an embodiment of the present invention includes a pixel array unit 30 in which a plurality of pixels 20 each including a light-emitting element are two-dimensionally arranged in a matrix, and driving units arranged near the pixel array unit 30. The driving units drive the pixels 20 in the pixel array unit 30. The driving units are, for example, a write-scan circuit 40, a power supply/scan circuit 50, and a signal output circuit 60.

In a case where the organic EL display device 10 supports color display, one pixel includes a plurality of sub-pixels. The sub-pixels correspond to the pixels 20. More specifically, in a display device that supports color display, one pixel includes three sub-pixels, that is, a sub-pixel emitting red light (R), a sub-pixel emitting green light (G), and a sub-pixel emitting blue light (B).

However, one pixel is not necessarily constituted by a combination of sub-pixels of three primary colors, R, G, and B. One pixel may be constituted by a combination of sub-pixels of three primary colors and one or more sub-pixels of one or more different colors. More specifically, for example, in order to increase the luminance, one pixel may further include a sub-pixel emitting white light (W). In addition, in order to increase the color reproduction range, one pixel may further include at least one sub-pixel emitting light of a complementary color.

In the pixel array unit 30, for the arrangement of the pixels 20 in m rows and n columns, scanning lines 31-1 to 31-$m$ and power supply lines 32-1 to 32-$m$ are arranged for individual pixel rows along a row direction (a pixel arrangement direction in a pixel row). Furthermore, signal lines 33-1 to 33-$n$ are arranged for individual pixel columns along a column direction (a pixel arrangement direction in a pixel column).

The scanning lines 31-1 to 31-$m$ are connected to output terminals in corresponding rows of the write-scan circuit 40. The power supply lines 32-1 to 32-$m$ are connected to output terminals in corresponding rows of the power supply/scan circuit 50. The signal lines 33-1 to 33-$n$ are connected to output terminals in corresponding columns of the signal output circuit 60.

Normally, the pixel array unit 30 is arranged on a transparent insulating substrate, such as a glass substrate. With this arrangement, the organic EL display device 10 has a flat-screen (flat) panel configuration. Driving circuits for the pixels 20 in the pixel array unit 30 can be formed by amorphous silicon TFTs or low-temperature polysilicon TFTs. In a case where low-temperature polysilicon TFTs are used, the write-scan circuit 40, the power supply/scan circuit 50, and the signal output circuit 60 can also be formed on a display panel (substrate) 70 on which the pixel array unit 30 is formed.

The write-scan circuit 40 includes a shift register and the like for sequentially shifting (transferring) start pulses sp in synchronization with clock pulses ck. In order to write image signals to the pixels 20 in the pixel array unit 30, the write-scan circuit 40 sequentially performs, in units of rows, scanning (line-sequential scanning) of the pixels 20 in the pixel array unit 30 by sequentially supplying write-scan signals WS (WS1 to WSm) to the scanning lines 31-1 to 31-$m$.

The power supply/scan circuit 50 includes a shift register and the like for sequentially shifting start pulses sp in synchronization with clock pulses ck. The power supply/scan circuit 50 supplies, in synchronization with line-sequential scanning by the write-scan circuit 40, power supply potentials DS (DS1 to DSm), which are switched between a first power supply potential Vccp and a second power supply potential Vini lower than the first power supply potential Vccp, to the power supply lines 32-1 to 32-$m$. By switching the power supply potentials DS between the first power supply potential Vccp and the second power supply potential Vini, the pixels 20 are controlled to emit light or not to emit light.

The signal output circuit 60 selectively outputs the signal voltage Vsig of an image signal corresponding to luminance information supplied from a signal supply source, which is not illustrated, (hereinafter, may be simply referred to as a "signal voltage"). In the case of a display device according to a first embodiment described later, the signal output circuit 60 also selectively outputs a reference potential Vofs. In the case of a display device according to a second embodiment described later, the signal output circuit 60 also selectively outputs the reference potential Vofs and at least one type of halftone voltage Vmid (described later in detail).

The signal voltage Vsig/the reference potential Vofs (or the signal voltage Vsig/the reference potential Vofs/the halftone voltage Vmid) output from the signal output circuit 60 is written, in units of columns, to the individual pixels 20 in the pixel array unit 30 through the signal lines 33-1 to 33-$n$. That is, the signal output circuit 60 employs a driving method of line-sequential writing for writing signal voltages Vsig in units of columns (lines).

Pixel Circuit

Figure 2:
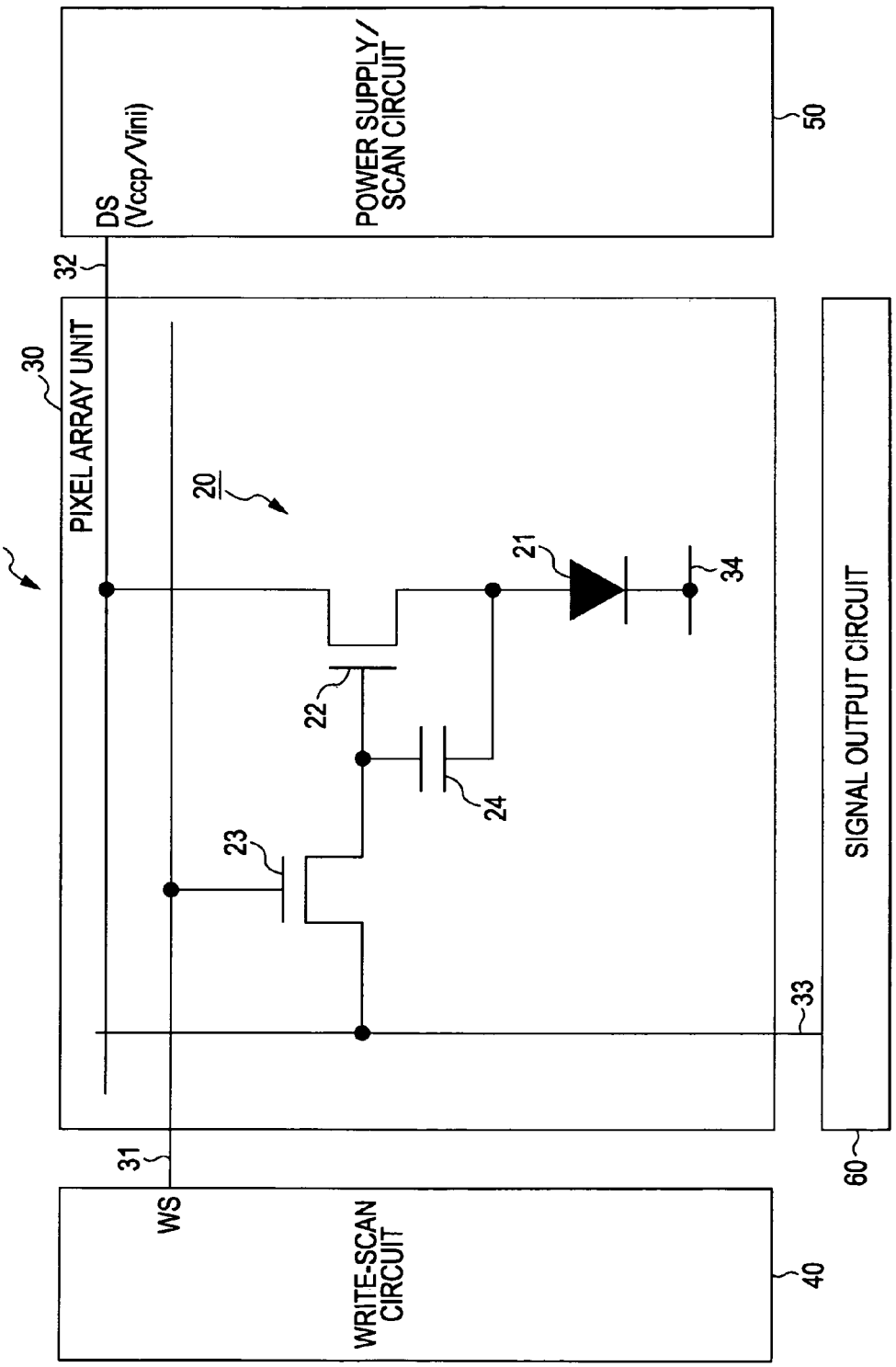
FIG. 2 is a circuit diagram showing an example of the circuit configuration of one of pixels of an organic EL display device according to an embodiment of the present invention.

FIG. 2 is a circuit diagram showing a specific example of the circuit configuration of one of the pixels (pixel circuits) 20.

Referring to FIG. 2, the pixel 20 includes a current-driven electrooptical element, such as an organic EL element 21, whose light emission luminance varies in accordance with the value of a current flowing in the element, and a driving circuit that drives the organic EL element 21. The cathode electrode of the organic EL element 21 is connected to a common power supply line 34. The common power supply line 34 is wired in common to all the pixels 20 (so-called solid wiring).

The driving circuit that drives the organic EL element 21 includes a driving transistor 22, a writing transistor 23, and a storage capacitor 24. In this embodiment, N-channel TFTs are used as the driving transistor 22 and the writing transistor 23. However, this combination of conductivity types of the driving transistor 22 and the writing transistor 23 is merely an example. The combination of conductivity types of the driving transistor 22 and the writing transistor 23 is not necessarily limited to this.

In a case where the driving transistor 22 and the writing transistor 23 are N-channel TFTs, an amorphous silicon (a-Si) process can be employed. With the use of the a-Si process, a reduction in the cost of a substrate in which TFTs are formed can be achieved and a reduction in the cost of the organic EL display device 10 can thus be achieved. In addition, in a case where the driving transistor 22 and the writing transistor 23 are of the same conductivity type, the driving transistor 22 and the writing transistor 23 can be formed by the same process. Thus, a reduction in the cost can be achieved.

One electrode (source/drain electrode) of the driving transistor 22 is connected to the anode electrode of the organic EL element 21, and the other electrode (drain/source electrode) of the driving transistor 22 is connected to the power supply line 32 (that is, a corresponding one of the power supply lines 32-1 to 32-$m$).

One electrode (source/drain electrode) of the writing transistor 23 is connected to the signal line 33 (that is, a corresponding one of the signal lines 33-1 to 33-$n$), and the other electrode of the writing transistor 23 is connected to the gate electrode of the driving transistor 22. The gate electrode of the writing transistor 23 is connected to the scanning line 31 (that is, a corresponding one of the scanning lines 31-1 to 31-$m$).

One electrode of each of the driving transistor 22 and the writing transistor 23 is a metal wire that is electrically connected to a source/drain region, and the other electrode of each of the driving transistor 22 and the writing transistor 23 is a metal wire that is electrically connected to a drain/source region. In addition, depending on the potential relationship between one electrode and the other electrode, the one electrode may be a source electrode or a drain electrode, and the other electrode may be a drain electrode or a source electrode.

One electrode of the storage capacitor 24 is connected to the gate electrode of the driving transistor 22, and the other electrode of the storage capacitor 24 is connected to the one electrode of the driving transistor 22 and the anode electrode of the organic EL element 21.

The driving circuit for the organic EL element 21 does not necessarily have a circuit configuration including two transistor, the driving transistor 22 and the writing transistor 23, and one capacitive element, the storage capacitor 24. For example, the driving circuit may have a circuit configuration in which an auxiliary capacitor whose one electrode is connected to the anode electrode of the organic EL element 21 and whose other electrode is connected to a fix potential is provided so that a shortage of the capacitance of the organic EL element 21 can be solved.

In the pixel 20 having the configuration described above, in response to a high-active write-scan signal WS which is applied from the write-scan circuit 40 through the scanning line 31 to the gate electrode of the writing transistor 23, the writing transistor 23 enters a conductive state. Thus, the writing transistor 23 samples the signal voltage Vsig of an image signal corresponding to luminance information or the reference potential Vofs (or Vofs1/Vofs2) supplied through the signal line 33 from the signal output circuit 60 and writes the sampled signal voltage Vsig or reference potential Vofs (or Vofs1/Vofs2) to the pixel 20. The written signal voltage Vsig or reference potential Vofs (or signal voltage Vsig/reference potential Vofs/halftone voltage Vmid) is applied to the gate electrode of the driving transistor 22 and stored in the storage capacitor 24.

In a case where the potential DS of the power supply line 32 (32-1 to 32-$m$) is the first power supply potential Vccp, the driving transistor 22 operates in a saturation region while one electrode serves as a drain electrode and the other electrode serves as a source electrode. Thus, the driving transistor 22 receives a current from the power supply line 32 and drives, by using the current, the organic EL element 21 to emit light. More specifically, since the driving transistor 22 operates in a saturation region, the driving transistor 22 supplies, to the organic EL element 21, a driving current at a current value corresponding to the signal voltage Vsig stored in the storage capacitor 24, and drives the organic EL element 21 by using the current. Accordingly, the driving transistor 22 causes the organic EL element 21 to emit light.

When the power supply potential DS is switched from the first power supply potential Vccp to the second power supply potential Vini, the driving transistor 22 operates as a switching transistor while one electrode serves as a source electrode and the other electrode serves as a drain electrode. Thus, the driving transistor 22 stops supplying a driving current to the organic EL element 21 and causes the organic EL element 21 to enter a non-light-emission state. That is, the driving transistor 22 also serves as a transistor for controlling the organic EL element 21 to emit light or not to emit light.

By the switching operation of the driving transistor 22, a period during which the organic EL element 21 is in a non-light-emission state (that is, a non-light-emission period) is provided, and the ratio (duty ratio) of the light-emission period to the non-light-emission period of the organic EL element 21 is controlled. With the control of the duty ratio, afterimage blur caused by light emission of a pixel during a one-frame period can be reduced. Thus, in particular, the quality of a moving image can further be improved.

Here, the reference potential Vofs (or the signal voltage Vsig/the reference potential Vofs/the halftone voltage Vmid) selectively supplied through the signal line 33 from the signal output circuit 60 serves as a reference of the signal voltage Vsig of an image signal corresponding to luminance information (for example, corresponds to the black level of an image signal).

The first power supply potential vccp, of the first and second power supply potentials Vccp and Vini selectively supplied through the power supply line 32 from the power supply/scan circuit 50, is a power supply potential used for supplying a driving current for causing the organic EL element 21 to emit light to the driving transistor 22. In addition, the second power supply potential Vini is a power supply potential used for applying an inverse bias to the organic EL element 21. The second power supply potential Vini is a potential lower than the reference potential Vofs. For example, the second power supply potential Vini is set to a potential lower than a value represented by Vofs−Vth, where the threshold voltage of the driving transistor 22 is represented by Vth. Preferably, the second power supply potential Vini is set to a potential substantially lower than the value represented by Vofs−Vth.

Pixel Structure

Figure 3:
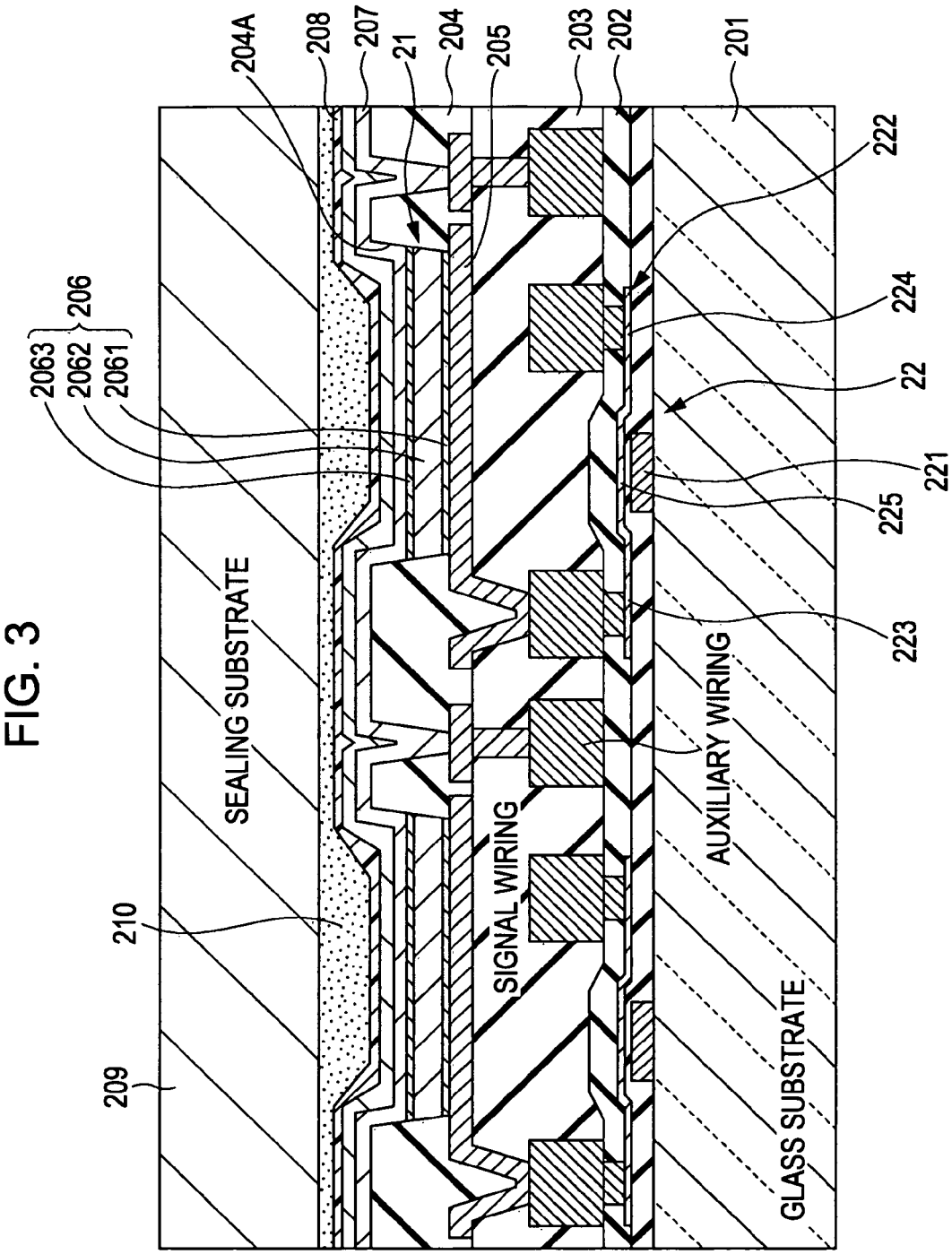
FIG. 3 is a cross-section view showing an example of the cross-section structure of a pixel.

FIG. 3 is a cross-section view showing an example of the cross-section structure of the pixels 20. Referring to FIG. 3, a driving circuit including the driving transistor 22 and the like is formed on a glass substrate 201. The pixel 20 has a structure in which an insulating film 202, an insulating planarization film 203, and a window insulating film 204 are formed on the glass substrate 201 in that order and the organic EL element 21 is provided in a recessed portion 204A of the window insulating film 204. In FIG. 3, among component parts of the driving circuit, only the driving transistor 22 is illustrated and the other component parts are not illustrated.

The organic EL element 21 includes an anode electrode 205, an organic layer 206 (including an electron transporting layer section 2063, a light emission layer section 2062, and a hole transporting/hole injecting layer section 2061), and a cathode electrode 207. The anode electrode 205 is made of a metal or the like formed at the bottom of the recessed portion 204A of the window insulating film 204. The organic layer 206 is formed over the anode electrode 205. The cathode electrode 207 is made of a transparent conductive film or the like formed over the organic layer 206 in common to all the pixels 20.

In the organic EL element 21, the organic layer 206 is formed in such a manner that the hole transporting/hole injecting layer section 2061, the light emission layer section 2062, the electron transporting layer section 2063, and an electron injecting layer section (not illustrated) are sequentially deposited over the anode electrode 205. Since a current flows from the driving transistor 22 through the anode electrode 205 to the organic layer 206 under the current driving by the driving transistor 22 shown in FIG. 2, light is emitted at the recombination of an electron and a hole in the light emission layer section 2062 of the organic layer 206.

The driving transistor 22 includes a gate electrode 221, a source/drain region 223 and a drain/source region 224 which are provided on end portions of a semiconductor layer 222, and a channel formation region 225 of the semiconductor layer 222 that faces the gate electrode 221. The source/drain region 223 is electrically connected to the anode electrode 205 of the organic EL element 21 through a contact hole.

As shown in FIG. 3, the organic EL elements 21 are formed on the glass substrate 201, for individual pixels, with the insulating film 202, the insulating planarization film 203, and the window insulating film 204 therebetween. Then, a sealing substrate 209 is bonded to the organic EL elements 21 with a passivation film 208 therebetween by using an adhesive agent 210. Accordingly, the organic EL elements 21 are sealed using the sealing substrate 209, and the display panel 70 is formed.

First Embodiment

Organic EL display devices according to embodiments of the present invention are based on the organic EL display device 10 according to an embodiment of the present invention having the system configuration described above. An organic EL display device 10A according to a first embodiment of the present invention has a configuration in which the signal output circuit 60 selectively outputs the signal voltage Vsig of an image signal and the reference potential Vofs. As described above, the reference potential Vofs serves as a reference of the signal voltage Vsig of an image signal.

Circuit Operation

The basic circuit operation of the organic EL display device 10A according to the first embodiment will be described with reference to operation diagrams of FIGS. 5A to 5D and FIGS. 6A to 6D on the basis of a waveform timing chart of FIG. 4. For simplification, in the operation diagrams of FIGS. 5A to 5D and FIGS. 6A to 6D, the writing transistor 23 is illustrated by using a symbol representing a switch. In addition, an equivalent capacitor 25 for the organic EL element 21 is also illustrated.

Figure 4:
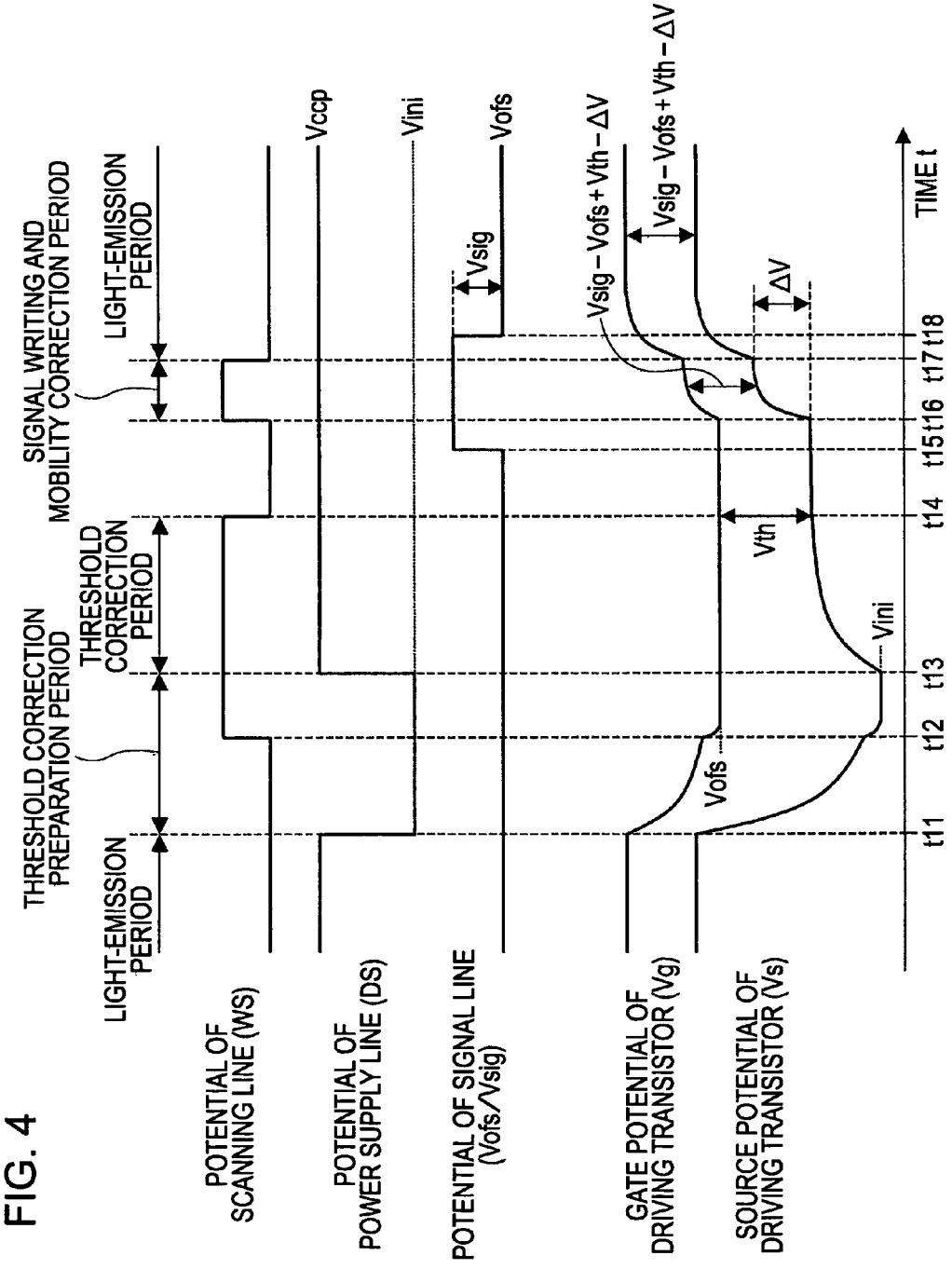
FIG. 4 is a waveform timing chart for explaining a basic circuit operation of an organic EL display device according to a first embodiment.

The waveform timing chart of FIG. 4 shows variations in the potential (write-scan signal) WS of the scanning line 31, the potential (power supply potential) DS of the power supply line 32, the potential (Vsig/Vofs) of the signal line 33, and the gate potential Vg and the source potential Vs of the driving transistor 22.

Light-Emission Period of Preceding Frame

Referring to the waveform timing chart of FIG. 4, a period before time t11 is a light-emission period of the organic EL element 21 for the preceding frame (field). In the light-emission period for this frame, the potential DS of the power supply line 32 is the first power supply potential (hereinafter, referred to as a "high potential") Vccp and the writing transistor 23 is in a non-conductive state.

Figure 5A:
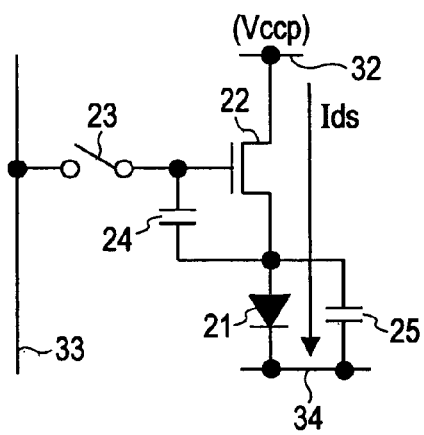
FIGS. 5A to 5D are explanatory diagrams showing the basic circuit operation of the organic EL display device according to the first embodiment.

Here, the driving transistor 22 is designed so as to operate in a saturation region. Thus, as shown in FIG. 5A, a driving current (drain-source current) Ids corresponding to the gate-source voltage Vgs of the driving transistor 22 is supplied from the power supply line 32 through the driving transistor 22 to the organic EL element 21. Thus, the organic EL element 21 emits light at a luminance corresponding to the value of the driving current Ids.

Threshold Correction Preparation Period

Figure 5B:
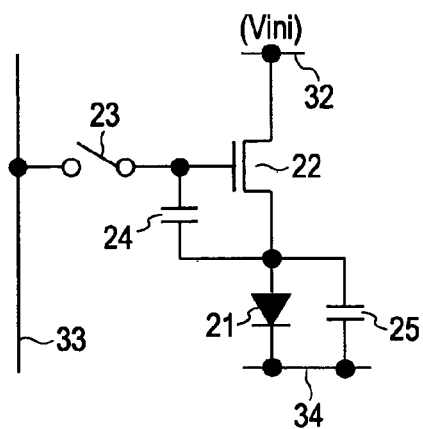

At time t11, a new frame (current frame) of line-sequential scanning starts. As shown in FIG. 5B, the potential DS of the power supply line 32 is switched from the high potential Vccp to the second power supply potential (hereinafter, referred to as a "low potential") Vini, which is sufficiently lower, relative to the reference potential Vofs of the signal line 33, than a value represented by Vofs−Vth.

Here, the threshold voltage of the organic EL element 21 is represented by "Vthel", and the potential (cathode potential) of the common power supply line 34 is represented by "Vcath". When the low potential Vini is set to satisfy the condition Vini<Vthel+Vcath, the source potential Vs of the driving transistor 22 is substantially equal to the low potential Vini. Thus, the organic EL element 21 enters an inverse bias state and stops emitting light.

Figure 5C:
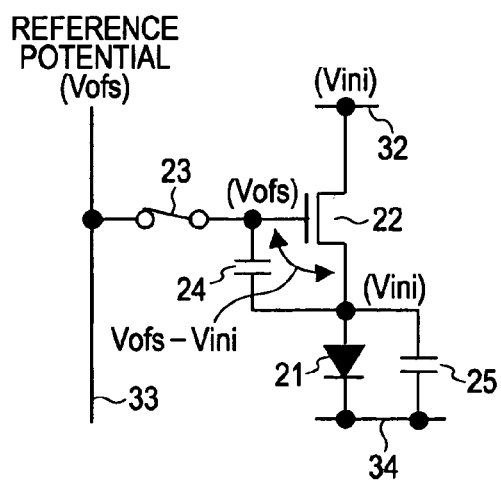

At time t12, the potential WS of the scanning line 31 is shifted from a lower potential to a higher potential. Thus, as shown in FIG. 5C, the writing transistor 23 enters a conductive state. Since the reference potential Vofs is supplied from the signal output circuit 60 to the signal line 33, the gate potential Vg of the driving transistor 22 reaches the reference potential Vofs. In addition, the source potential Vs of the driving transistor 22 is the low potential Vini, which is sufficiently lower than the reference potential Vofs.

Here, the gate-source voltage Vgs of the driving transistor 22 is represented by Vofs−Vini. Since the threshold correction process described later can be performed only when the value represented by Vofs−Vini is greater than the threshold voltage Vth of the driving transistor 22, it is necessary to satisfy the potential relationship Vofs−Vini>Vth.

As described above, a process for initializing the gate potential Vg and the source potential Vs of the driving transistor 22 to be fixed to the reference potential Vofs and the low potential Vini, respectively, is a process for preparing for the threshold correction process (threshold correction preparation) described later. Thus, the reference potential Vofs and the low potential Vini serve as initial values of the gate potential Vg and the source potential Vs of the driving transistor 22, respectively.

Threshold Correction Period

Figure 5D:
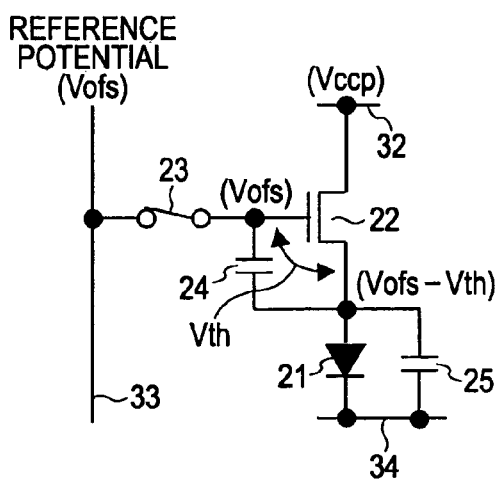

At time t13, as shown in FIG. 5D, the potential DS of the power supply line 32 is switched from the low potential Vini to the high potential Vccp. Thus, the threshold correction process starts while the gate potential Vg of the driving transistor 22 is maintained. That is, the source potential Vs of the driving transistor 22 starts increasing to a potential obtained by subtracting the threshold voltage Vth of the driving transistor 22 from the gate potential Vg of the driving transistor 22.

Here, for convenience, a process for changing the source potential Vs of the driving transistor 22 to the potential obtained by subtracting the threshold voltage Vth of the driving transistor 22 from the initial potential Vofs of the gate electrode of the driving transistor 22 is called a threshold correction process. When the threshold correction process advances, the gate-source voltage Vgs of the driving transistor 22 converges to the threshold voltage Vth of the driving transistor 22. A voltage corresponding to the threshold voltage Vth is stored in the storage capacitor 24.

In the period during which the threshold correction process is performed (that is, the threshold correction period), in order to cause a current to flow to the storage capacitor 24 but not to the organic EL element 21, the potential Vcath of the common power supply line 34 is set in such a manner that the organic EL element 21 is in a cutoff state.

Figure 6A:
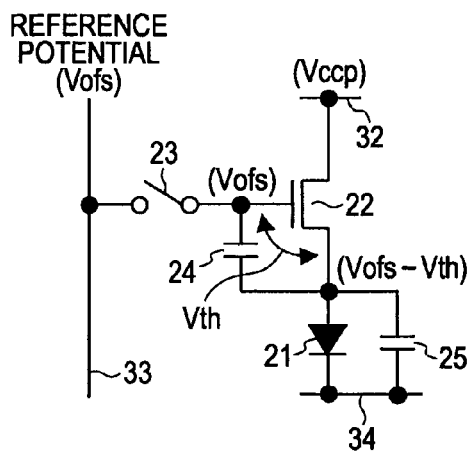
FIGS. 6A to 6D are another explanatory diagrams showing the basic circuit operation of the organic EL display device according to the first embodiment.
Figure 6B:
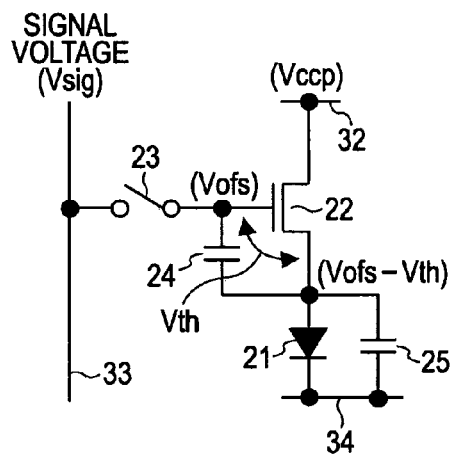
Figure 6C:
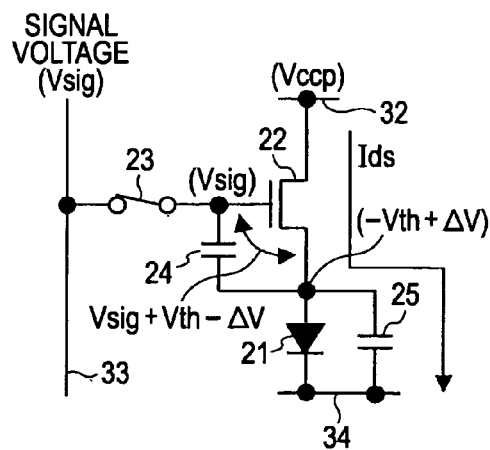

At time t14, the potential WS of the scanning line 31 is shifted to a lower potential. Thus, as shown in FIG. 6A, the writing transistor 23 enters the non-conductive state. Here, the gate electrode of the driving transistor 22 is electrically disconnected from the signal line 33 and enters a floating state. However, since the gate-source voltage Vgs of the driving transistor 22 is equal to the threshold voltage Vth of the driving transistor 22, the driving transistor 22 is in a cutoff state. Thus, the drain-source current Ids does not flow in the driving transistor 22. Signal writing and mobility correction period At time t15, as shown in FIG. 6B, the potential of the signal line 33 is switched from the reference potential Vofs to the signal voltage Vsig of an image signal. At time t16, the potential WS of the scanning line 31 is shifted to a higher potential. Thus, as shown in FIG. 6C, the writing transistor 23 enters the conductive state, samples the signal voltage Vsig of the image signal, and writes the sampled signal voltage Vsig to the pixel 20.

By writing of the signal voltage Vsig by the writing transistor 23, the gate potential Vg of the driving transistor 22 reaches the signal voltage Vsig. In the case of driving of the driving transistor 22 at the signal voltage Vsig of the image signal, the threshold voltage Vth of the driving transistor 22 is canceled by a voltage corresponding to the threshold voltage Vth stored in the storage capacitor 24. The principle of threshold cancellation will be described later in detail.

Here, the organic EL element 21 is in the cutoff state (high impedance state). Thus, the current (drain-source current Ids) flowing from the power supply line 32 to the driving transistor 22 in accordance with the signal voltage Vsig of the image signal flows to the equivalent capacitor 25 for the organic EL element 21. Thus, charging of the equivalent capacitor 25 starts.

Due to the charging of the equivalent capacitor 25 for the organic EL element 21, the source potential Vs of the driving transistor 22 increases with time. By this time, a pixel-to-pixel variation in the threshold voltage Vth of the driving transistor 22 has been eliminated. Thus, the drain-source current Ids of the driving transistor 22 depends on the mobility μ of the driving transistor 22.

Let the ratio of the storage voltage Vgs of the storage capacitor 24 to the signal voltage Vsig of an image signal, that is, a write gain G, be 1 (ideal value). When the source potential Vs of the driving transistor 22 increases to a potential represented by Vofs−Vth+ΔV, the gate-source voltage Vgs of the driving transistor 22 is represented by Vsig−Vofs+Vth−ΔV.

That is, an operation is performed in such a manner that an increase amount ΔV of the source potential Vs of the driving transistor 22 is subtracted from the voltage (Vsig−Vofs+Vth) stored in the storage capacitor 24, that is, the electric charge in the storage capacitor 24 is discharged. Accordingly, negative feedback is provided. Hence, the increase amount ΔV of the source potential Vs serves as a negative feedback amount.

As described above, by providing negative feedback to the gate-source voltage Vgs by the feedback amount ΔV corresponding to the drain-source current Ids flowing in the driving transistor 22, the dependency of the drain-source current Ids of the driving transistor 22 upon the mobility μ can be eliminated (canceled). This canceling process is a mobility correction process for correcting a pixel-to-pixel variation in the mobility μ of the driving transistor 22.

More specifically, as the signal amplitude Vin (=Vsig−Vofs) of an image signal written to the gate electrode of the driving transistor 22 increases, the drain-source current Ids increases. Thus, the absolute value of the negative feedback amount ΔV increases. Hence, a mobility correction process corresponding to the level of light emission luminance is performed.

In addition, in a case where the signal amplitude Vin of an image signal is constant, the absolute value of the negative feedback amount ΔV increases as the mobility μ of the driving transistor 22 increases. Thus, a pixel-to-pixel variation in the mobility μ can be eliminated. Hence, the negative feedback amount ΔV can also be represented as the correction amount of mobility correction. The principle of mobility correction will be described later in detail.

Light-Emission Period

Figure 6D:
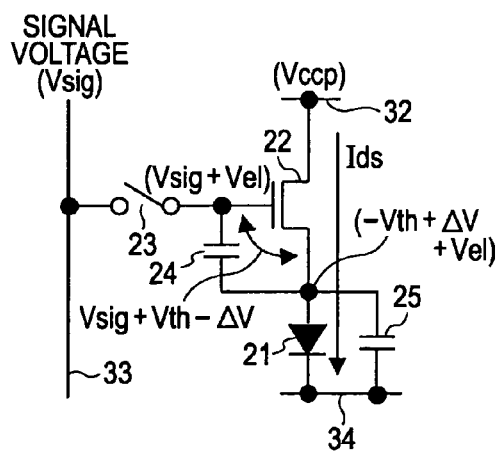

At time t17, the potential WS of the scanning line 31 is shifted to a lower potential. Thus, as shown in FIG. 6D, the writing transistor 23 enters the non-conductive state. Thus, the gate electrode of the driving transistor 22 is electrically disconnected from the signal line 33 and enters the floating state.

When the gate electrode of the driving transistor 22 is in the floating state, since the storage capacitor 24 is connected between the gate and source of the driving transistor 22, the gate potential Vg also varies in accordance with a variation in the source potential Vs of the driving transistor 22. The operation in which the gate potential Vg of the driving transistor 22 varies in accordance with a variation in the source potential Vs of the driving transistor 22 is called a bootstrap operation by the storage capacitor 24.

When the gate electrode of the driving transistor 22 enters the floating state and, at the same time, the drain-source current Ids of the driving transistor 22 starts flowing to the organic EL element 21, the anode potential of the organic EL element 21 increases in accordance with the drain-source current Ids.

When the anode potential of the organic EL element 21 exceeds the value represented by Vthel+Vcath, a driving current starts flowing to the organic EL element 21 and the organic EL element 21 thus starts emitting light. The increase in the anode potential of the organic EL element 21 corresponds to the increase in the source potential Vs of the driving transistor 22. When the source potential Vs of the driving transistor 22 increases, the gate potential Vg of the driving transistor 22 also increases in accordance with the increase in the source potential Vs of the driving transistor 22, due to the bootstrap operation by the storage capacitor 24.

Let a bootstrap gain be 1 (ideal value). Then, the increase amount of the gate potential Vg is equal to the increase amount of the source potential Vs. Hence, during the light-emission period, the gate-source voltage Vgs of the driving transistor 22 is maintained at a value represented by Vsig−Vofs+Vth−ΔV. At time t18, the potential of the signal line 33 is switched from the signal voltage Vsig of the image signal to the reference potential Vofs.

In the above-described series of circuit operations, the processes, that is, the threshold correction preparation process, the threshold correction process, the process for writing the signal voltage Vsig (signal writing process), and the mobility correction process, are performed within one horizontal-scanning period (1H). In addition, the signal writing process and the mobility correction process are performed in parallel during a period from time t16 to time t17.

Although a case where a driving method in which a single threshold-correction processing operation is performed is employed has been described, this driving method is merely an example. This driving method is not necessarily employed. For example, a driving method in which a so-called divided Vth correction process is performed may be employed. In the divided Vth correction process, a threshold correction process is not only performed during a 1H period during which a mobility correction process and a signal writing process are also performed, but also performed during a plurality of horizontal-scanning periods preceding the 1H period in such a manner that a plurality of threshold-correction processing operations are performed.

In the case of the driving method in which the divided Vth correction process is performed, even if a time period corresponding to one horizontal-scanning period is shortened as the number of pixels increases in accordance with an improvement of definition, a sufficient period of time over a plurality of horizontal-scanning periods can be ensured as a threshold correction period. Thus, a threshold correction process can be performed reliably.

Principle of Threshold Cancellation

The principle of threshold cancellation (that is, threshold correction) of the driving transistor 22 will now be described. Since the driving transistor 22 is designed so as to operate in a saturation region, the driving transistor 22 operates as a constant-current source. Thus, a constant drain-source current (driving current) Ids represented by equation (1) is supplied from the driving transistor 22 to the organic EL element 21:

$$Ids = (1/2) \cdot \mu (W/L) Cox (Vgs - Vth)^2 \qquad (1),$$

where W represents the channel width of the driving transistor 22, L represents a channel length, and Cox represents a gate capacitance per unit area.

Figure 7:
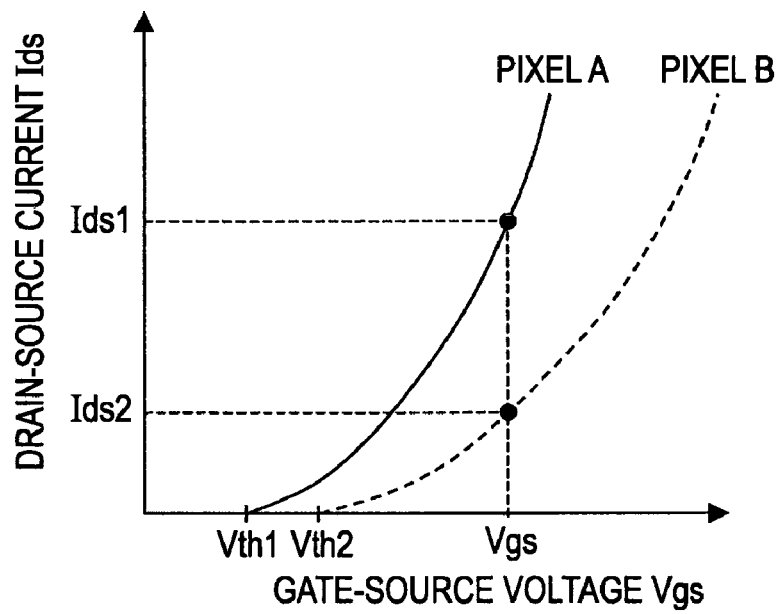
FIG. 7 is a characteristic diagram for explaining a problem caused by a variation in the threshold voltage of a driving transistor.

FIG. 7 shows the characteristics of the driving transistor 22 regarding the relationship between the drain-source current Ids and the gate-source voltage Vgs.

As shown in the characteristic diagram of FIG. 7, in a case where a process for eliminating (canceling) a pixel-to-pixel variation in the threshold voltage Vth of the driving transistor 22 is not performed, when the threshold voltage Vth is Vth1, the drain-source current Ids corresponding to the gate-source voltage Vgs is Ids1.

When the threshold voltage Vth is Vth2 (Vth2>Vth1), the drain-source current Ids corresponding to the same gate-source voltage Vgs is Ids2 (Ids2<Ids). That is, when the threshold voltage Vth of the driving transistor 22 varies, the drain-source current Ids varies even if the gate-source voltage Vgs is constant.

Meanwhile, in the pixel (pixel circuit) 20 having the configuration described above, during light emission, the gate-source voltage Vgs of the driving transistor 22 is represented by Vsig−Vofs+Vth−ΔV, as described above. Thus, by substituting Vsig−Vofs+Vth−ΔV into equation (1), the drain-source current Ids is represented by equation (2):

$$Ids = (1/2) \cdot \mu (W/L) Cox (Vsig - Vofs - \Delta V)^2 \qquad (2)$$

That is, the term of the threshold voltage Vth of the driving transistor 22 is eliminated (canceled), and the drain-source current Ids supplied from the driving transistor 22 to the organic EL element 21 does not depend on the threshold voltage Vth of the driving transistor 22. As a result, even if the threshold voltage Vth of the driving transistor 22 differs for each pixel due to a variation in the manufacturing process of the driving transistor 22 and a variation in the driving transistor 22 with time, since the drain-source current Ids is constant, the light emission luminance of the organic EL element 21 can be maintained constant.

Principle of Mobility Correction

Figure 8:
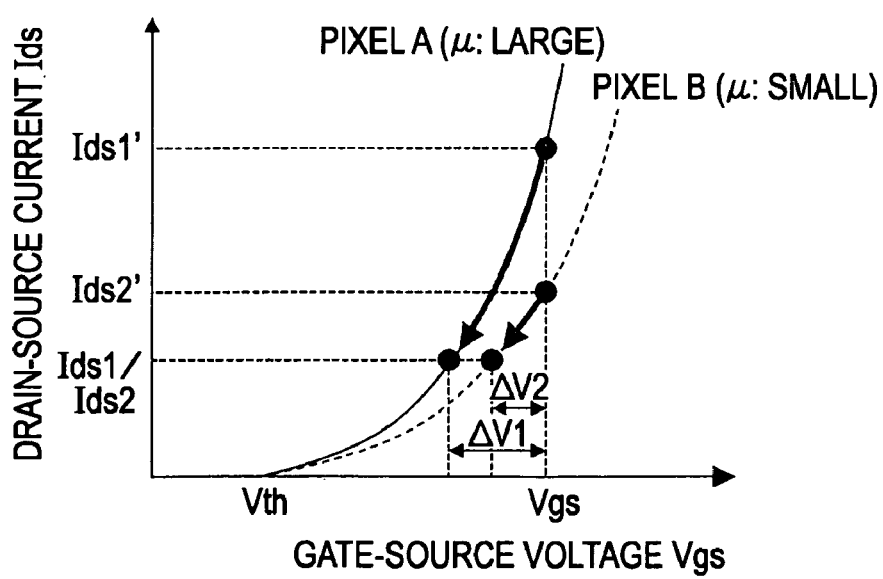
FIG. 8 is a characteristic diagram for explaining a problem caused by a variation in the mobility of the driving transistor.

The principle of mobility correction of the driving transistor 22 will now be described. FIG. 8 shows characteristic curves in a case where a pixel A in which the mobility μ of the driving transistor 22 is relatively large is compared with a pixel B in which the mobility μ of the driving transistor 22 is relatively small. In a case where the driving transistors 22 are made of polysilicon thin-film transistors or the like, mobilities μ vary between individual pixels, such as the pixels A and B.

For example, a case where a signal amplitude Vin (=Vsig−Vofs) at the same level is written to each of the gate electrodes of the driving transistors 22 in the pixels A and B whose mobilities μ differ from each other will be considered. In this case, if correction of the mobilities μ is not performed, a great difference occurs between the drain-source current Ids1' flowing in the pixel A having a large mobility μ and the drain-source current Ids2' flowing in the pixel B having a small mobility μ. If such a great difference in the drain-source current Ids occurs due to a pixel-to-pixel variation in the mobility μ, the uniformity of the screen is degraded.

As is clear from equation (1) regarding the transistor characteristics, as the mobility μ increases, the drain-source current Ids increases. Thus, as the mobility μ increases, the negative feedback amount ΔV increases. As shown in FIG. 8, a feedback amount ΔV1 of the pixel A having a large mobility μ is greater than a feedback amount ΔV2 of the pixel B having a small mobility μ.

Thus, in a mobility correction process, since negative feedback at a feedback amount ΔV corresponding to the drain-source current Ids of the driving transistor 22 is provided to the gate-source voltage Vgs, the feedback amount of negative feedback is increased as the mobility μ increases. As a result, a pixel-to-pixel variation in the mobility μ can be reduced.

Specifically, when correction with the feedback amount ΔV1 is performed on the pixel A having a large mobility μ, the drain-source current Ids is greatly reduced from Ids1' to Ids1. Meanwhile, since the feedback amount ΔV2 for the pixel B having a small mobility μ is small, the drain-source current Ids is reduced from Ids2' to Ids2. Thus, in this case, the drain-source current Ids is not greatly reduced. As a result, since the drain-source current Ids1 of the pixel A and the drain-source current Ids2 of the pixel B are substantially the same, a pixel-to-pixel variation in the mobility μ can be corrected.

As described above, in the case of the pixels A and B having different mobilities μ, the feedback amount ΔV1 for the pixel A having a large mobility μ is greater than the feedback amount ΔV2 for the pixel B having a small mobility μ. That is, a pixel having a greater mobility μ achieves a greater feedback amount ΔV, and the drain-source current Ids can be significantly reduced.

Thus, since negative feedback is provided to the gate-source voltage Vgs at a feedback amount ΔV corresponding to the drain-source current Ids of the driving transistor 22, the drain-source currents Ids in pixels having different mobilities μ have the same value. As a result, a pixel-to-pixel variation in the mobility μ can be corrected. That is, a process for providing negative feedback to the gate-source voltage Vgs of the driving transistor 22 at a feedback amount ΔV corresponding to the current (drain-source current Ids) flowing in the driving transistor 22 is a mobility correction process.

The relationship between the signal voltage Vsig of an image signal and the drain-source current Ids of the driving transistor 22 in the pixel (pixel circuit) 20 shown in FIG. 2, in a case where neither threshold correction nor mobility correction are performed, in a case where threshold correction is performed but mobility correction is not performed, and in a case where both threshold correction and mobility correction are performed, will now be described with reference to FIGS. 9A to 9C.

Figure 9A:
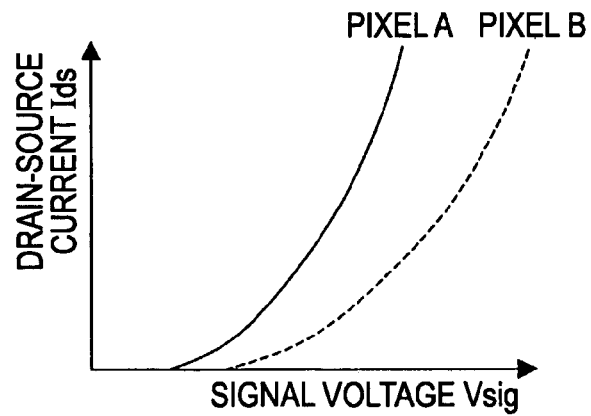
FIG. 9A is a characteristic diagram for explaining the relationship between the signal voltage of an image signal and the drain-source current of the driving transistor in a case where neither a threshold correction process nor a mobility correction process are performed.

FIG. 9A shows a case where neither threshold correction nor mobility correction are performed. FIG. 9B shows a case where threshold correction is performed but mobility correction is not performed. FIG. 9C shows a case where both threshold correction and mobility correction are performed. As shown in FIG. 9A, in a case where neither threshold correction nor mobility correction are performed, a great difference occurs between the drain-source currents Ids in pixels A and B due to variations between threshold voltages Vth and mobilities μ in the pixels A and B.

Figure 9B:
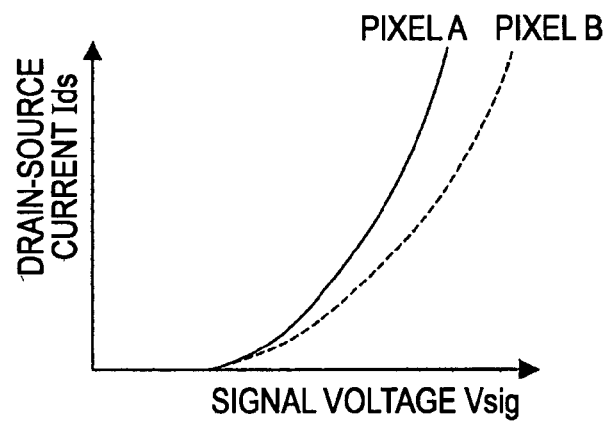
FIG. 9B is a characteristic diagram for explaining the relationship between the signal voltage of an image signal and the drain-source current of the driving transistor in a case where a threshold correction process is performed but a mobility correction process is not performed.
Figure 9C:
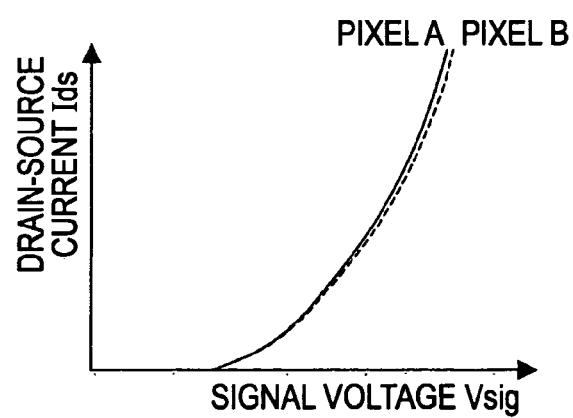
FIG. 9C is a characteristic diagram for explaining the relationship between the signal voltage of an image signal and the drain-source current of the driving transistor in a case where both a threshold correction process and a mobility correction process are performed.

Meanwhile, in a case where only threshold correction is performed, although a variation in the drain-source current Ids can be reduced to some extent, a difference between the drain-source currents Ids in the pixels A and B caused by a variation in the mobitlities μ of the pixels A and B remains, as shown in FIG. 9B. By performing both threshold correction and mobility correction, a difference between the drain-source currents Ids in the pixels A and B caused by the variations between threshold voltages Vth and mobilities μ in the pixels A and B can be substantially eliminated, as shown in FIG. 9C. Thus, no variation in the luminance of the organic EL element 21 occurs in the whole grayscale range. Hence, an excellent quality of a display image can be achieved.

In addition, since the pixel 20 shown in FIG. 2 has the above-described function of performing the bootstrap operation by using the storage capacitor 24, as well as the correction functions of performing threshold correction and mobility correction, the pixel 20 attains the effects described below.

That is, even if the source potential Vs of the driving transistor 22 varies in accordance with a variation in the I-V characteristics of the organic EL element 21 with time, the bootstrap operation by the storage capacitor 24 causes the gate-source potential Vgs of the driving transistor 22 to be maintained constant. Thus, the current flowing in the organic EL element 21 is maintained constant. As a result, since the light emission luminance of the organic EL element 21 is maintained constant, even if the I-V characteristics of the organic EL element 21 vary with time, an image display not involving a deterioration in the luminance caused by the variation in the I-V characteristics of the organic EL element 21 can be realized.

Variation in Driving Current Caused by Kink Phenomenon

Figure 10:
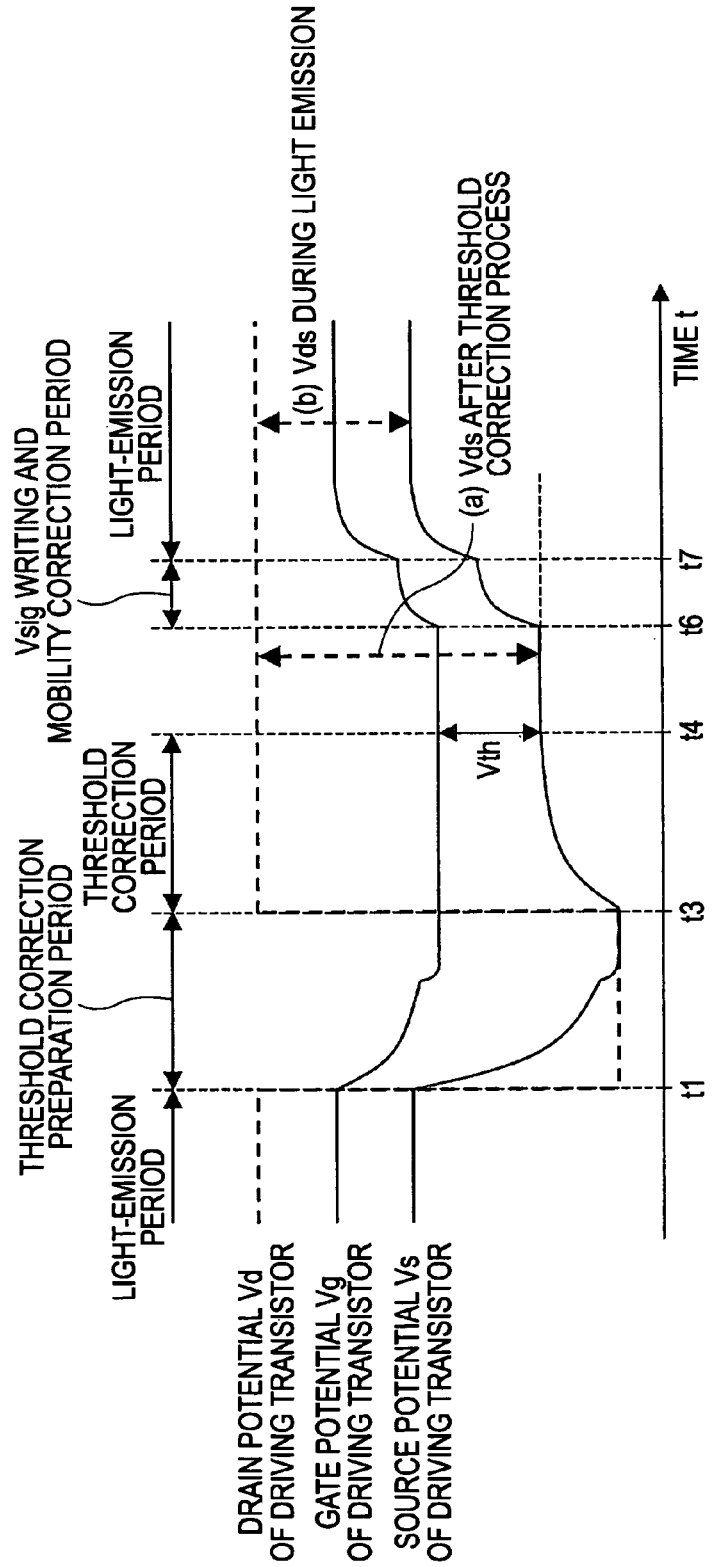
FIG. 10 is a waveform timing chart for explaining an operation in a case where the potential of a power supply line during a threshold correction period and the potential of the power supply line during a light-emission period are the same.

The drain-source voltage Vds of the driving transistor 22 designed so as to operate in a saturation region when a driving current flows to the organic EL element 21 will be considered with reference to a waveform timing chart shown in FIG. 10.

FIG. 10 shows the waveforms of the drain potential Vd, the gate potential Vg, and the source potential Vs of the driving transistor 22 shown in FIG. 2. The drain potential Vd of the driving transistor 22 is the power supply potential of the power supply line 32.

As is clear from the description of the operation, after performance of the threshold correction process, when the signal voltage Vsig of an image signal is written, the gate potential Vg of the driving transistor 22 increases and the source potential Vs thus increases. Then, by performance of the mobility correction process, the source potential Vs increases. Since negative feedback is provided during a light-emission period, the source potential Vs further increases. Thus, as is clear from the waveform timing chart of FIG. 10, the drain-source voltage Vds(a) after performance of the threshold correction process is large, whereas the drain-source voltage Vds(b) during light emission of the organic EL element 21 is small.

Figure 11:
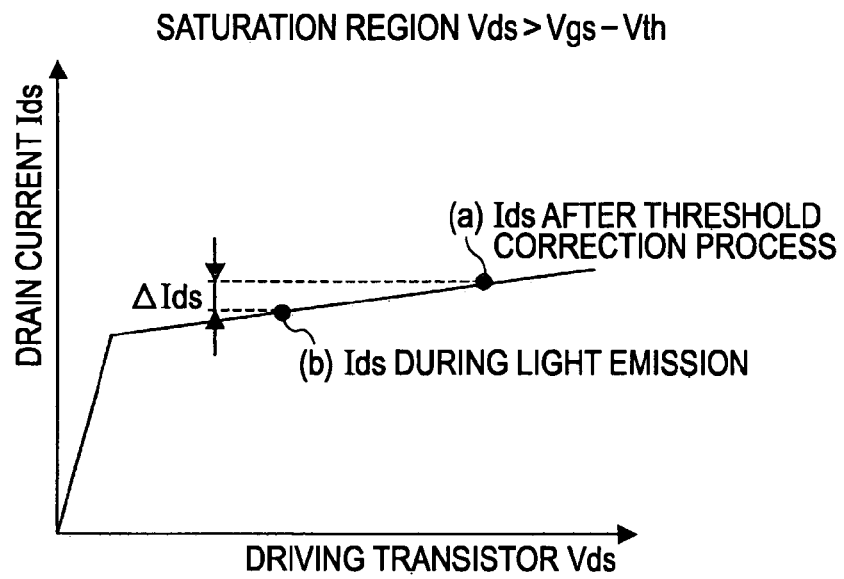
FIG. 11 is a characteristic diagram showing the Vds-Ids characteristics of the driving transistor having ideal transistor characteristics in a case where the potential of the power supply line during the threshold correction period and the potential of the power supply line during the light-emission period are the same.

Here, it is assumed that the driving transistor 22 has ideal transistor characteristics, as shown in FIG. 11. In this case, in a saturation region, the drain current Ids varies at a constant gradient with respect to the drain-source voltage Vds. Thus, even if the drain-source voltage Vds varies, a difference between variation amounts ΔIds of the drain currents Ids in individual pixels is small. Thus, even if the drain-source voltage Vds varies, a pixel-to-pixel variation in the driving current for the organic EL element 21 is less likely to occur.

Thus, in the saturation region of the driving transistor 22, the potential relationship Vds>Vgs−Vth is satisfied. Here, when λ represents a channel-length modulation factor of the driving transistor 22, the drain-source current Ids of the driving transistor 22 is represented by equation (3):

$$Ids=(1/2)\cdot \mu (W/L)Cox(Vgs-Vth)^2\cdot (1+\lambda Vds) \quad (3)$$

Figure 12:
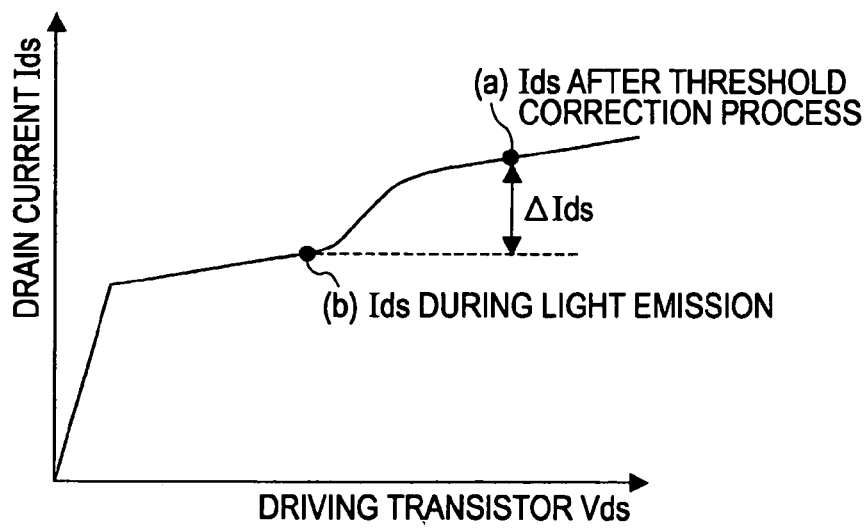
FIG. 12 is a characteristic diagram showing the Vds-Ids characteristics of the driving transistor having transistor characteristics in which a kink phenomenon occurs in a case where the potential of the power supply line during the threshold correction period and the potential of the power supply line during the light-emission period are the same.

Next, a case where the driving transistor 22 has transistor characteristics shown in FIG. 12, that is, transistor characteristics in which a kink phenomenon occurs, will be considered.

The degree of occurrence of a kink phenomenon is different for each transistor depending on the manufacturing variation or the like. Here, the degree of occurrence of a kink phenomenon represents the amount of variation in the drain current Ids, a rising time of the kink phenomenon, and the like. As stated above, if the degree of occurrence of a kink phenomenon, such as the amount of variation in the kink phenomenon, the rising time of the kink phenomenon, and the like, varies from transistor to transistor, in a case where a variation in the drain-source voltage Vds occurs inside and outside a region where the kink phenomenon occurs, the variation in the drain-source voltage Vds is affected by the variation in the degree of occurrence of the kink phenomenon.

For example, when the degree (amount of variation) of a kink phenomenon varies from transistor to transistor, as is clear from FIG. 12, a difference between variation amounts ΔIds of the drain currents Ids in individual pixels is greater than that in a case where the gradient of the Vds-Ids characteristics is constant. Thus, as described above, when the drain-source voltage Vds(a) after performance of the threshold correction process is different from the drain-source voltage Vds(b) during light emission, the drain-source current Ids of the driving transistor 22 varies between individual pixels, and thus the driving current for the organic EL element 21 varies between individual pixels. Thus, a pixel-to-pixel difference in the luminance occurs, and image quality is degraded.

In order to reduce a variation between driving currents of the organic EL elements 21 caused by such a kink phenomenon and achieve an improvement in image quality, the organic EL display device 10A according to the first embodiment is provided. In the basic circuit operation described above, the power supply/scan circuit 50 selectively sets two potential values, the first power supply potential (high potential) Vccp and the second power supply potential (low potential) Vini, as the potential DS of the power supply line 32.

Meanwhile, in the organic EL display device 10A according to the first embodiment, the power supply/scan circuit 50 is capable of selectively setting, in an appropriate manner, at least three potential values, as the power supply potential DS of the power supply line 32. Specific examples of the first embodiment will be described below.

Example 1

In the organic EL display device 10 having the system configuration shown in FIGS. 1 and 2, the power supply/scan circuit 50 according to Example 1 is configured to be capable of selectively setting three potential values as the potential DS of the power supply line 32. Specifically, the power supply/scan circuit 50 according to Example 1 is configured to be capable of selectively setting, in an appropriate manner, three potential values, the high potential Vccp (hereinafter, denoted by Vccp1), the low potential Vini, and an intermediate potential Vccp2 between the high potential Vccp (Vccp1) and the low potential Vini, as the power supply potential DS.

Figure 13:
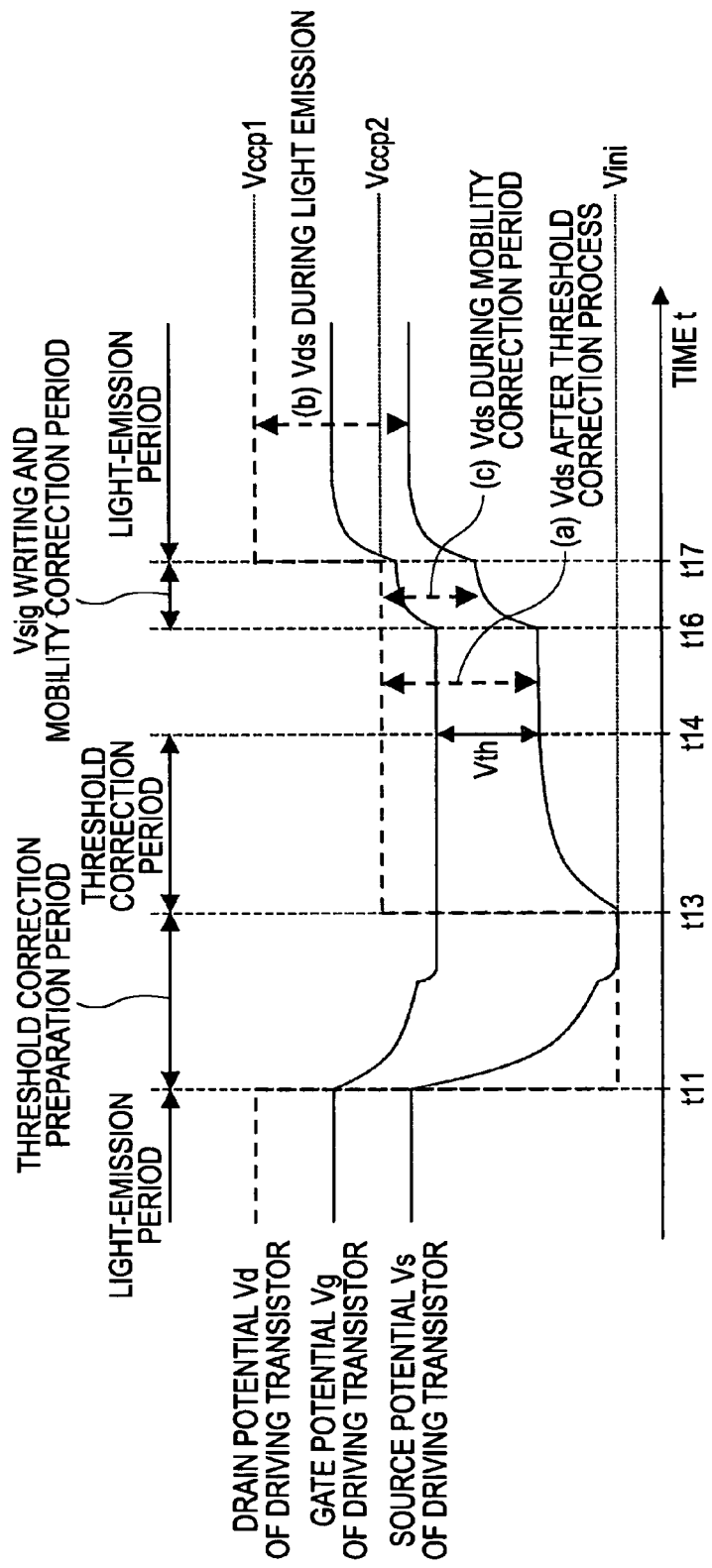
FIG. 13 is a waveform timing chart showing a timing relationship regarding setting of a power supply potential in Example 1.

FIG. 13 illustrates a timing relationship regarding setting of the power supply potential DS according to Example 1. The power supply/scan circuit 50 sets the low potential Vini during a threshold correction preparation period (times t11 to t13), sets the intermediate potential Vccp2 at least during a threshold correction period (times t13 to t14), and sets the high potential Vccp1 during a light-emission period (time t17 and the subsequent times)

That is, in the case of the basic circuit operation described above, the potential DS of the power supply line 32 is set to the high potential Vccp1 (Vccp) during the threshold correction period and during the light-emission period. Meanwhile, in Example 1, the potential DS of the power supply line 32 during the threshold correction period is different from the potential DS of the power supply line 32 during the light-emission period. Specifically, the potential DS is set to the intermediate potential Vccp2 (<Vccp1) during the threshold correction period, and the potential DS is set to the high potential Vccp1 during the light-emission period.

As described above, in a case where the potential DS of the power supply line 32 during the threshold correction period is the same as the potential DS of the power supply line 32 during the light-emission period, the drain source voltage Vds of the driving transistor 22 after performance of the threshold correction process is different from the drain-source voltage Vds of the driving transistor 22 during light emission of the organic EL element 21.

Thus, in Example 1, the potential DS of the power supply line 32 during the threshold correction period is different from the potential DS of the power supply line 32 during the light-emission period. Hence, a difference between the drain-source voltage Vds(a) after performance of the threshold correction process and the drain-source voltage Vds(b) during light emission of the organic EL element 21 can be reduced compared with a case where the potential DS of the power supply line 32 during the threshold correction period and the potential DS of the power supply line 32 during the light-emission period are the same. As a result, even if a kink phenomenon occurs in the driving transistor 22 and the degree of occurrence of a kink phenomenon varies depending on the manufacturing variation of the driving transistor 22, a pixel-to-pixel variation in the drain-source current Ids of the driving transistor 22 can be reduced.

Here, it is desirable that the intermediate potential Vccp2 that is set for the threshold correction period be set, as described below, relative to the high potential Vccp1 that is set for the light-emission period. That is, it is desirable that the intermediate potential Vccp2 be set to a potential at which the drain-source voltage Vds(a) of the driving transistor 22 after performance of the threshold correction process and the drain-source voltage Vds(b) of the driving transistor 22 during light emission of the organic EL element 21 are made the same.

Figure 14:
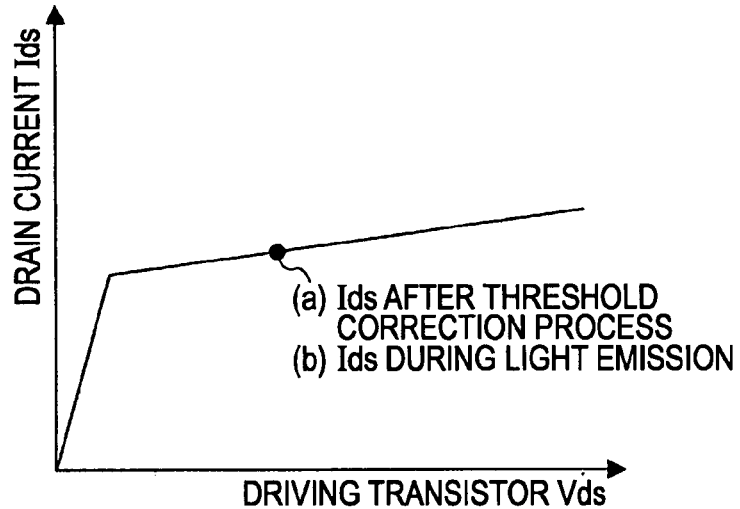
FIG. 14 is a characteristic diagram showing the Vds-Ids characteristics of the driving transistor having ideal transistor characteristics in the case of Example 1.
Figure 15:
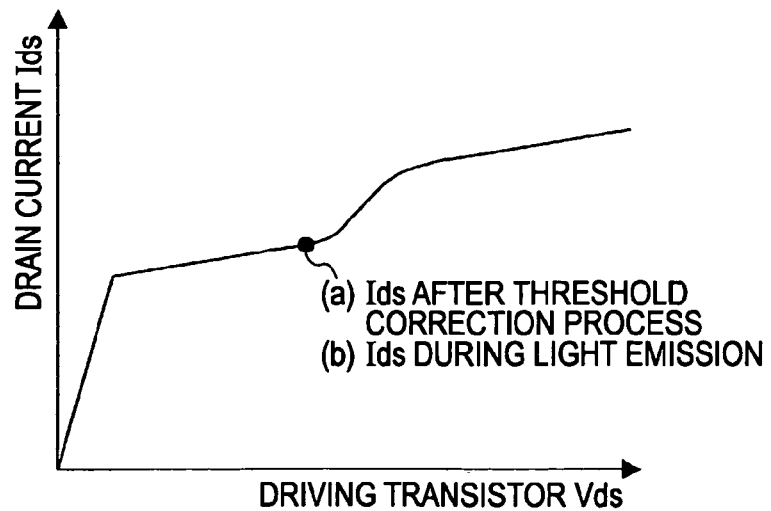
FIG. 15 is a characteristic diagram showing the Vds-Ids characteristics of the driving transistor having transistor characteristics in which a kink phenomenon occurs in the case of Example 1.

FIG. 14 illustrates the Vds-Ids characteristics of the driving transistor 22 having ideal transistor characteristics. FIG. 15 illustrates the Vds-Ids characteristics of the driving transistor 22 having transistor characteristics in which a kink phenomenon occurs.

By setting the intermediate potential Vccp2 relative to the high potential Vccp1 while satisfying the potential relationship described above, a pixel-to-pixel variation in the drain-source current Ids of the driving transistor 22 caused by a kink phenomenon can be further reduced (ideally, a variation can be eliminated). As a result, the quality of a display image can be improved.

Power Supply/Scan Circuit

A specific configuration of a power supply/scan circuit 50A that is capable of selectively setting three potential values, Vccp1, Vccp2, and Vini, as the power supply potential DS of the power supply line 32 will now be described.

Figure 16:
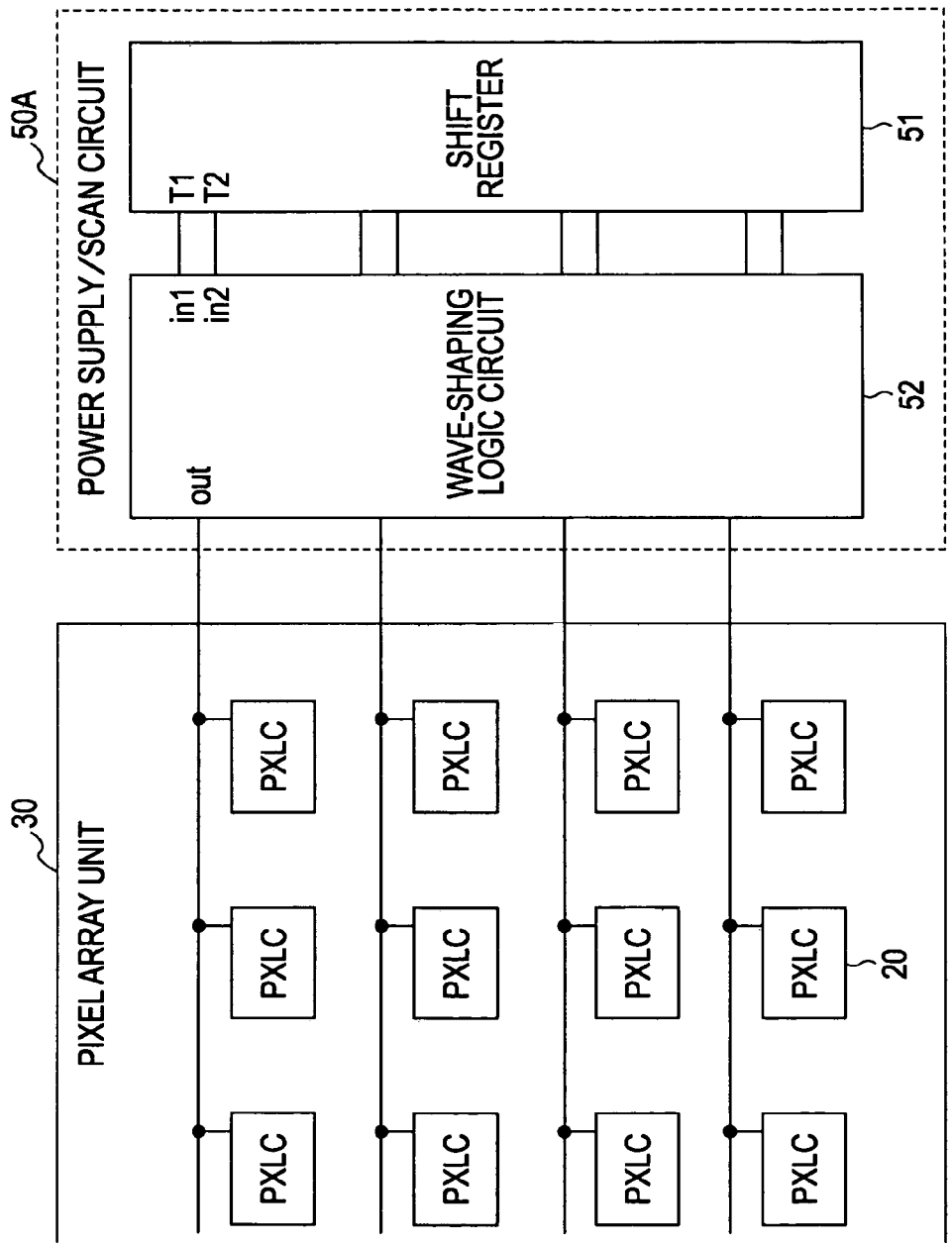
FIG. 16 is a block diagram showing an example of the configuration of a power supply/scan circuit according to Example 1 that is capable of selectively setting three potential values, Vccp1, Vccp2, and Vini.

FIG. 16 is a block diagram showing an example of the configuration of the power supply/scan circuit 50A that is capable of selectively setting three potential values, Vccp1, Vccp2, and Vini.

The power supply/scan circuit 50A includes a shift register 51 and a wave-shaping logic circuit 52. The shift register 51 outputs, for each pixel row, timing signals T1 and T2 in synchronization with vertical scanning by the write-scan circuit 40 (see FIG. 1). The wave-shaping logic circuit 52 selectively outputs, in an appropriate manner, three potential values, Vccp1, Vccp2, and Vini, in accordance with the two timing signals, T1 and T2.

Figure 17:
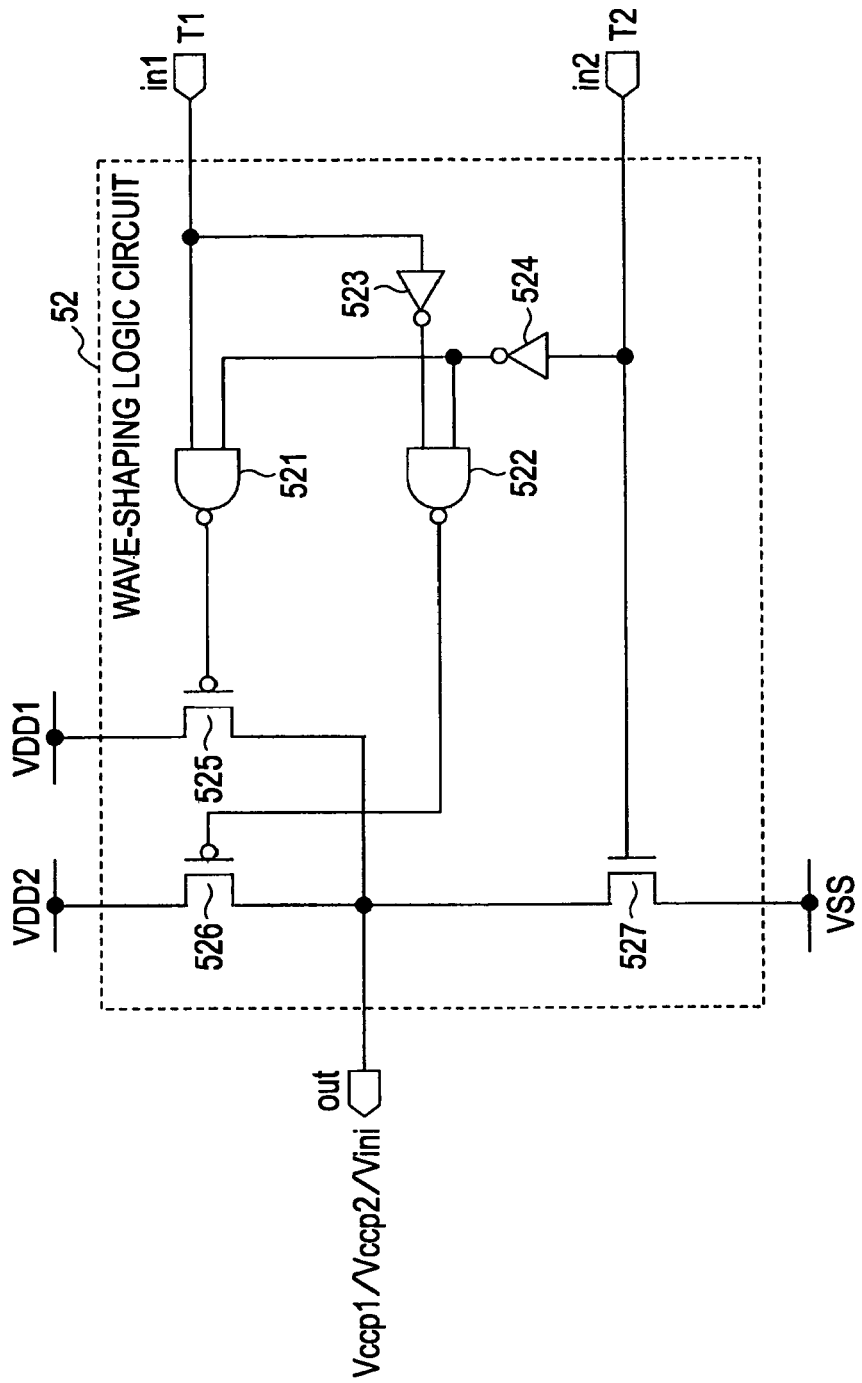
FIG. 17 is a circuit diagram showing an example of the configuration of a wave-shaping logic circuit included in the power supply/scan circuit according to Example 1.

FIG. 17 is a circuit diagram showing an example of the configuration of the wave-shaping logic circuit 52. The wave-shaping logic circuit 52 according to this example includes two NAND circuits 521 and 522, two inverters 523 and 524, two PchMOS transistors 525 and 526, and an NchMOS transistor 527.

The NAND circuit 521 receives at one input terminal the timing signal T1 which is received via an input terminal in1, and receives at the other input terminal the timing signal T2 which is received via an input terminal in2 and logically inverted by the inverter 524. The NAND circuit 522 receives at one input terminal the timing signal T1 which is received via the input terminal in1 and logically inverted by the inverter 523, and receives at the other input terminal the timing signal T2 which is received via the input terminal in2 and logically inverted by the inverter 524.

The PchMOS transistor 525 receives at the gate an output of the NAND circuit 521. When the output of the NAND circuit 521 is at low level, the PchMOS transistor 525 enters a conductive state and outputs, via an output terminal out, the power supply potential VDD1 as the high potential Vccp1. The PchMOS transistor 526 receives at the gate an output of the NAND circuit 522. When the output of the NAND circuit 522 is at low level, the PchMOS transistor 526 enters a conductive state and outputs, via the output terminal out, the power supply potential VDD2 as the intermediate potential Vccp2. The NchMOS transistor 527 receives at the gate the timing signal T2. When the timing signal T2 is at high level, the NchMOS transistor 527 enters a conductive state and outputs, via the output terminal out, the power supply potential VSS as the low potential Vini.

Figure 18:
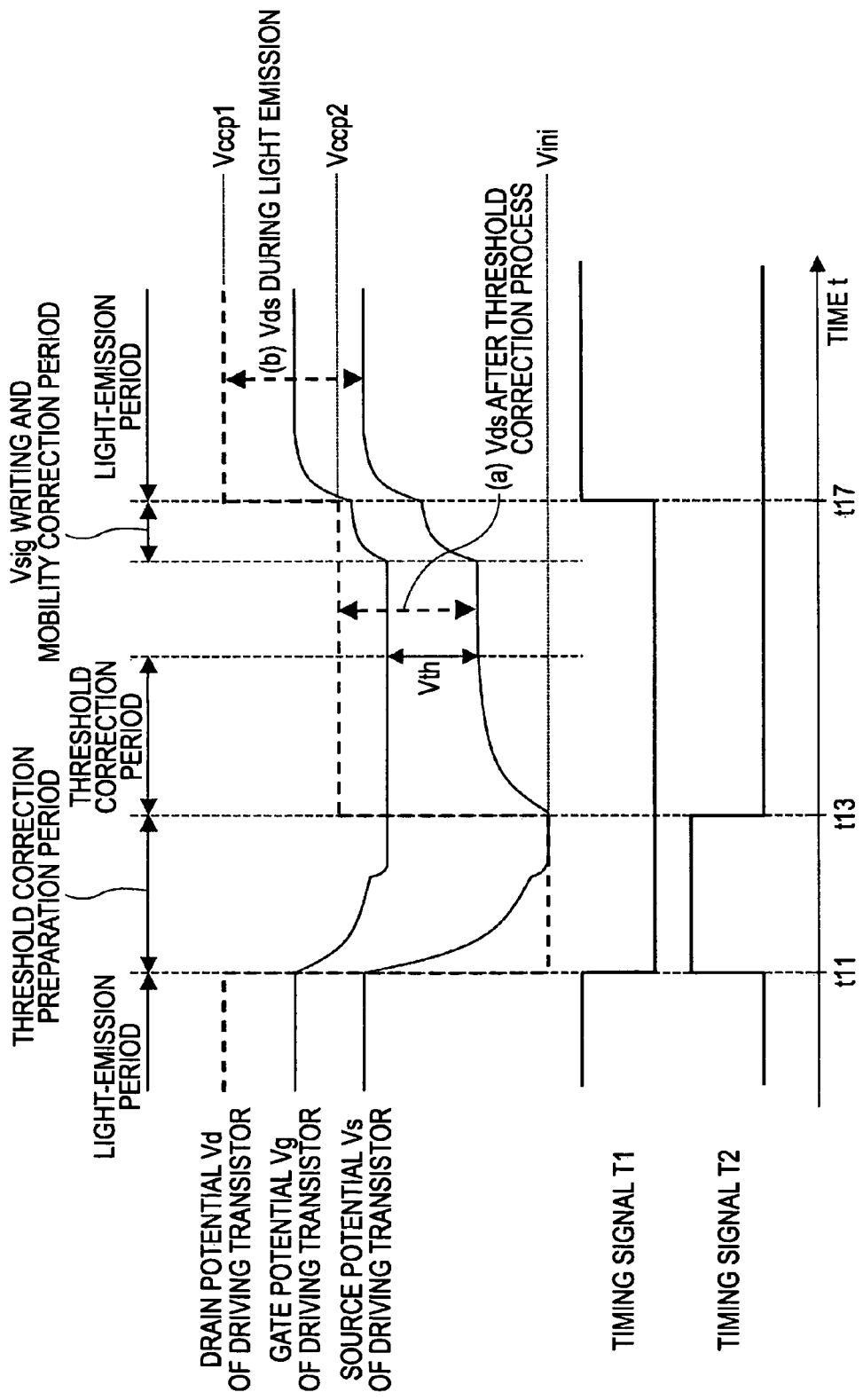
FIG. 18 is a waveform timing chart for explaining a circuit operation of the power supply/scan circuit according to Example 1.

FIG. 18 is a waveform timing chart showing the timing relationship between the timing signals T1 and T2. As shown in the waveform timing chart of FIG. 18, since the timing signal T1 is at low level and the timing signal T2 is at high level during the threshold correction preparation period, the power supply/scan circuit 50A outputs the low potential Vini. Since the timing signals T1 and T2 are at low level during the threshold correction period and a period before entering the light-emission period, the power supply/scan circuit 50A outputs the intermediate potential Vccp2. Since the timing signal T1 is at high level and the timing signal T2 is at low level during the light-emission period, the power supply/scan circuit 50A outputs the high potential Vccp1.

Setting of Vccp1 and Vccp2

As described above, in Example 1, the intermediate potential Vccp2 is set, relative to the high potential Vccp1, preferably, to a potential at which the drain-source voltage Vds(a) of the driving transistor 22 after performance of the threshold correction process and the drain-source voltage Vds(b) of the driving transistor 22 during light emission of the organic EL element 21 are made the same. Here, the potential DS of the power supply line 32 during the signal writing and mobility correction period is set to the intermediate potential Vccp2, which is the same potential as the potential set for the threshold correction period.

Figure 19:
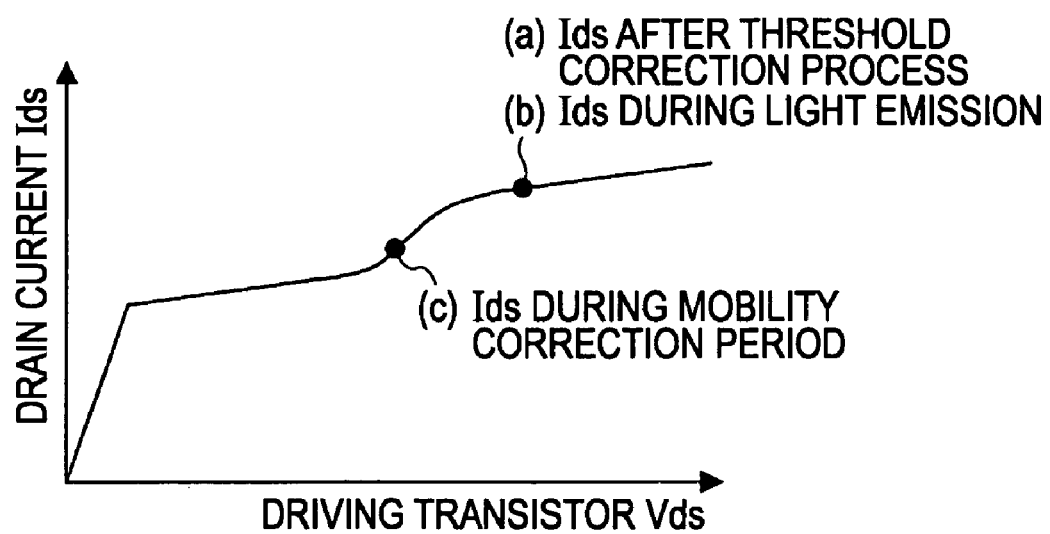
FIG. 19 is an explanatory diagram regarding setting of potential values Vccp1 and Vccp2.

However, in a case where the intermediate potential Vccp2 is set as the potential DS for the mobility correction period, the drain-source voltage Vds(c) of the driving transistor 22 during the mobility correction period is smaller than each of the drain-source voltage Vds(a) after performance of the threshold correction process and the drain-source voltage Vds(b) during light emission (see FIG. 13). Thus, as shown in FIG. 19, the driving transistor 22 may be used in a region where a kink phenomenon occurs (hereinafter, referred to as a "kink phenomenon region"). In a case where the driving transistor 22 is used in a kink phenomenon region, a pixel-to-pixel variation in the drain-source current Ids of the driving transistor 22 is likely to occur compared with a case where the driving transistor 22 is used in a different region. Thus, a difference between the luminances of individual pixels occurs.

For these reasons, it is desirable that not only the intermediate potential Vccp2 but also the high potential Vccp1 be set to a potential at which the driving transistor 22 is not used in a kink phenomenon region during a mobility correction period. Specifically, in a case where, before shipping, the driving transistor 22 is used in a kink phenomenon region during a mobility correction period, each of the potentials Vccp1 and Vccp2 is set to be higher or lower than the set potential.

Figure 20A:
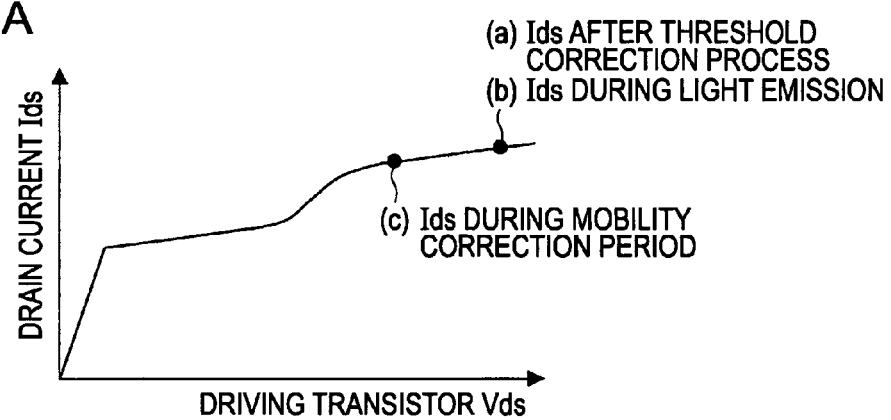
FIGS. 20A and 20B are another explanatory diagrams regarding setting of the potential values Vccp1 and Vccp2.
Figure 20B:
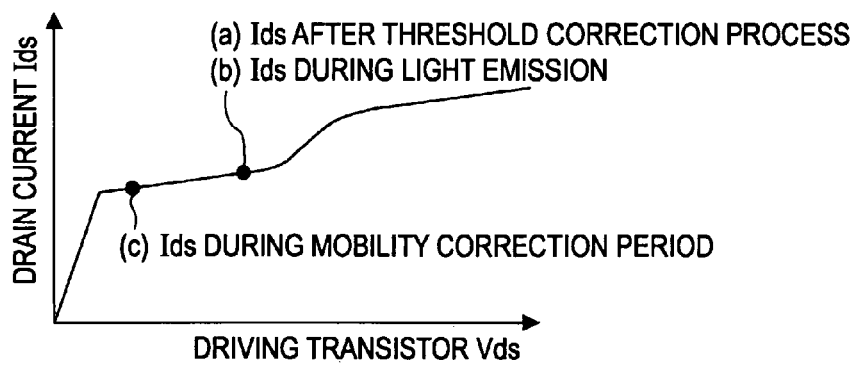

By setting each of the potentials Vccp1 and Vccp2 to be higher or lower, as shown in FIG. 20A or FIG. 20B, the driving transistor 22 is not used in a kink phenomenon region. As a result, even in the case of the transistor characteristics in which a kink phenomenon occurs, a pixel-to-pixel variation in the drain-source current Ids of the driving transistor 22 can be reduced. Thus, the quality of a display image can be improved.

Example 2

In the organic EL display device 10 having the system configuration shown in FIGS. 1 and 2, the power supply/scan circuit 50 according to Example 2 is capable of selectively setting four potential values as the potential DS of the power supply line 32. Specifically, the power supply/scan circuit 50 is capable of selectively setting, in an appropriate manner, four potential values, the high potential Vccp1, the low potential Vini, and intermediate potentials Vccp2 and Vccp3 which are between the high potential Vccp1 and the low potential Vini. Here, the intermediate potentials Vccp2 and Vccp3 satisfy the relationship Vccp<Vccp3.

In Example 1, the potential DS of the power supply line 32 during the mobility correction period (including the period for writing the signal voltage Vsig) is set to the intermediate potential Vccp2. That is, the potential DS of the power supply line 32 during the threshold correction period and the potential DS of the power supply line 32 during the mobility correction period are the same. Meanwhile, in Example 2, the potential DS of the power supply line 32 during the threshold correction period and the potential DS of the power supply line 32 during the mobility correction period are set to the different intermediate potentials Vccp2 and Vccp3, respectively.

Figure 21:
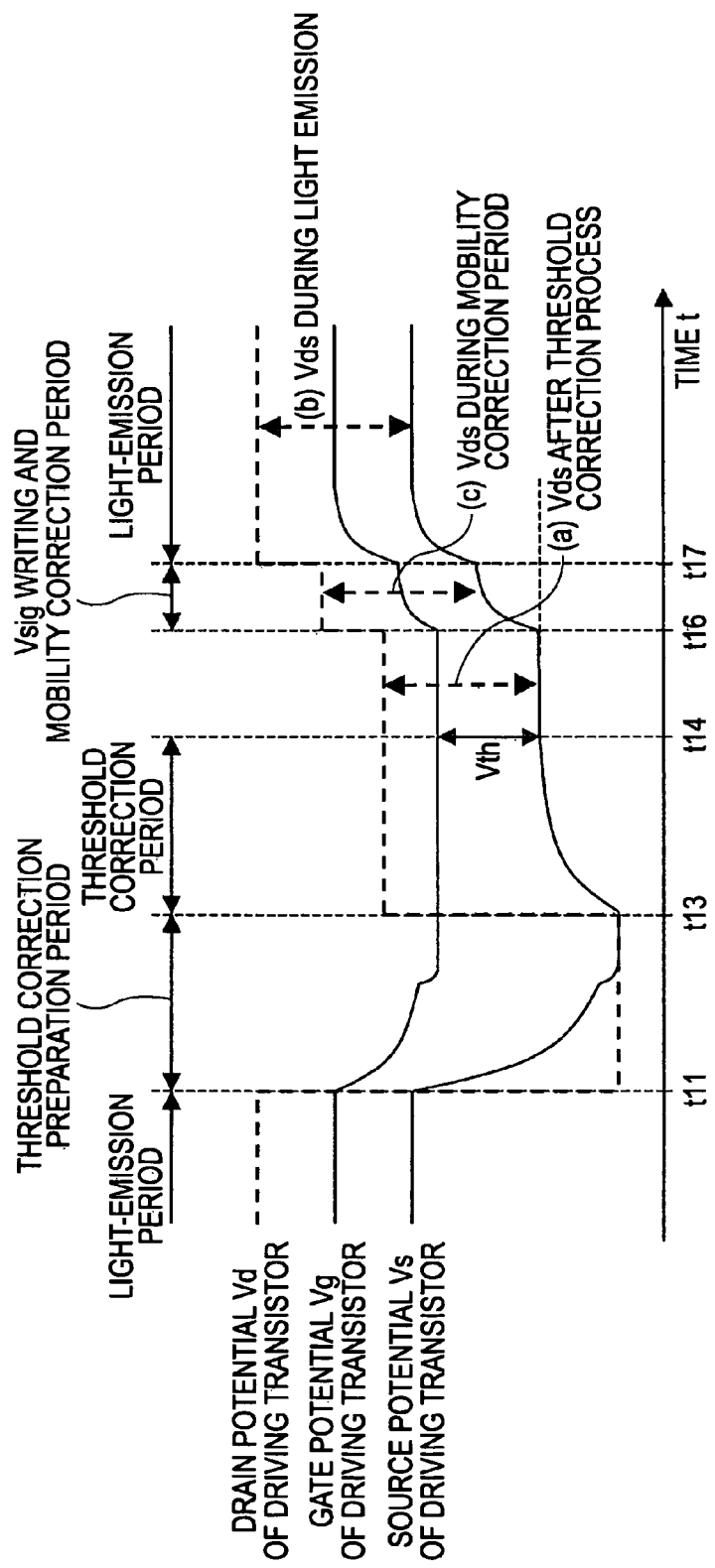
FIG. 21 is a waveform timing chart showing a timing relationship regarding setting of a power supply potential in Example 2.

FIG. 21 is a waveform timing chart showing a timing relationship regarding setting of the power supply potential DS according to Example 2. The power supply/scan circuit 50 sets the low potential Vini during a threshold correction preparation period (times t11 to t13) and sets the intermediate potential Vccp2 at least during a threshold correction period (times t13 to t14). Furthermore, the power supply/scan circuit 50 sets the intermediate potential Vccp3 during a signal writing and mobility correction period (times t16 to t17), and sets the high potential Vccp1 during a light-emission period (the time t17 and the subsequent times).

That is, in Example 1, the potential DS of the power supply line 32 during the threshold correction period and the potential DS of the power supply line 32 during the mobility correction period are set to the intermediate potential Vccp2. Meanwhile, in Example 2, the potential DS of the power supply line 32 during the threshold correction period is different from the potential DS of the power supply line 32 during the mobility correction period. Specifically, the potential DS of the power supply line 32 is set to the intermediate potential Vccp2 during the threshold correction period, and set to the intermediate potential Vccp3 during the mobility correction period.

Even if the potential DS of the power supply line 32 during the threshold correction period is different from the potential DS of the power supply line 32 during the light-emission period, in a case where, as described above, the potential DS of the power supply line 32 during the threshold correction period and the potential DS of the power supply line 32 during the mobility correction period are set to the intermediate potential Vccp2, the driving transistor 22 may be used in a kink phenomenon region. As a result, a pixel-to-pixel variation in the drain-source current Ids of the driving transistor 22 is likely to occur. Thus, a difference between the luminances of individual pixels occurs.

Meanwhile, by setting the potential DS of the power supply line 32 during the threshold correction period to be different from the potential DS of the power supply line 32 during the mobility correction period, even if the driving transistor 22 is used in a kink phenomenon region, a pixel-to-pixel variation in the drain-source current Ids of the driving transistor 22 can be reduced. Here, it is desirable that the intermediate potential Vccp3 be set, relative to the intermediate potential Vccp2, to a potential at which the drain-source voltage Vds(a) of the driving transistor 22 after performance of the threshold correction process and the drain-source voltage Vds(c) of the driving transistor 22 during performance of the mobility correction process are made the same.

Figure 22:
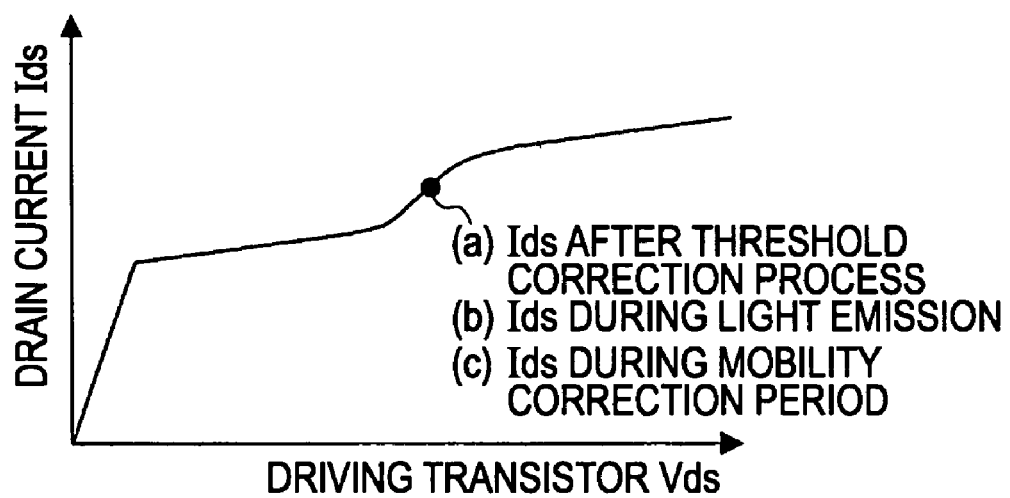
FIG. 22 is a characteristic diagram showing the Vds-Ids characteristics of the driving transistor having transistor characteristics in which a kink phenomenon occurs in the case of Example 2.

By setting the intermediate potential Vccp3, relative to the intermediate potential Vccp2, in accordance with the potential relationship described above, the drain-source voltage Vds can be maintained constant at a time after performance of the threshold correction process, at a time after performance of the mobility correction process, and during the light-emission period, as shown in FIG. 22. Thus, even if the driving transistor 22 is used in a kink phenomenon region, the drain-source voltage Vds is not different among the ending of the threshold correction process, the ending of the mobility correction, and during light emission. As a result, a pixel-to-pixel variation in the drain-source current Ids of the driving transistor 22 caused by a kink phenomenon can be further reduced (ideally, a variation can be eliminated). Hence, the quality of a display image can be improved.

Power Supply/Scan Circuit

A specific configuration of a power supply/scan circuit 50B that is capable of selectively setting four potential values, Vccp1, Vccp2, Vccp3, and Vini, as the power supply potential DS of the power supply line 32 will now be described.

Figure 23:
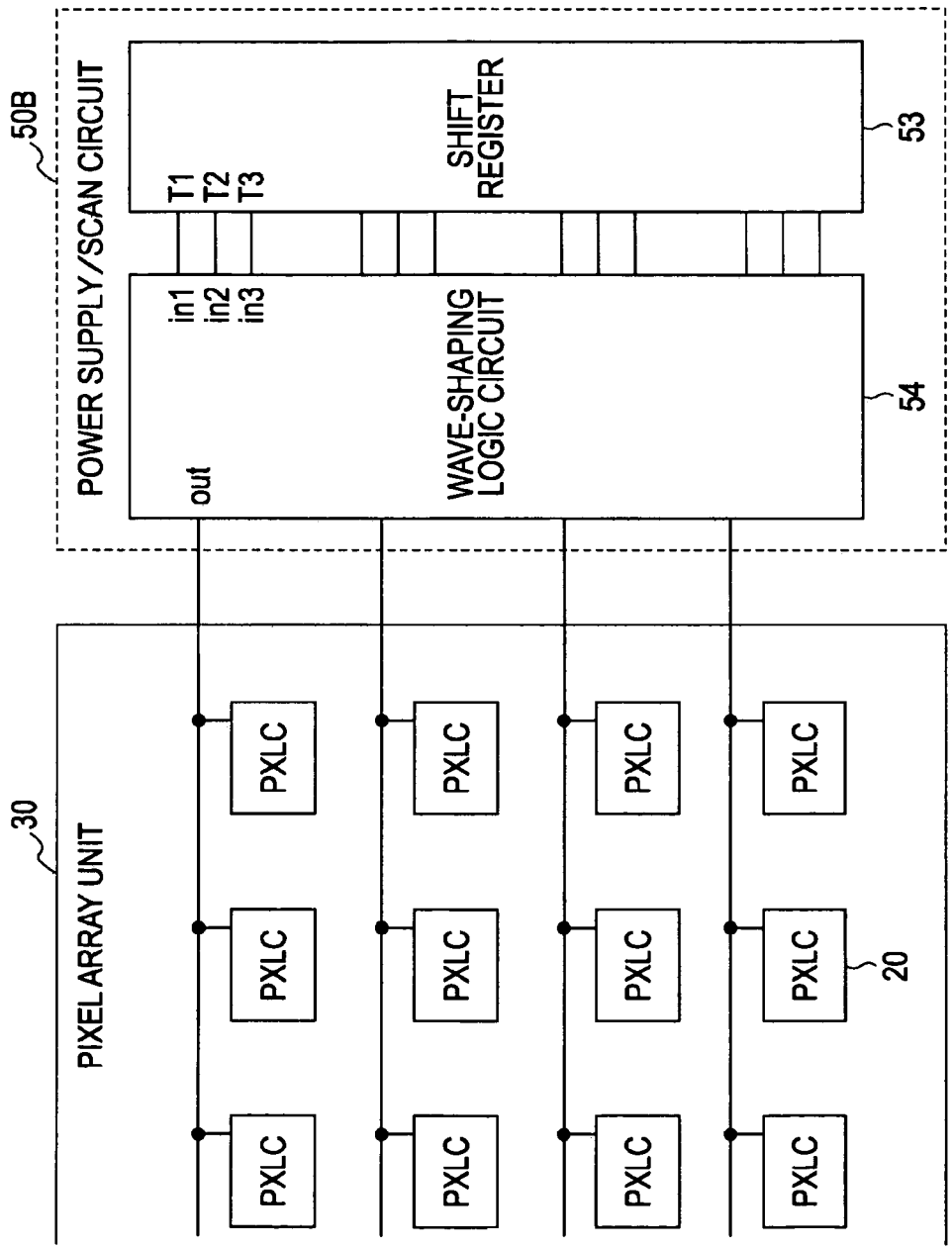
FIG. 23 is a block diagram showing an example of the configuration of a power supply/scan circuit according to Example 2 that is capable of selectively setting four potential values, Vccp1, Vccp2, Vccp3, and Vini.

FIG. 23 is a block diagram showing an example of the configuration of the power supply/scan circuit 50B that is capable of selectively setting four potential values, Vccp1, Vccp2, Vccp3, and Vini.

The power supply/scan circuit 50B includes a shift register 53 and a wave-shaping logic circuit 54. The shift register 53 outputs, for each pixel row, timing signals T1, T2, and T3 in synchronization with vertical scanning by the write-scan circuit 40 (see FIG. 1). The wave-shaping logic circuit 54 selectively outputs, in an appropriate manner, four potential values, Vccp1, Vccp2, Vccp3, and Vini, in accordance with the three timing signals, T1, T2, and T3.

Figure 24:
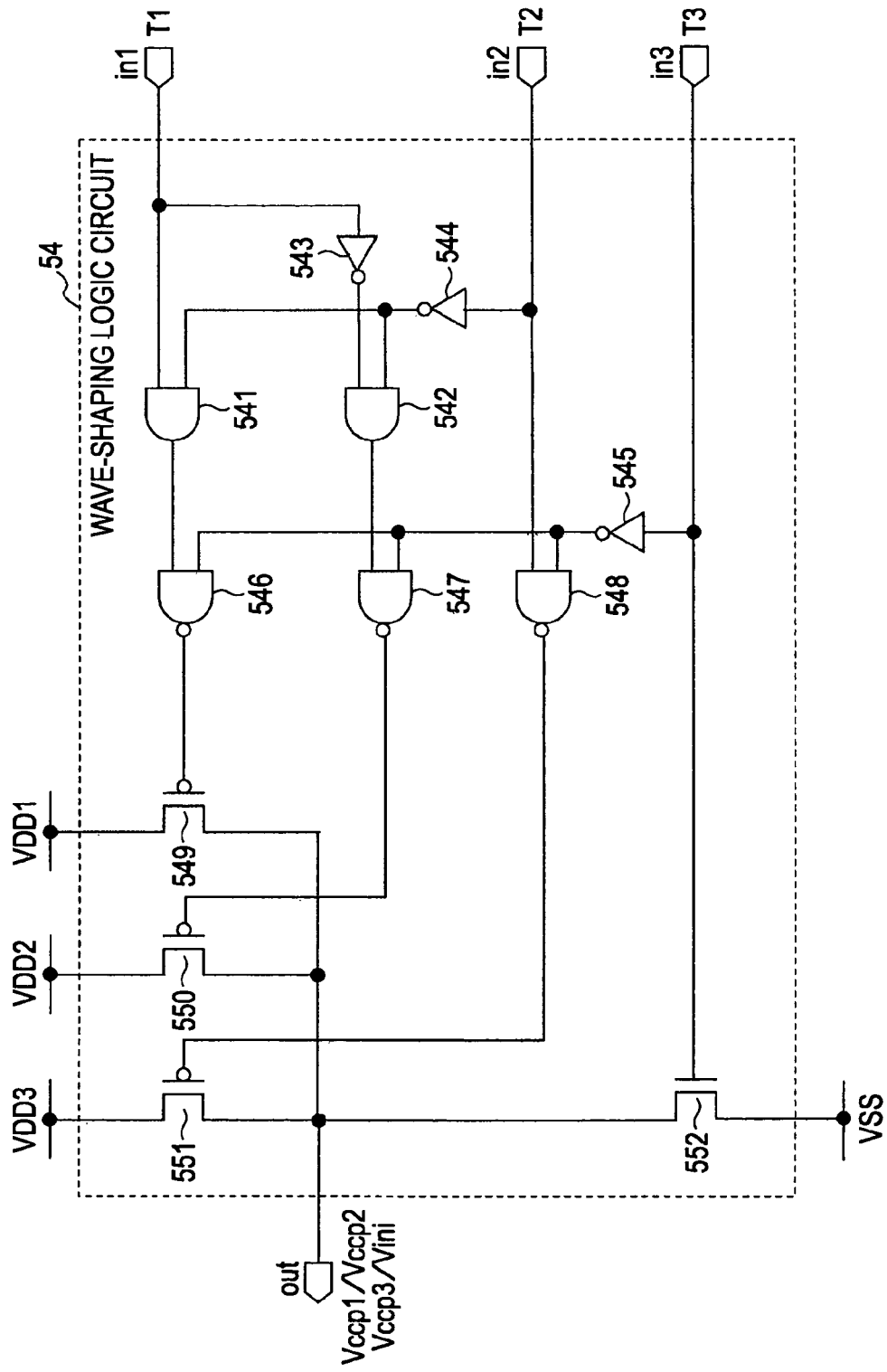
FIG. 24 is a circuit diagram showing an example of the configuration of a wave-shaping logic circuit included in the power supply/scan circuit according to Example 2.

FIG. 24 is a circuit diagram showing an example of the configuration of the wave-shaping logic circuit 54. The wave-shaping logic circuit 54 according to this example includes two AND circuits 541 and 542, three inverters 543 to 545, three NAND circuits 546 to 548, three PchMOS transistors 549 to 551, and an NchMOS transistor 552.

The AND circuit 541 receives at one input terminal the timing signal T1 which is received via an input terminal in1, and receives at the other input terminal the timing signal T2 which is received via an input terminal in2 and logically inverted by the inverter 544. The AND circuit 542 receives at one input terminal the timing signal T1 which is received via the input terminal in1 and logically inverted by the inverter 543, and receives at the other input terminal the timing signal T2 which is received via the input terminal in2 and logically inverted by the inverter 544.

The NAND circuit 546 receives at one input terminal an output of the AND circuit 541. The NAND circuit 547 receives at one input terminal an output of the AND circuit 542. The NAND circuit 548 receives at one input terminal the timing signal T2 which is received via the input terminal in2. Each of the NAND circuits 546 to 548 receives at the other input terminal the timing signal T3 which is received via an input terminal in3 and logically inverted by the inverter 545.

The PchMOS transistor 549 receives at the gate an output of the NAND circuit 546. When the output of the NAND circuit 546 is at low level, the PchMOS transistor 549 enters a conductive state and outputs, via an output terminal out, the power supply potential VDD1 as the high potential Vccp1. The PchMOS transistor 550 receives at the gate an output of the NAND circuit 547. When the output of the NAND circuit 547 is at low level, the PchMOS transistor 550 enters a conductive state and outputs, via the output terminal out, the power supply potential VDD2 as the intermediate potential Vccp2.

The PchMOS transistor 551 receives at the gate an output of the NAND circuit 548. When the output of the NAND circuit 548 is at low level, the PchMOS transistor 551 enters a conductive state and outputs, via the output terminal out, the power supply potential VDD3 as the intermediate potential Vccp3. The NchMOS transistor 552 receives at the gate the timing signal T3. When the timing signal T3 is at high level, the NchMOS transistor 552 enters a conductive state and outputs, via the output terminal out, the power supply potential VSS as the low potential Vini.

Figure 25:
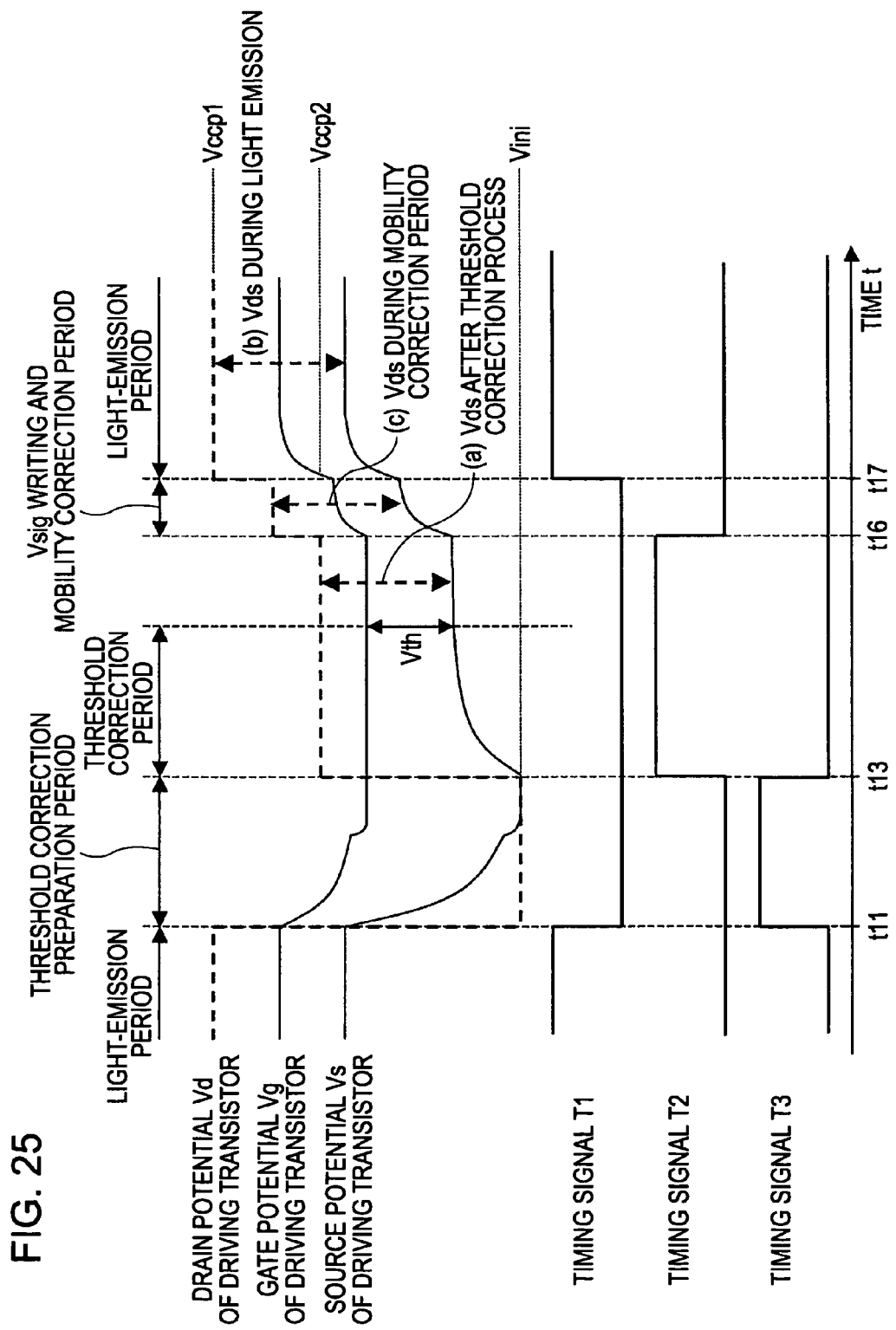
FIG. 25 is a waveform timing chart for explaining a circuit operation of the power supply/scan circuit according to Example 2.

FIG. 25 is a waveform timing chart showing the timing relationship among the timing signals T1, T2, and T3. As shown in the waveform timing chart of FIG. 25, since the timing signals T1 and T2 are at low level and the timing signal T3 is at high level during the threshold correction preparation period, the power supply/scan circuit 50B outputs the low potential Vini. Since the timing signals T1 and T3 are at low level and the timing signal T2 is at high level during the threshold correction period and a period before entering the light-emission period, the power supply/scan circuit 50B outputs the intermediate potential Vccp2.

Since the timing signals T1, T2, and T3 are at low level during the signal writing and mobility correction period, the power supply/scan circuit 50B outputs the intermediate potential Vccp3. In addition, since the timing signal T1 is at high level and the timing signals T2 and T3 are at low level during the light-emission period, the power supply/scan circuit 50B outputs the high potential Vccp1.

Second Embodiment

In an organic EL display device 10B according to a second embodiment of the present invention, the signal output circuit 60 is configured to selectively output the signal voltage Vsig of an image signal, the reference potential Vofs, and at least one type of halftone voltage Vmid.

Here, as in the first embodiment, the reference potential Vofs serves as a reference of the signal voltage Vsig of an image signal and is used as the initial value of the gate potential Vg of the driving transistor 22 in a threshold correction process. The halftone voltage Vmid is a voltage between the reference potential Vofs, which serves as an initial value of the gate potential Vg of the driving transistor 22 and the maximum signal voltage Vsig, that is, the signal voltage Vsig(W) for white level. As described later, the halftone voltage Vmid is used in order to perform a plurality of mobility correction processing operations.

Circuit Operation

The basic circuit operation of the organic EL display device 10B according to the second embodiment will be described with reference to operation diagrams of FIGS. 27A to 27D and FIGS. 28A to 28D on the basis of a waveform timing chart of FIG. 26. For simplification, in the operation diagrams of FIGS. 27A to 27D and FIGS. 28A to 28D, the writing transistor 23 is illustrated by using a symbol representing a switch. In addition, the equivalent capacitor 25 for the organic EL element 21 is also illustrated.

Figure 26:
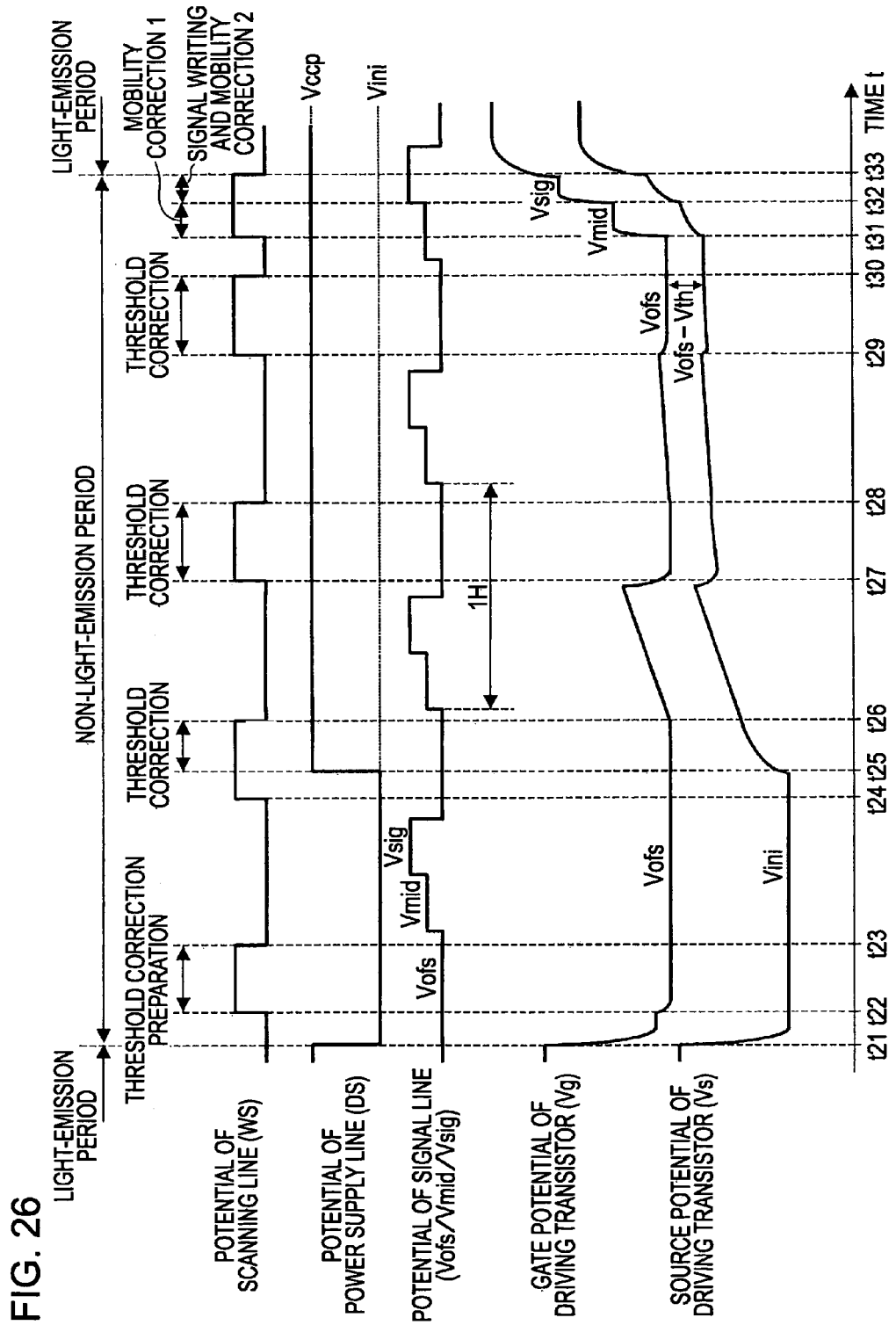
FIG. 26 is a waveform timing chart for explaining a basic circuit operation of an organic EL display device according to a second embodiment.

The waveform timing chart of FIG. 26 shows variations in the potential (write-scan signal) WS of the scanning line 31, the potential (power supply potential) DS of the power supply line 32, the potential (Vsig/Vofs/Vmid) of the signal line 33, and the gate potential Vg and the source potential Vs of the driving transistor 22.

As the basic circuit operation of the organic EL display device 10A according to the first embodiment, a case where a single threshold-correction processing operation is performed has been explained by way of example. Meanwhile, as the basic circuit operation of the organic EL display device 10B according to the second embodiment, a driving method in which a divided Vth correction process is performed is employed. However, obviously, a driving method in which a single threshold-correction processing operation is performed may be employed.

Light-Emission Period of Preceding Frame

Referring to the waveform timing chart of FIG. 26, a period before time t21 is a light-emission period of the organic EL element 21 for the preceding frame. In the light-emission period for this frame, the potential DS of the power supply line 32 is the high potential Vccp and the writing transistor 23 is in a non-conductive state.

Figure 27A:
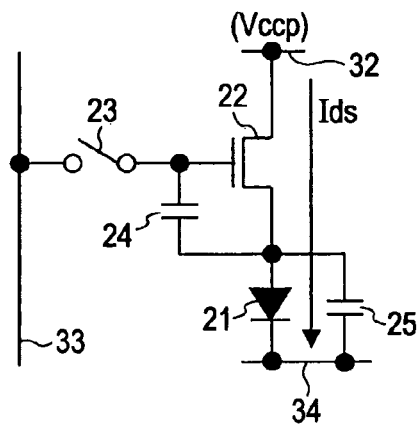
FIGS. 27A to 27D are explanatory diagrams showing the basic circuit operation of the organic EL display device according to the second embodiment.

Here, the driving transistor 22 is designed so as to operate in a saturation region. Thus, as shown in FIG. 27A, a driving current (drain-source current) Ids corresponding to the gate-source voltage Vgs of the driving transistor 22 is supplied from the power supply line 32 through the driving transistor 22 to the organic EL element 21. Thus, the organic EL element 21 emits light at a luminance corresponding to the value of the driving current Ids.

Threshold Correction Preparation

Figure 27B:
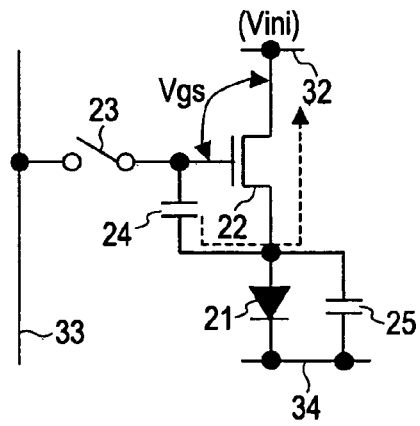

At time t21, a new frame (current frame) of line-sequential scanning starts. As shown in FIG. 27B, the potential DS of the power supply line 32 is switched from the high potential Vccp to the low potential Vini. Here, if the low potential Vini is smaller than the sum of the threshold voltage Vthel of the organic EL element 21 and the cathode potential Vcath, that is, the relationship Vini<Vthel+Vcath is met, the organic EL element 21 enters an inverse bias state. Thus, the organic EL element 21 stops emitting light. Here, the anode potential of the organic EL element 21 is the low potential Vini.

Figure 27C:
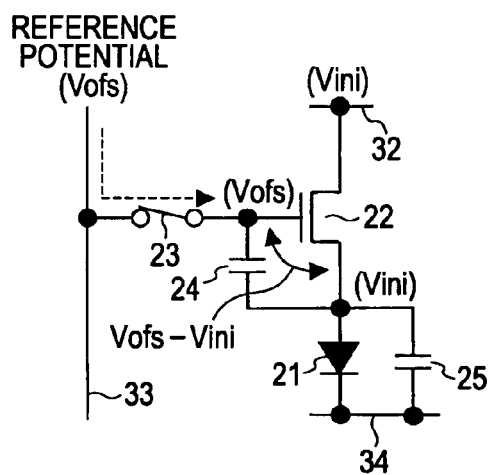

At time t22 when the potential of the signal line 33 is the reference potential Vofs, the potential WS of the scanning line 31 is shifted from a lower potential to a higher potential. Thus, as shown in FIG. 27C, the writing transistor 23 enters a conductive state. Here, since the gate potential Vg of the driving transistor 22 is the reference potential Vofs, the gate-source voltage Vgs of the driving transistor 22 is represented by Vofs−Vini.

Here, a threshold correction process is performed only when the value represented by Vofs−Vini is greater than the threshold voltage Vth of the driving transistor 22. Thus, it is necessary to satisfy the potential relationship Vofs−Vini>Vth.

As described above, a threshold correction preparation process for initializing the gate potential Vg of the driving transistor 22 to the reference potential Vofs and initializing the source potential Vs of the driving transistor 22 to the low potential Vini is performed. The threshold correction preparation process is performed during a period from time t22 to time t23 during which the potential WS of the scanning line 31 is the high potential.

Divided Vth Correction Process

Figure 27D:
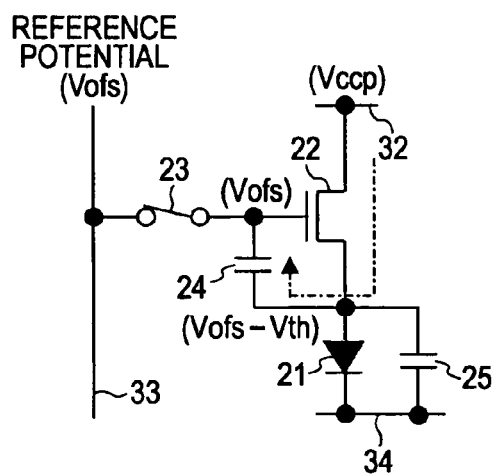

At time t24, the potential WS of the scanning line 31 is shifted from a lower potential to a higher potential. Thus, the writing transistor 23 enters the conductive state again. At time t25, the potential DS of the power supply line 32 is switched from the low potential Vini to the high potential Vccp. Thus, as shown in FIG. 27D, a current flows in the order of the power supply line 32, the driving transistor 22, the anode of the organic EL element 21, and the storage capacitor 24.

Here, since the organic EL element 21 can be expressed by a diode and a capacitor (equivalent capacitor), the current flowing in the driving transistor 22 is used for charging the storage capacitor 24 and the equivalent capacitor Cel, as long as the anode voltage Vel of the organic EL element 21 satisfies the relationship Vel≦Vcath+Vthel. When the relationship Vel≦Vcath+Vthel is satisfied, a leak current of the organic EL element 21 is sufficiently smaller than the current flowing in the driving transistor 22.

Figure 29:
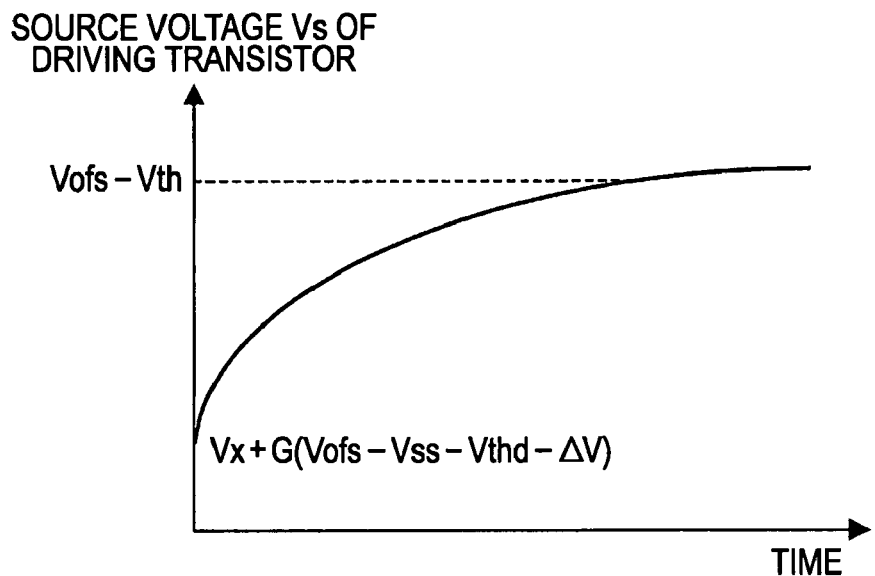
FIG. 29 is a characteristic diagram for explaining a problem caused by a variation in the threshold voltage of a driving transistor.

By this charging operation, the anode voltage Vel of the organic EL element 21, that is, the source potential Vs of the driving transistor 22, increases with time, as shown in FIG. 29. That is, a threshold correction process for changing the source potential Vs to a potential obtained by subtracting the threshold voltage Vth of the driving transistor 22 from the initial potential Vofs of the gate electrode of the driving transistor 22 is performed.

At time t26, which is a certain period of time after time t25, the potential WS of the scanning line 31 is shifted from a higher potential to a lower potential. Thus, the writing transistor 23 enters the non-conductive state. The period from time t25 to time t26 corresponds to a first threshold correction period.

Figure 28A:
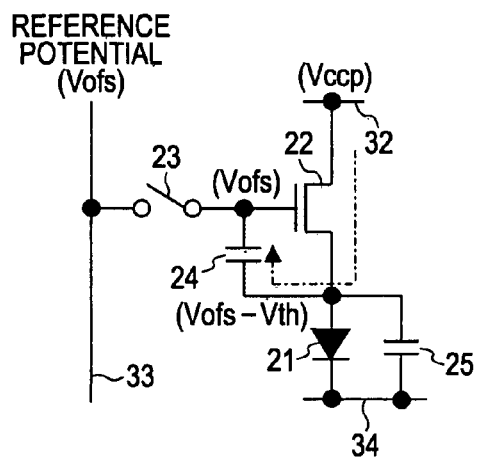
FIGS. 28A to 28D are another explanatory diagrams showing the basic circuit operation of the organic EL display device according to the second embodiment.

In this threshold correction period, the gate-source voltage Vgs of the driving transistor 22 is greater than the threshold voltage Vth. Thus, as shown in FIG. 28A, a current flows in the order of the power supply line 32, the driving transistor 22, the anode of the organic EL element 21, and the storage capacitor 24. Thus, the gate potential Vg and the source potential Vs of the driving transistor 22 increase. Here, since the organic EL element 21 is inversely biased, the organic EL element 21 does not emit light.

At time t27 when the potential of the signal line 33 is the reference potential Vofs, the potential WS of the scanning line 31 is shifted from a lower potential to a higher potential. Thus, the writing transistor 23 enters the conductive state again. Thus, the gate potential Vg of the driving transistor 22 is initialized to the reference potential Vofs, and a second threshold correction processing operation starts. The second threshold correction processing operation is performed until time t28 when the potential WS of the scanning line 31 is shifted from a higher potential to a lower potential and the writing transistor 23 enters the non-conductive state.

During a period from time t29 to time t30, a third threshold correction processing operation is performed. In this example of the circuit operation, the threshold correction process is divided into three processing operations and performed during three H periods. However, this is merely an example. A divided Vth correction process does not necessarily include three processing operations.

By repeating the processing operations of the divided Vth correction process, the gate-source voltage Vgs of the driving transistor 22 finally converges to the threshold voltage Vth of the driving transistor 22. A voltage corresponding to the threshold voltage Vth is stored in the storage capacitor 24.

In the threshold correction process, it is necessary to cause a current to flow to the storage capacitor 24 but not to the organic EL element 21. To this end, the potential Vcath of the common power supply line 34 is set to a potential at which the organic EL element 21 is in a cutoff state.

At time t30, the potential WS of the scanning line 31 is shifted from a higher potential to a lower potential. Thus, the writing transistor 23 enters the non-conductive state. Here, the gate electrode of the driving transistor 22 is electrically disconnected from the signal line 33 and enters a floating state. However, since the gate-source voltage Vgs of the driving transistor 22 is equal to the threshold voltage Vth of the driving transistor 22, the driving transistor 22 is in a cutoff state. Thus, the drain-source current Ids does not flow in the driving transistor 22.

After performance of the third threshold correction processing operation, the signal output circuit 60 outputs the halftone voltage Vmid, instead of the reference potential Vofs, to the signal line 33. That is, the potential of the signal line 33 is shifted from the reference potential Vofs to the halftone voltage Vmid. The halftone voltage Vmid is used for performing a first mobility correction processing operation before writing of the signal voltage Vsig of an image signal.

Mobility Correction 1

Figure 28B:
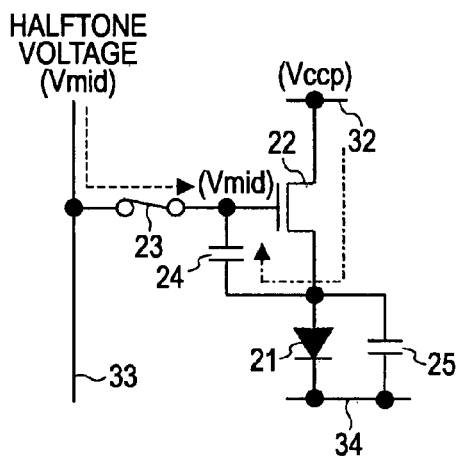

At time t31 when the signal line 33 has the halftone voltage Vmid, the potential WS of the scanning line 31 is shifted from a lower potential to a higher potential. Thus, as shown in FIG. 28B, the writing transistor 23 enters the conductive state again. Thus, the halftone voltage Vmid is written to a pixel, and the primary (first) mobility correction processing operation (mobility correction 1) of a mobility correction process having primary and secondary stages is performed.

The period during which the first mobility correction processing operation is performed corresponds to a period until time t32 when the potential of the signal line 33 is shifted from the halftone voltage Vmid to the signal voltage Vsig of an image signal. An effect achieved by performing the first mobility correction processing operation using the halftone voltage Vmid will be described later in detail.

Signal Writing and Mobility Correction 2

Figure 28C:
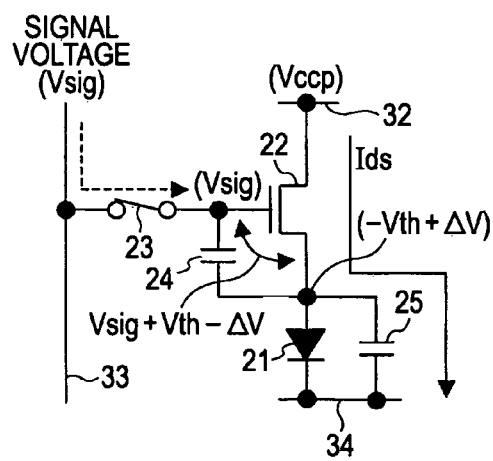

At time t32 when the writing transistor 23 is in the conductive state, the potential of the signal line 33 is switched from the halftone voltage Vmid to the signal voltage Vsig of an image signal. Thus, the signal voltage Vsig is written to the pixel. Thus, as shown in FIG. 28C, the gate potential Vg of the driving transistor 22 is changed from the halftone voltage Vmid to the signal voltage Vsig of the image signal.

That is, by writing of the signal voltage Vsig of the image signal by the writing transistor 23, the gate potential Vg of the driving transistor 22 reaches the signal voltage Vsig. In the case of driving of the driving transistor 22 at the signal voltage Vsig of the image signal, the threshold voltage Vth of the driving transistor 22 is canceled by a voltage corresponding to the threshold voltage Vth stored in the storage capacitor 24.

Meanwhile, since a current flows from the power supply line 32 through the driving transistor 22, the source potential Vs of the driving transistor 22 increases with time. If the source potential Vs of the driving transistor 22 does not exceed the sum of the threshold voltage Vthel of the organic EL element 21 and the cathode potential Vcath, the current (drain-source current Ids) flowing in the driving transistor 22 is used for charging the storage capacitor 24 and the equivalent capacitor 25 for the organic EL element 21.

Figure 30:
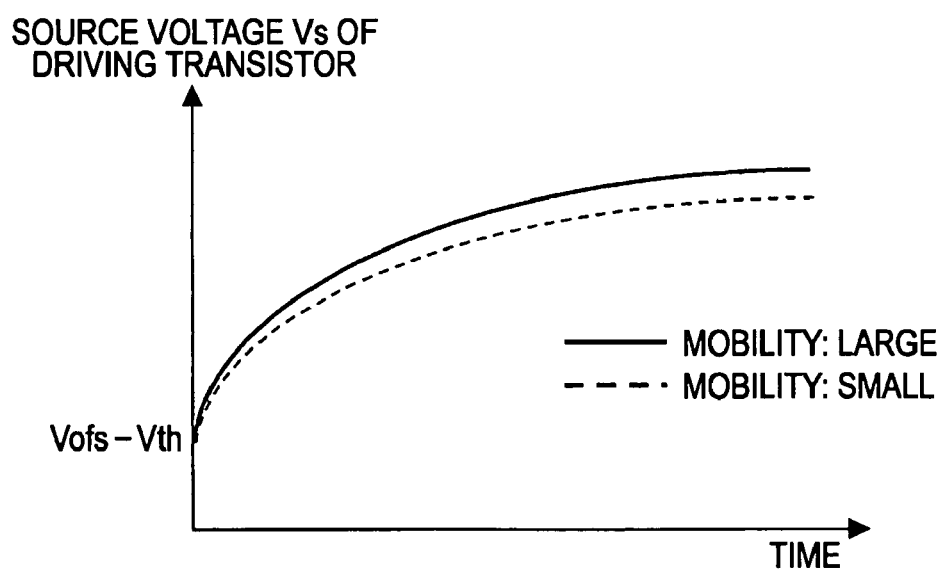
FIG. 30 is a characteristic diagram for explaining a problem caused by a variation in the mobility of the driving transistor.

By this time, a pixel-to-pixel variation in the threshold voltage Vth of the driving transistor 22 has been eliminated (canceled). Thus, the current flowing in the driving transistor 22 reflects the mobility μ of the driving transistor 22. Specifically, as shown in FIG. 30, in the case of the driving transistor 22 having a large mobility A, a large amount of current flows and the source potential Vs rapidly increases. On the contrary, in the case of the driving transistor 22 having a small mobility μ, a small amount of current flows and the source potential Vs slowly increases.

Thus, by providing negative feedback to the gate-source voltage Vgs at a feedback amount ΔV corresponding to the current flowing in the driving transistor 22, dependency of the drain-source current Ids of the driving transistor 22 upon the mobility μ can be eliminated. That is, as described above in the description of the circuit operation in the first embodiment, a pixel-to-pixel variation in the mobility μ can be corrected by negative feedback. The secondary (second) mobility correction processing operation (mobility correction 2) is performed in parallel with a writing process for writing the signal voltage Vsig.

Light-Emission Period

Figure 28D:
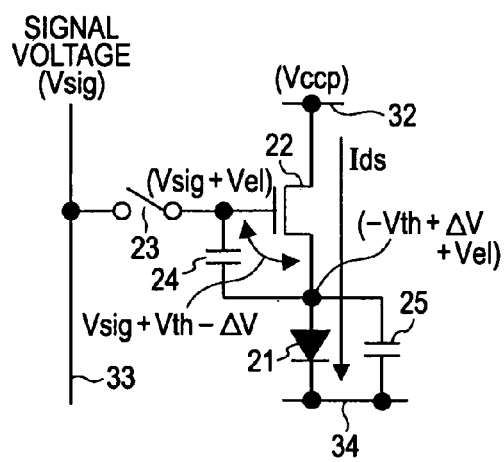

At time t33, the potential WS of the scanning line 31 is shifted to a lower potential. Thus, as shown in FIG. 28D, the writing transistor 23 enters the non-conductive state. Hence, the gate electrode of the driving transistor 22 is electrically disconnected from the signal line 33 and enters a floating state.

At the same time as the gate electrode of the driving transistor 22 entering the floating state, the drain-source current Ids of the driving transistor 22 starts flowing to the organic EL element 21. Thus, the anode potential of the organic EL element 21 increases in accordance with the drain-source current Ids. When the anode potential of the organic EL element 21 exceeds the value represented by Vthel+Vcath, a driving current starts flowing to the organic EL element 21 and the organic EL element 21 thus starts emitting light.

Also in the organic EL display device 10B according to the second embodiment, when the light-emission period of the organic EL element 21 is long, the I-V characteristics of the organic EL element 21 vary. Thus, the source potential Vs of the driving transistor 22 also varies. However, since the gate-source voltage Vgs of the driving transistor 22 is maintained constant, the current flowing in the organic EL element 21 does not vary. Thus, even if the I-V characteristics of the organic EL element 21 deteriorate, since a constant current flows in the organic EL element 21, the light emission luminance of the organic EL element 21 does not vary.

Effect of Two Mobility Correction Processing Operations

An optimal mobility correction time period t can be represented by equation (4):

$$t = C/(k\mu V\text{sig}) \qquad (4),$$

where a constant k is represented by k=(½)(W/L)Cox, and C represents the capacitance of a node that is discharged when a mobility correction process is performed. In the circuit example shown in FIG. 2, C represents a combined capacitance of the equivalent capacitor 25 for the organic EL element 21, the capacitance of the storage capacitor 24, the parasitic capacitance between the gate and source of the driving transistor 22, and the like.

As is clear from equation (4), the length of the mobility correction time period t is inversely proportional to the level of the signal voltage Vsig of an image signal. In view of this, in the organic EL display device 10A according to the first embodiment, the falling waveform of the scanning line potential (write-scan signal) WS at time t17 shown in the waveform timing chart of FIG. 4 is set to be inversely proportional to the level of the signal voltage Vsig of an image signal. Note that in the description of the first embodiment, the detailed description of the falling waveform of the write-scan signal WS is omitted.

Since the falling waveform of the write-scan signal WS at the ending of signal writing is set to be inversely proportional to the level of the signal voltage Vsig, the writing transistor 23 is cut off when the gate-source voltage of the writing transistor 23 reaches the threshold voltage Vth. Accordingly, the length of the mobility correction time period t can be set to be inversely proportional to the level of the signal voltage Vsig of an image signal.

Specifically, in the case of the signal voltage Vsig(white) corresponding to white level, the writing transistor 23 is cut off at a point in time when the gate-source voltage reaches a value represented by Vsig(white)+Vth. Thus, the mobility correction time period t(white) for white display is the shortest. In addition, in the case of the signal voltage Vsig(gray) corresponding to gray level, the writing transistor 23 is cut off at a point in time when the gate-source voltage reaches a value represented by Vsig(gray)+Vth. Thus, the mobility correction time period t(gray) for gray display is longer than the mobility correction time period t(white).

As described above, in the organic EL display device 10A according to the first embodiment, since the falling waveform of the write-scan signal WS at the ending of signal writing is set to be inversely proportional to the level of the signal voltage Vsig, an optimal mobility correction time period t can be set. Hence, since an optimal mobility correction time period t can be set so as to correspond to the level of the signal voltage Vsig, pixel-to-pixel variations in the driving transistor 22 throughout the whole grayscale range can be corrected more reliably.

Here, a write-scan signal WS for determining the mobility correction time period t is generated for each scanning stage by the write-scan circuit 40 shown in FIG. 1. In order to set the falling waveform of the write-scan signal WS at the ending of signal writing to be inversely proportional to the level of the signal voltage vsig, it is necessary for the write-scan circuit 40 to have a complicated circuit configuration, resulting in an increase in the cost of the entire display device.

In addition, when the falling waveform of the write-scan signal WS varies depending on the scanning stage, such a variation is more likely to affect, in particular, a white-level side for which a short mobility correction time period t is set. That is, when the falling waveform of the write-scan signal WS varies, since, in particular, the mobility correction time period t(white) varies depending on the scanning stage for white display, a variation occurs in mobility correction. Thus, an optimal mobility correction is not achieved in each scanning stage.

In view of this, it is desirable that an optimal mobility correction process be performed for the whole grayscale range of the signal voltage Vsig, while a mobility correction time period t is maintained constant. To this end, the organic EL display device 10B according to the second embodiment is provided. That is, the organic EL display device 10B according to the second embodiment is capable of realizing an optimal mobility correction process for the whole grayscale range while maintaining a constant mobility correction time period t, by performing at least one mobility correction processing operation using the halftone voltage Vmid before writing the signal voltage Vsig.

The reason why an optimal mobility correction process can be performed for the whole grayscale range while a mobility correction time period t is maintained constant will be described below.

A mobility correction process, that is, a process for providing negative feedback to the gate-source voltage Vgs of the driving transistor 22 at a feedback amount ΔV corresponding to the drain-source current Ids of the driving transistor 22, is completed when the gate-source voltage Vgs reaches a specific level. Here, assuming that the writing gain G of the signal voltage Vsig of an image signal is 1, the specific level is represented by Vsig−Vofs+Vth−ΔV.

In addition, the feedback amount ΔV is represented by equation (5):

$$\Delta V = Ids \cdot t/(Cel + Ccs + Cgs) \qquad (5),$$

where "Cel" represents the equivalent capacitance of the organic EL element 21, "Csc" represents the capacitance of the storage capacitor 24, and "Cgs" represents a parasitic capacitance between the gate and source of the driving transistor 22.

Here, "t1" represents a mobility correction time period for white display in a case where mobility correction based on the halftone voltage Vmid is not performed, and "t2" represents a mobility correction time period for gray display in a case where mobility correction based on the halftone voltage Vmid is not performed.

Figure 31A:
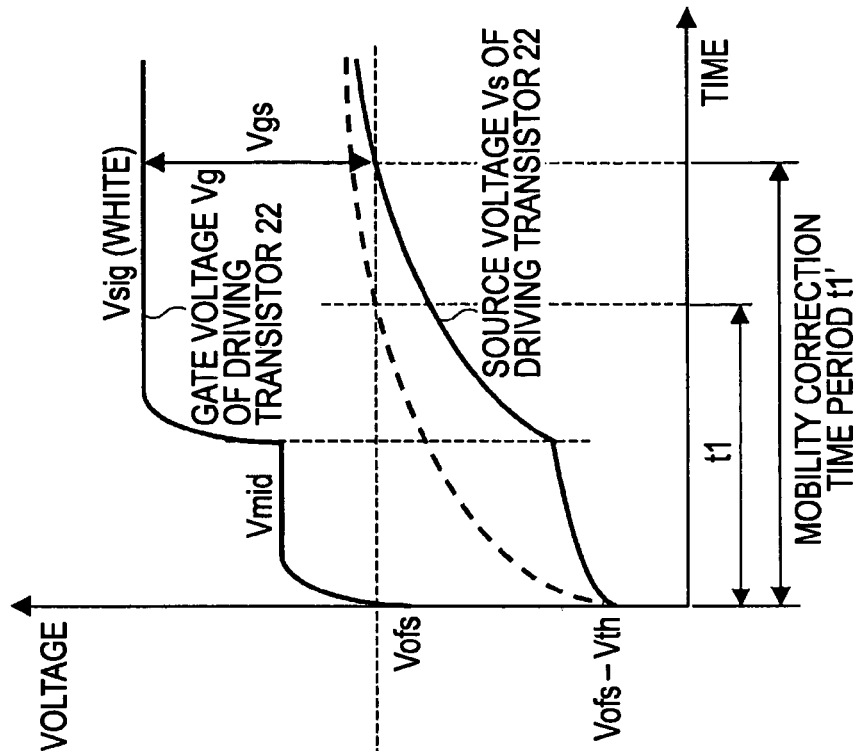
FIG. 31A is an explanatory diagram for explaining a mobility correction time period in a case where mobility correction based on a halftone voltage is not performed for white display.

First, white display will be considered. In a case where mobility correction based on the halftone voltage Vmid is not performed, when the signal voltage Vsig(white) is written, the source potential Vs of the driving transistor 22 starts increasing, as shown in FIG. 31A. Then, when the gate-source voltage Vgs of the driving transistor 22 reaches a specific level, the mobility correction process is completed. In this case, a time period t1 from a point in time when the signal voltage Vsig(white) is written to a point in time when the gate-source voltage Vgs of the driving transistor 22 reaches the specific level corresponds to a mobility correction time period.

Figure 31B:
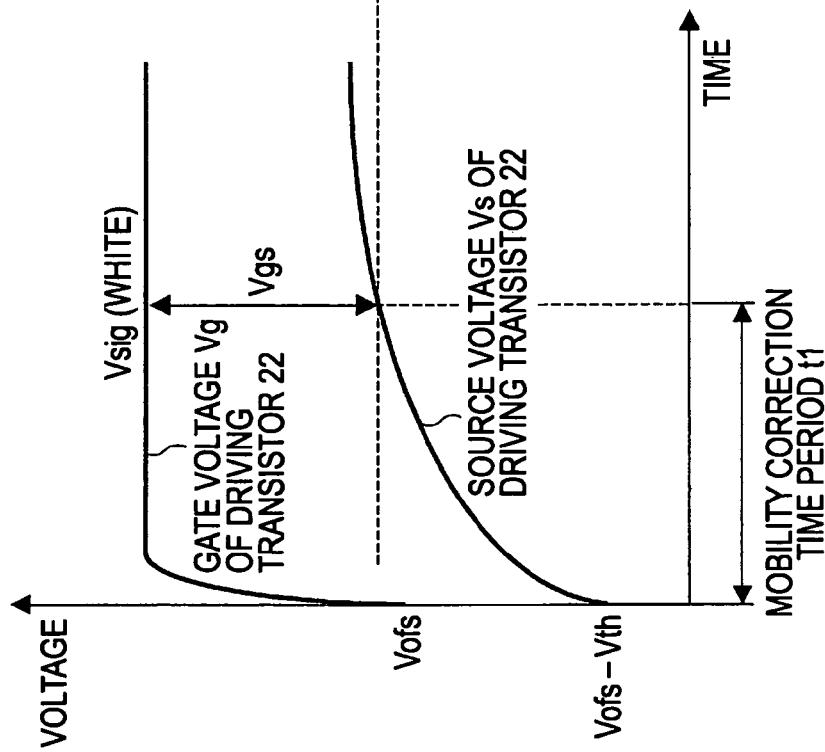
FIG. 31B is an explanatory diagram for explaining a mobility correction time period in a case where mobility correction based on the halftone voltage is performed for white display.

Meanwhile, in a case where mobility correction based on the halftone voltage Vmid is performed, when the halftone voltage Vmid is written, as shown in FIG. 31B, the source potential Vs of the driving transistor 22 increases with a slow (moderate) response speed, compared with the case of FIG. 31A. Next, when the signal voltage Vsig(white) is written, the source potential Vs of the driving transistor 22 starts increasing with the same response speed as the case of FIG. 31A.

Then, when the gate-source voltage Vgs of the driving transistor 22 reaches the specific level, the mobility correction process is completed. In this case, a time period t1′ from a point in time when the halftone voltage Vmid is written to a point in time when the gate-source voltage Vgs of the driving transistor 22 reaches the specific level corresponds to a mobility correction time period. Here, since a time period (the first mobility correction time period) during which the source potential Vs of the driving transistor 22 increases with a response speed slower than the case of FIG. 31A is provided by writing of the halftone voltage Vmid, the mobility correction time period t1′ is longer than the mobility correction time period t1 (that is, t1′>t1) by a length corresponding to a period during which the source potential Vs of the driving transistor 22 increases with a response speed lower than the case of FIG. 31A by writing of the halftone voltage Vmid.

Next, gray display will be considered. In a case where mobility correction based on the halftone voltage Vmid is not performed, when the signal voltage Vsig(gray) is written, the source potential Vs of the driving transistor 22 starts increasing, as shown in FIG. 32A. Then, when the gate-source voltage Vgs of the driving transistor 22 reaches a specific level, the mobility correction process is completed. In this case, a time period t2 from a point in time when the signal voltage Vsig(gray) is written to a point in time when the gate-source voltage Vgs of the driving transistor 22 reaches the specific level corresponds to a mobility correction time period.

Figure 32B:
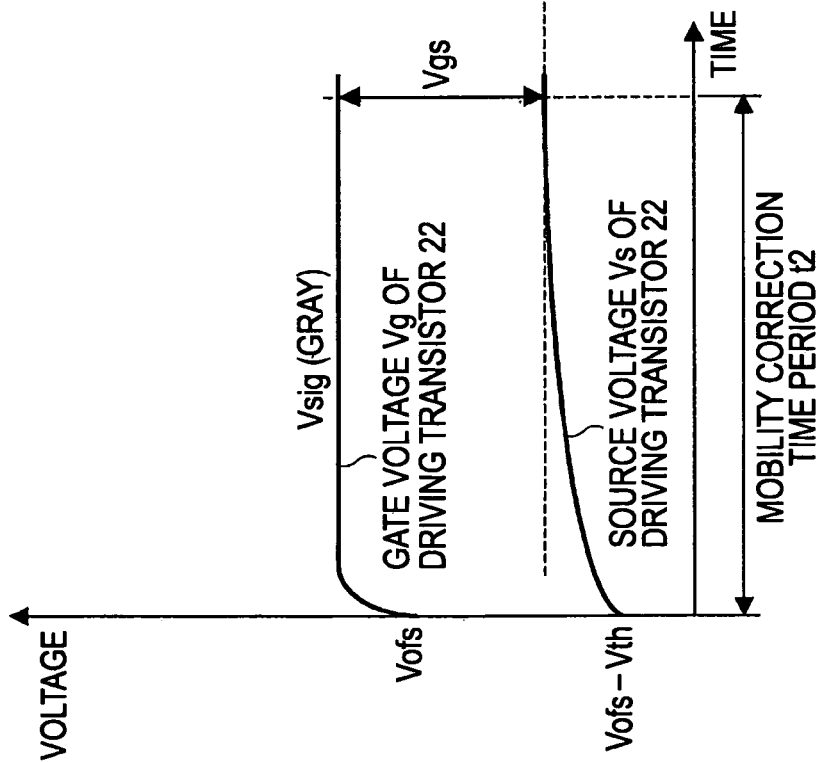
FIG. 32B is an explanatory diagram for a mobility correction time period in a case where mobility correction based on the halftone voltage is performed gray display.
Figure 32A:
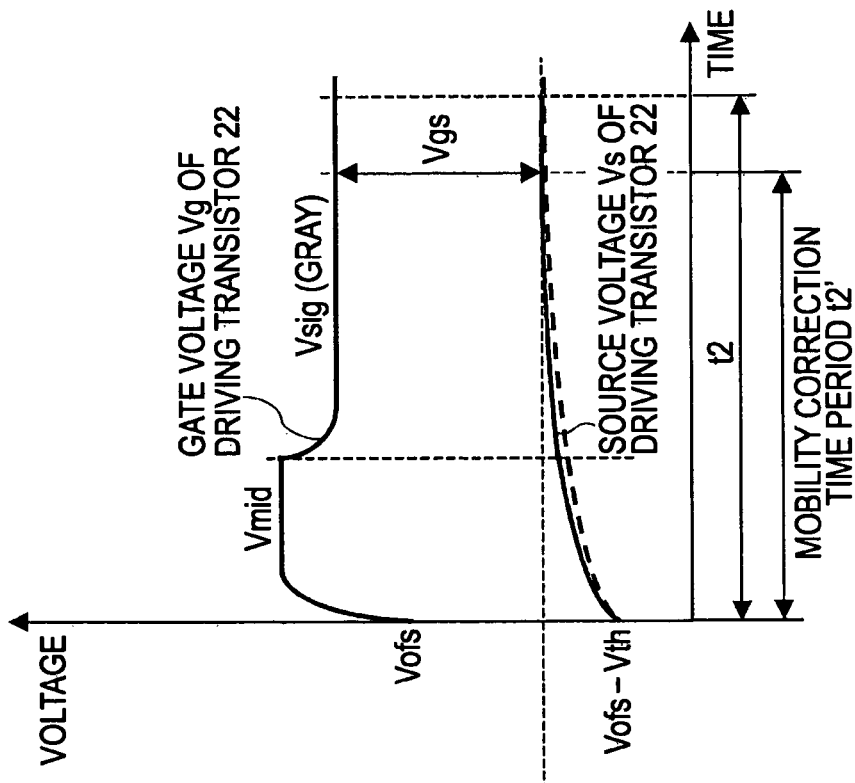
FIG. 32A is an explanatory diagram for explaining a mobility correction time period in a case where mobility correction based on a halftone voltage is not performed for gray display.
Figure 34:
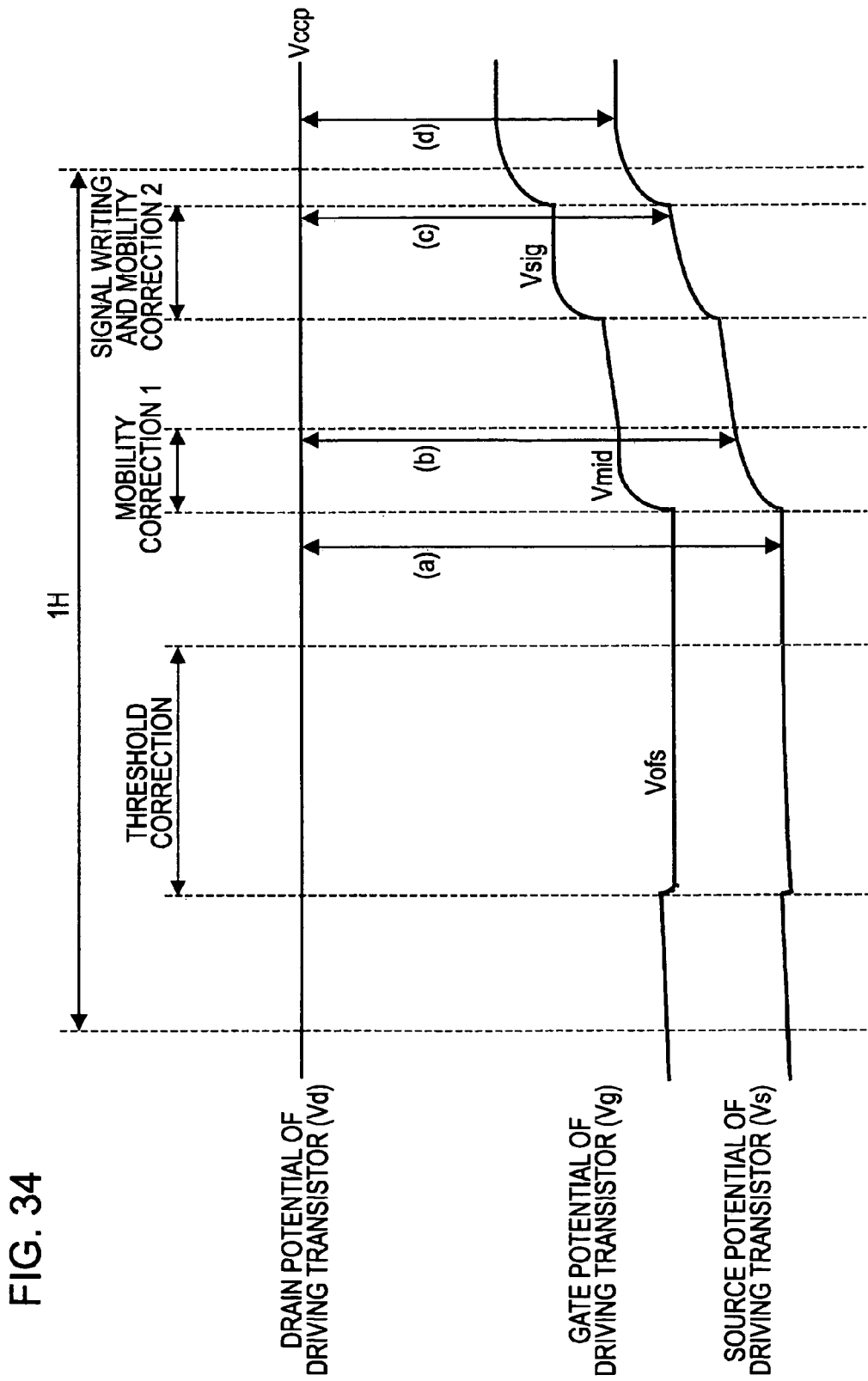
FIG. 34 is a waveform timing chart in a case where an organic EL display device that performs a mobility correction process having multiple stages selectively sets, in an appropriate manner, two potential values, Vini and Vccp, as a power supply potential.

Meanwhile, in a case where mobility correction based on the halftone voltage Vmid is performed, when the halftone voltage Vmid is written, as shown in FIG. 32B, the source potential Vs of the driving transistor 22 increases with a fast response speed, compared with the case of FIG. 32A. This is because the halftone voltage Vmid is higher than the signal voltage Vsig(gray). Next, when the signal voltage Vsig(gray) is written, the source potential Vs of the driving transistor 22 further increases.

Then, when the gate-source voltage Vgs of the driving transistor 22 reaches the specific level, the mobility correction process is completed. In this case, a time period t2' from a point in time when the halftone voltage Vmid is written to a point in time when the gate-source voltage Vgs of the driving transistor 22 reaches the specific level corresponds to a mobility correction time period. Here, the mobility correction time period t2' is shorter than the mobility correction time period t2 (that is, t2'<t2) by a length corresponding to a period during which the source potential Vs of the driving transistor 22 increases with a response speed faster than the case of FIG. 32A by writing of the halftone voltage Vmid.

That is, when both the cases of white display and gray display are considered, the mobility correction time period t1, which originally is a relatively shorter time period for white display, is increased to the time period t1', and the mobility correction time period t2, which originally is a relatively longer time period for gray display, is reduced to the time period t2'. By setting the halftone voltage Vmid in such a manner that the mobility correction time period t1' and the mobility correction time period t2' are made the same for the whole grayscale range of the signal voltage Vsig, an optimal mobility correction process can be performed for the whole grayscale range while a mobility correction time period t is maintained constant. Here, the halftone voltage Vmid may be constant or variable, depending on the level of the signal voltage Vsig.

As described above, since an optimal mobility correction process can be performed for the whole grayscale range while a mobility correction time period t is maintained constant, the falling waveform of the write-scan signal WS at the ending of signal writing is not necessarily set to be inversely proportional to the level of the signal voltage Vsig. Hence, since the circuit configuration of the write-scan circuit 40 can be made simpler, a reduction in the cost of the entire display device can be achieved. Moreover, since the falling waveform of the write-scan signal WS does not vary depending on the scanning stage, a problem in that the mobility correction time period t(white) varies depending on the scanning stage, in particular, for white display can be solved.

Modification of Second Embodiment

Although the first and second mobility correction processing operations are performed in succession within a period from time t31 to time t32 shown in FIG. 26 in the basic circuit operation of the second embodiment, the first and second mobility correction processing operations are not necessarily performed in succession. A case where the first and second mobility correction processing operations are not performed in succession will be specifically described as a modification of the second embodiment.

FIG. 33 is a waveform timing chart for explaining a circuit operation according to a modification of the second embodiment. FIG. 33 shows variations in the potential (Vsig/Vofs/Vmid) of the signal line 33, the potential (write-scan signal) WS of the scanning line 31, and the gate potential Vg and the source potential Vs of the driving transistor 22 at time t29 and the subsequent times in the waveform timing chart of FIG. 26.

Referring to the waveform timing chart of FIG. 33, regarding variations in the gate potential Vg and the source potential Vs of the driving transistor 22, solid lines represent a case of the driving transistor 22 having a large mobility μ and broken lines represent a case of the driving transistor 22 having a small mobility μ.

Mobility Correction 1

At time t31 when the signal line 33 has the halftone voltage Vmid, the potential WS of the scanning line 31 is shifted from a lower potential to a higher potential. Thus, the writing transistor 23 enters a conductive state. Hence, the halftone voltage Vmid is written to a pixel, and the primary (first) mobility correction processing operation (mobility correction 1) of a mobility correction process having primary and secondary stages starts.

Here, the drain-source voltage Vgs of the driving transistor 22 is equal to or higher than the threshold voltage Vth. At time t41 when the potential WS of the scanning line 31 is shifted from a higher potential to a lower potential and the writing transistor 23 enters a non-conductive state, the source potential Vs and the gate potential Vg of the driving transistor 22 start increasing.

If the source potential Vs of the driving transistor 22 does not exceed the sum of the threshold voltage Vthel of the organic EL element 21 and the cathode potential Vcath, a current (drain-source current Ids) flowing in the driving transistor 22 is used for charging the storage capacitor 24 and the equivalent capacitor Cel for the organic EL element 21.

Since the first mobility correction processing operation has not been completed by this time, increases in the source potential Vs and the gate potential Vg of the driving transistor 22 reflect the mobility μ of the driving transistor 22. That is, the amount of increase in the source potential Vs of the driving transistor 22 having a large mobility μ is large, and the amount of increase in the source potential Vs of the driving transistor 22 having a small mobility μ is small.

The period during which the first mobility correction processing operation is performed corresponds to a period until time t41 when the potential WS of the scanning line 31 is shifted from a higher potential to a lower potential. An effect achieved by performing the first mobility correction processing operation using the halftone voltage Vmid has been described above. That is, by the first mobility correction processing operation, a constant mobility correction time period can be set for the whole grayscale range.

Signal Writing and Mobility Correction 2

At time t32, the potential of the signal line 33 is switched from the halftone voltage Vmid to the signal voltage Vsig of an image signal. At time t42, the potential WS of the scanning line 31 is shifted from a lower potential to a higher potential. Thus, the writing transistor 23 enters the conductive state again. Hence, writing of the signal voltage Vsig of the image signal and the second mobility correction processing operation start.

Here, the source potential Vs of the driving transistor 22 having a small mobility μ immediately before the writing transistor 23 entering the conductive state is smaller than the source potential Vs of the driving transistor 22 having a large mobility μ. Thus, immediately after the signal voltage Vsig is written to the gate electrode of the driving transistor 22, the gate-source voltage Vgs of the driving transistor 22 having a small mobility μ is greater than the gate-source voltage Vgs of the driving transistor 22 having a large mobility μ.

Hence, a large amount of current flows in the driving transistor 22 having a small mobility μ. That is, the amount of increase in the source potential Vs of the driving transistor 22 having a small mobility μ is greater than the amount of increase in the source potential Vs of the driving transistor 22 having a large mobility μ. As a result, after a specific time period has passed, the gate-source voltage Vgs of the driving transistor 22 reflects the mobility μ of the driving transistor 22. Thus, finally, a pixel-to-pixel variation in the mobility μ can be corrected.

Light-Emission Period

At time t33, the potential WS of the scanning line 31 is shifted to a lower potential, and the writing transistor 23 enters the non-conductive state. Thus, the gate electrode of the driving transistor 22 is electrically disconnected from the signal line 33 and enters a floating state. At the same time, the drain-source current Ids of the driving transistor 22 starts flowing to the organic EL element 21, and the anode potential of the organic EL element 21 increases in accordance with the drain-source current Ids. Then, when the anode potential of the organic EL element 21 exceeds the value represented by Vthel+Vcath, a driving current starts flowing to the organic EL element 21 and the organic EL element 21 thus starts emitting light. Variation in driving current caused by kink phenomenon Also in the second embodiment and the modification of the second embodiment, a variation in the driving current for the organic EL element 21 caused by a kink phenomenon causes a difference between the luminances of individual pixels and causes a degradation in image quality, as in the first embodiment described above. General saturation characteristics of the driving transistor 22 are as shown in FIG. 11, and saturation characteristics in which a kink phenomenon occurs due to a manufacturing variation and the like are as shown in FIG. 12.

Figure 35:
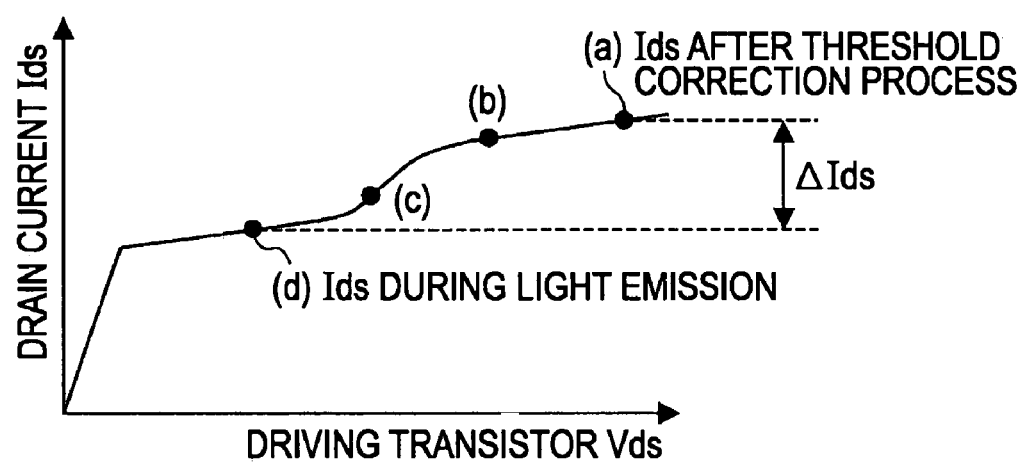
FIG. 35 is a characteristic diagram showing the Vds-Ids characteristics of the driving transistor having transistor characteristics in which a kink phenomenon occurs in a case where the potential of the power supply line is constant throughout a threshold correction period, a first mobility correction period, a signal writing and mobility correction period, and a light-emission period.

In the case of the driving transistor 22 exhibiting a kink phenomenon, the drain-source voltage Vds of the driving transistor 22, which determines a driving current for the organic EL element 21, is shifted in the order of (a), (b), (c), and (d), as shown in FIG. 35. Here, since the rising position and the falling amount of the kink phenomenon vary, in a case where a variation in the drain-source voltage Vds of the driving transistor 22 occurs inside and outside a region where the kink phenomenon occurs, light emission luminance varies. Thus, image quality is degraded.

Features of Second Embodiment

A feature of the second embodiment is that, in order to reduce a variation in the driving current for the organic EL element 21 caused by a kink phenomenon and improve image quality, the drain potential Vd of the driving transistor 22 is changed in accordance with operation periods. Here, the operation periods correspond to a threshold correction preparation period, a divided Vth correction period, a first mobility correction period, a signal writing and mobility correction period, and a light-emission period.

The power supply/scan circuit 50, which serves as a power supply unit and varies the drain potential Vd of the driving transistor 22 in accordance with the operation periods, is configured to be capable of selectively setting five potential values as the potential (power supply potential) Ds of the power supply line 32.

Specifically, the power supply/scan circuit 50 is capable of selectively setting, in an appropriate manner, five potential values, the high potential Vccp1 (=Vccp), the low potential Vini, and intermediate potentials Vccp2, Vccp3, and Vccp4 which are between the high potential Vccp1 and the low potential Vini, as the power supply potential DS. The power supply/scan circuit 50 that is capable of selectively setting five potential values can be configured using the concept used for the circuit configuration that is capable of selecting setting four potential values, as shown in FIGS. 23 and 24. Here, the intermediate potentials Vccp2, Vccp3, and Vccp4 satisfy the relationship Vccp2<Vccp3<Vccp4.

Figure 36:
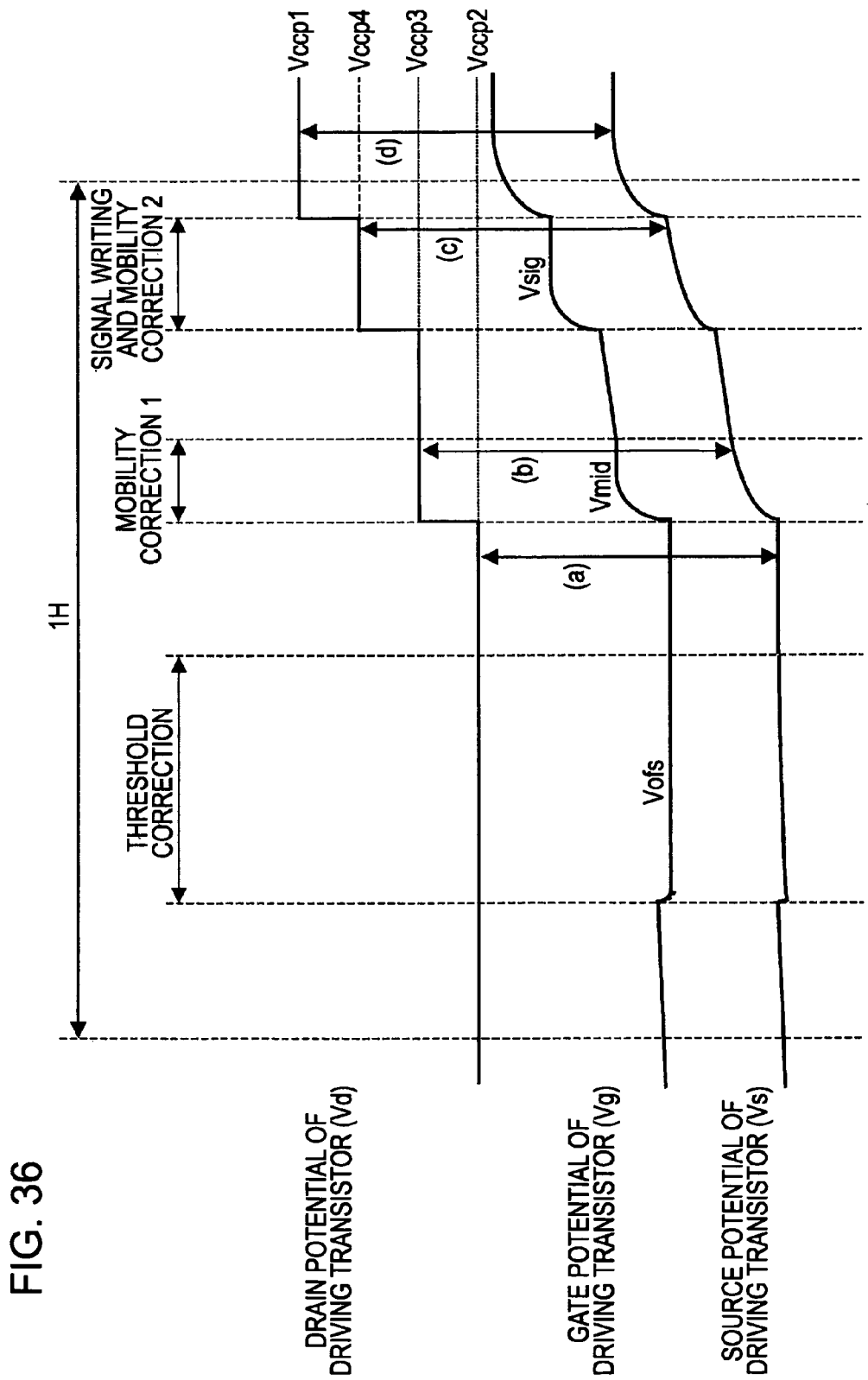
FIG. 36 is a waveform timing chart in a case where an organic EL display device that performs a mobility correction process having multiple stages selectively sets, in an appropriate manner, five potential values, Vini, Vccp2, Vccp3, Vccp4, and Vccp1, as the power supply potential.

As in the first embodiment, the power supply/scan circuit 50 sets the low potential Vini and the high potential Vccp1 for the threshold correction preparation period and the light-emission period, respectively. Furthermore, as shown in a waveform timing chart of FIG. 36, the power supply/scan circuit 50 sets the intermediate potential Vccp2 during the divided Vth correction period, sets the intermediate potential Vccp3 during the first mobility correction period, and sets the intermediate potential Vccp4 during the signal writing and mobility correction period.

Figure 37:
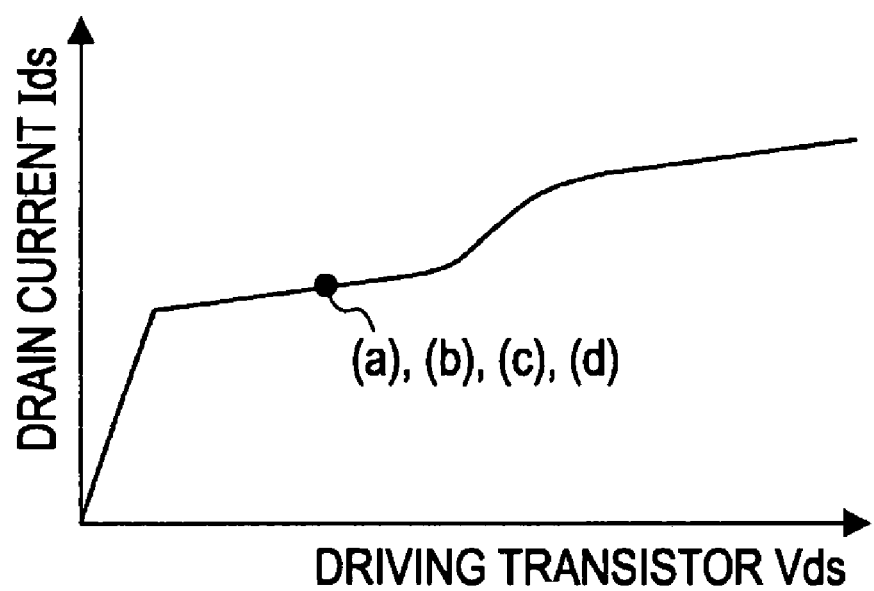
FIG. 37 is a characteristic diagram showing the Vds-Ids characteristics of the driving transistor having transistor characteristics in which a kink phenomenon occurs in a case where the potential of the power supply line varies among the threshold correction period, the first mobility correction period, the signal writing and mobility correction period, and the light-emission period.

It is desirable that the intermediate potentials Vccp2, Vccp3, and Vccp4 be set, as described below, relative to the high potential Vccp1 that is set during the light-emission period. That is, as shown in FIG. 37, it is desirable that the potential values Vccp1, Vccp2, Vccp3, and Vccp4 be set to potential values at which the drain-source voltage Vds(a) after performance of the threshold correction process, the drain-source voltage Vds(b) during the first mobility correction period, the drain-source voltage Vds(c) during the signal writing period, and the drain-source voltage Vds(d) during light emission of the organic EL element 21 are made the same. With this potential relationship, the drain-source voltage Vds can be maintained constant throughout the threshold correction preparation period, the divided Vth correction period, the first mobility correction period, the signal writing and mobility correction period, and the light-emission period, as shown in FIG. 37.

By performing processes from threshold correction preparation to light emission without using a region where a kink phenomenon occurs, a pixel-to-pixel variation in the drain-source current Ids of the driving transistor 22 caused by a kink phenomenon can further be reduced. Ideally, a variation in the drain-source current Ids can be eliminated. As a result, since a variation in the light emission luminance caused by a kink phenomenon does not occur, the quality of a display image can be improved.

Although processes from threshold correction preparation to light emission are performed in a state where the drain-source voltage Vds of the driving transistor 22 is lower than a voltage region where a kink phenomenon occurs in this embodiment, these processes may be performed in a state where the drain-source voltage Vds of the driving transistor 22 is higher than a voltage region where a kink phenomenon occurs.

In addition, although the organic EL display device 10B, which performs a mobility correction process having multiple stages, changes the power supply potential DS for each of the operation periods, such as the threshold correction preparation period, the threshold correction period, the first mobility correction period, the signal writing and mobility correction period, and the light-emission period, in this embodiment, this is merely an example. That is, the organic EL display device 10B, which performs a mobility correction process having multiple stages, may have the configuration used in Example 1 or Example 2 of the first embodiment.

Modifications

Although the pixel configuration in which the driving circuit for the organic EL element 21 basically includes two transistors, the driving transistor 22 and the writing transistor 23, has been described by way of example in each of the foregoing embodiments, the present invention is not necessarily limited to this pixel configuration.

Figure 38:
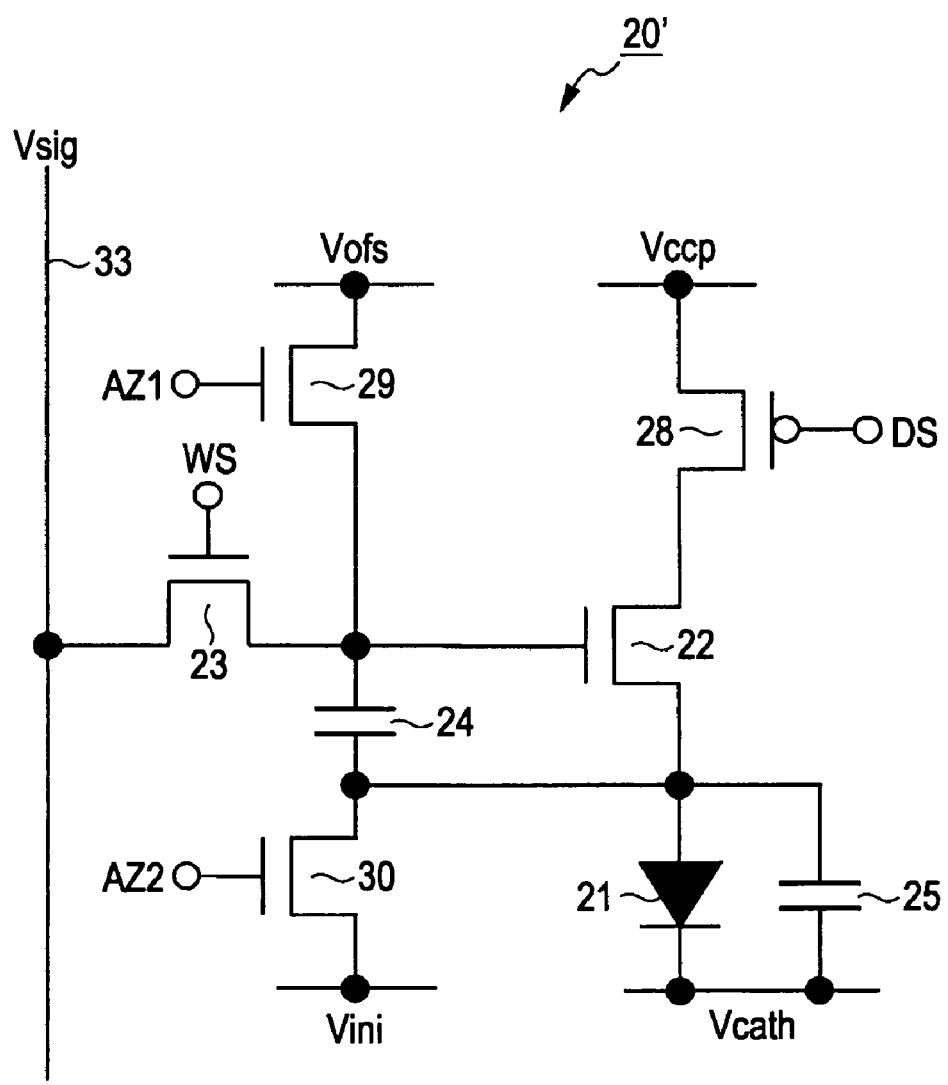
FIG. 38 is a circuit diagram showing another circuit configuration of a pixel.

For example, as shown in FIG. 38, a pixel 20' having, as a basic configuration, a 5Tr circuit configuration including five transistors, that is, a light emission control transistor 28 and two switching transistors 29 and 30, as well as the driving transistor 22 and the writing transistor 23, is described, for example, in Japanese Unexamined Patent Application Publication No. 2005-345722. Although a Pch transistor is used as the light emission control transistor 28 and Nch transistors are used as the switching transistors 29 and 30 in the circuit configuration described in Japanese Unexamined Patent Application Publication No. 2005-345722, a desired combination of conductive types is possible.

The light emission transistor 28 is serially connected to the driving transistor 22 and selectively supplies the high potential Vccp to the driving transistor 22. Accordingly, the light emission transistor 28 controls the organic EL element 21 to emit light or not to emit light. The switching transistor 29 selectively supplies the reference potential Vofs to the gate electrode of the driving transistor 22. Accordingly, the switching transistor 29 initializes the gate potential Vg of the driving transistor 22 to the reference potential Vofs. The switching transistor 30 selectively supplies the low potential Vini to the source electrode of the driving transistor 22. Accordingly, the switching transistor 30 initializes the source potential Vs of the driving transistor 22 to the low potential Vini.

Although the 5Tr circuit configuration has been described above as another pixel configuration, various other pixel configurations can be employed. For example, a pixel configuration in which by causing the reference potential Vofs to be supplied through the signal line 33 and causing the writing transistor 23 to write the reference potential Vofs, the switching transistor 29 is eliminated, can be employed.

In addition, although the case of an organic EL display device including organic EL elements as electrooptical elements of the individual pixels 20 has been described in each of the foregoing embodiments, the present invention is not limited to this. Specifically, the present invention is applicable to any type of display device including current-driven electrooptical elements (light-emitting elements), such as inorganic EL elements, LED elements, and semiconductor laser elements, whose light emission luminances vary in accordance with the values of currents flowing in the elements.

Applications

A display device according to an embodiment of the present invention described above is applicable to a display device of various electronic apparatuses for displaying image signals input to the electronic apparatus or an image signal generated inside the electronic apparatus as images or videos. For example, a display device according to an embodiment of the present invention is applicable to a display device of various electronic apparatuses shown in FIGS. 39 to 44, such as digital cameras, notebook personal computers, portable terminal apparatuses including cellular phones, and video cameras.

As described above, with a display device according to an embodiment of the present invention as a display device of various electronic apparatuses, the electronic apparatuses achieve high-quality image display. That is, as is clear from the descriptions of the foregoing embodiments, a display device according to an embodiment of the present invention is capable of further reducing a pixel-to-pixel variation in the drain-source current Ids of the driving transistor 22 caused by a kink phenomenon and improving the quality of a display image. Thus, a high-quality display image can be achieved.

A display device according to an embodiment of the present invention may have a sealed module configuration. For example, a display module formed by attaching an opposing portion formed of transparent glass or the like is to the pixel array unit 30 is provided. A color filter, a protection film, and a light-shielding film as described above may be provided on the transparent opposing portion. Note that a circuit unit for receiving and transmitting a signal or the like from the outside and to the pixel array unit 30, a flexible printed circuit (FPC), and the like may be provided on the display module.

A specific example of an electronic apparatus according to an embodiment of the present invention will be described below.

Figure 39:
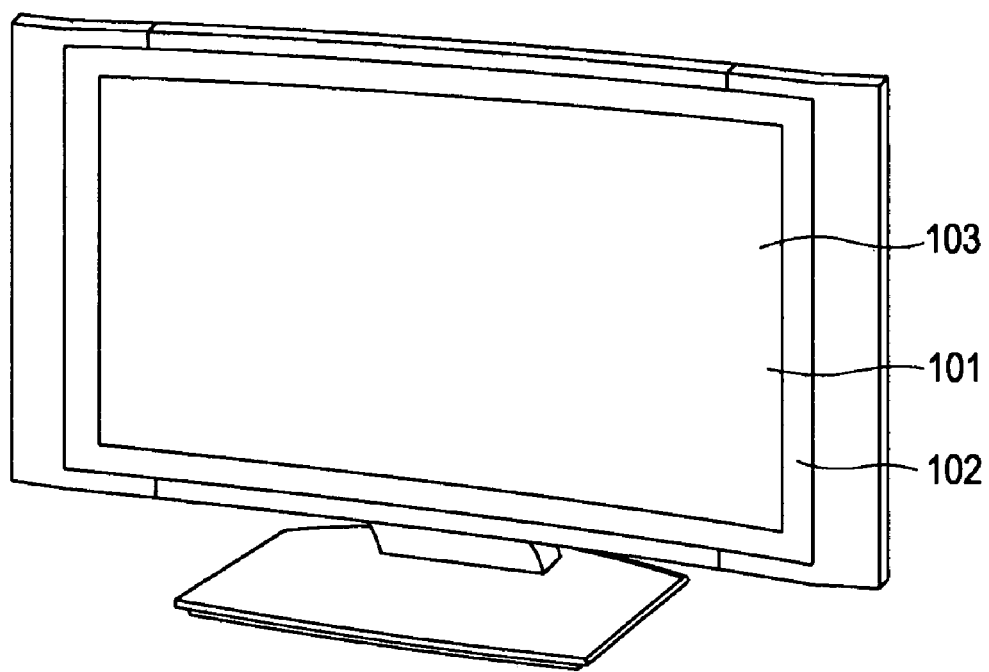
FIG. 39 is a perspective view showing the external appearance of a television set according to an embodiment of the present invention.

FIG. 39 is a perspective view showing the external appearance of a television set according to an embodiment of the present invention. The television set includes an image display screen unit 101 including a front panel 102, a filter glass unit 103, and the like. In the television set, a display device according to an embodiment of the present invention is used as the image display screen unit 101.

Figure 40A:
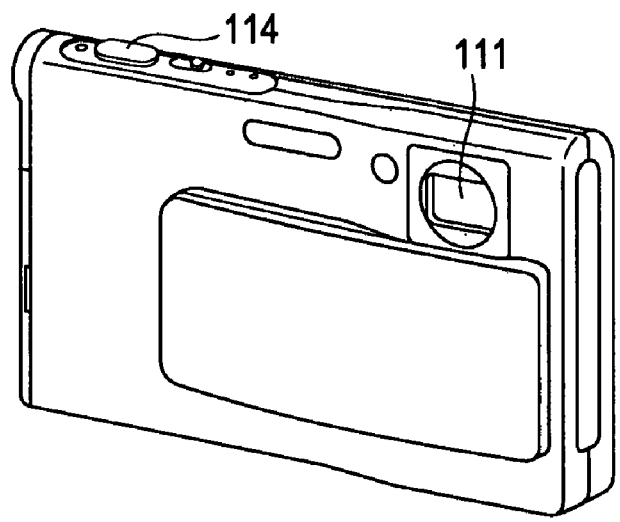
FIG. 40A is a perspective view showing the external appearance of a digital camera according to an embodiment of the present invention when viewed from a front side thereof.
Figure 40B:
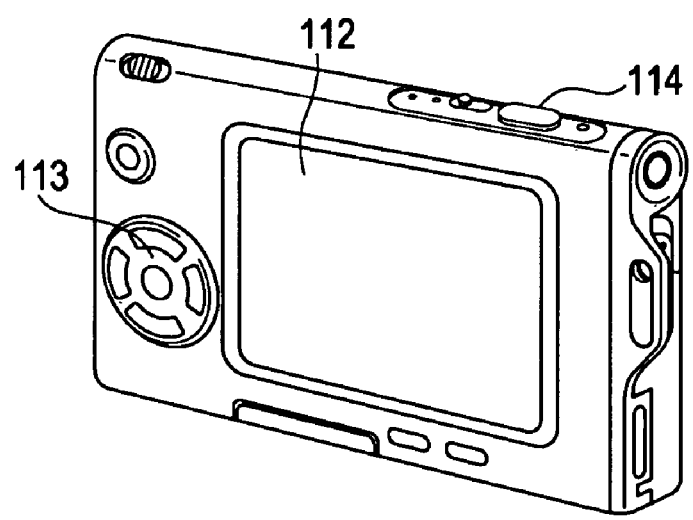
FIG. 40B is a perspective view showing the external appearance of the digital camera when viewed from a back side thereof.

FIG. 40A is a perspective view showing the external appearance of a digital camera according to an embodiment of the present invention when viewed from a front side thereof. FIG. 40B is a perspective view showing the external appearance of the digital camera when viewed from a back side thereof. The digital camera includes a flash light emitting unit 111, a display unit 112, a menu switch 113, a shutter button 114, and the like. In the digital camera, a display device according to an embodiment of the present invention is used as the display unit 112.

Figure 41:
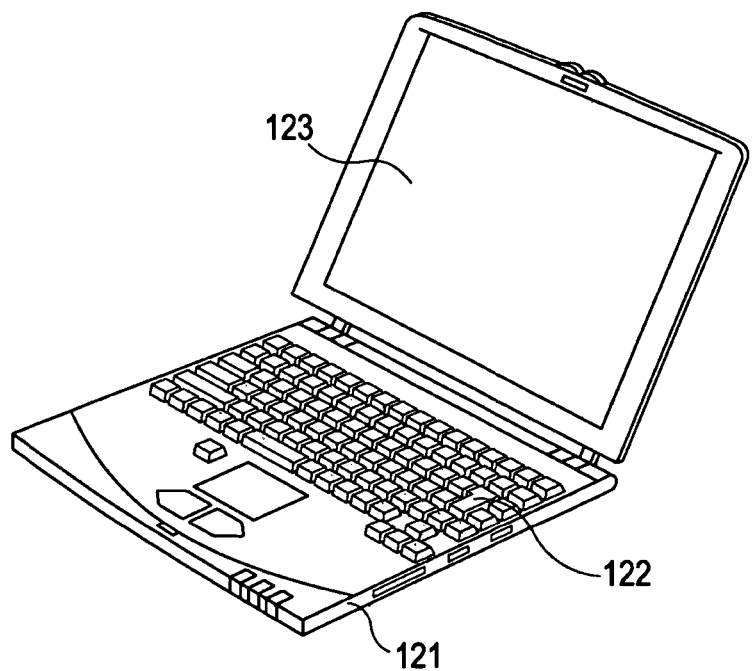
FIG. 41 is a perspective view of the external appearance of a notebook personal computer according to an embodiment of the present invention.

FIG. 41 is a perspective view showing the external appearance of a notebook personal computer according to an embodiment of the present invention. The notebook personal computer includes a keyboard 122 operated by a user to enter characters and the like into a main body 121, a display unit 123 for displaying images, and the like. In the notebook personal computer, a display device according to an embodiment of the present invention is used as the display unit 123.

Figure 42:
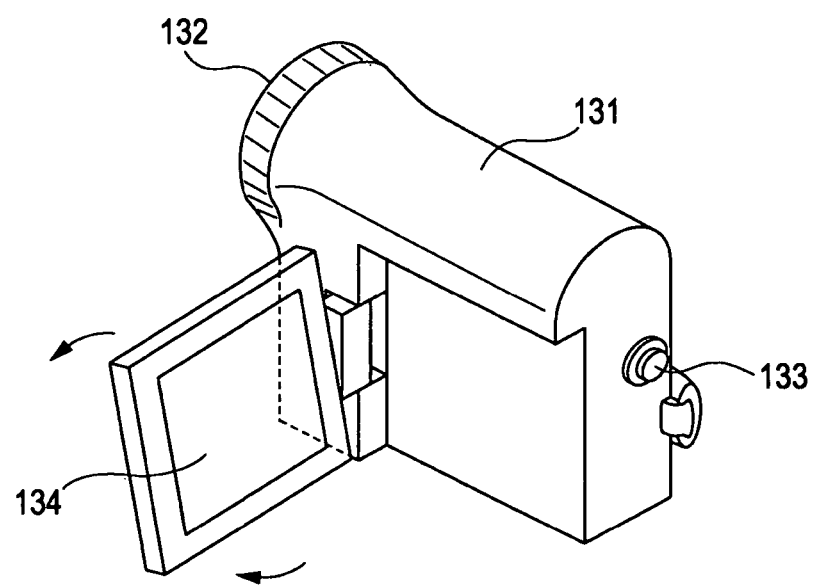
FIG. 42 is a perspective view of the external appearance of a video camera according to an embodiment of the present invention.
Figure 44:
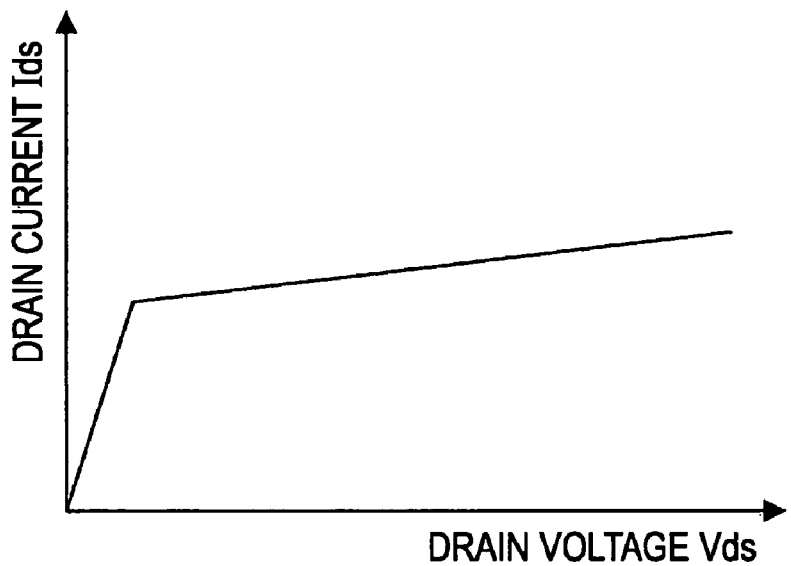
FIG. 44 is a characteristic diagram showing the drain voltage-drain current characteristics of a transistor.
Figure 45:
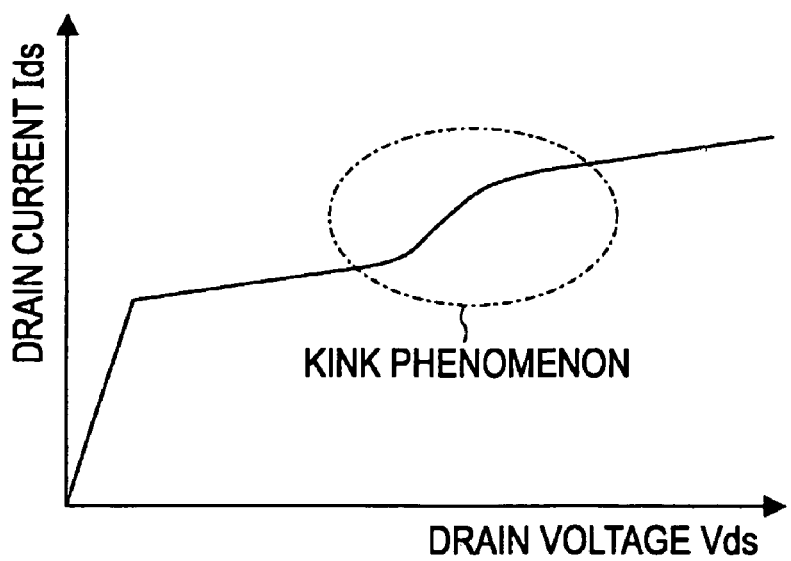
FIG. 45 is a characteristic diagram showing the drain voltage-drain current characteristics of a transistor exhibiting a kink phenomenon.

FIG. 42 is a perspective view showing the external appearance of a video camera according to an embodiment of the present invention. The video camera includes a main unit 131, a lens 132 arranged on a lateral side of the main unit 131 for capturing images of objects, a shooting start/stop switch 133, a display unit 134, and the like. In the video camera, a display device according to an embodiment of the present invention is used as the display unit 134.

FIGS. 43A to 43G are external views each showing a portable terminal apparatus according to an embodiment of the present invention. For example, the portable terminal apparatus is a cellular phone. FIG. 43A is a front view of the cellular phone in an opened state. FIG. 43B is a side view of the cellular phone in the opened state. FIG. 43C is a front view of the cellular phone in a closed state. FIG. 43D is a left-side view of the cellular phone in the closed state. FIG. 43E is a right-side view of the cellular phone in the closed state. FIG. 43F is a top view of the cellular phone in the closed state. FIG. 43G is a bottom view of the cellular phone in the closed state. The cellular phone includes an upper casing 141, a lower casing 142, a connection portion (here, a hinge portion) 143, a display 144, a sub-display 145, a picture light 146, a camera 147, and the like. In the cellular phone, a display device according to an embodiment of the present invention is used as the display 144 or the sub-display 145.

The present application contains subject matter related to that disclosed in Japanese Priority Patent Application JP 2008-121998 filed in the Japan Patent Office on May 8, 2008 and Japanese Priority Patent Application JP 2008-275095 filed in the Japan Patent Office on Oct. 27, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a pixel array unit in which pixels are arranged in a matrix, the pixels each including an electrooptical element, a writing transistor for writing an image signal, a storage capacitor for storing the image signal written by the writing transistor, and a driving transistor for driving the electrooptical element in accordance with the image signal stored in the storage capacitor, the pixels each having a function of performing a threshold correction process for, prior to driving the electrooptical element to emit light, changing a potential of a source of the driving transistor to a potential obtained by subtracting a threshold voltage of the driving transistor from an initial potential of a gate of the driving transistor; and
a power supply unit configured to set, as a power supply potential of a power supply line for supplying a current to the driving transistor, different potential values for a threshold correction period during which the threshold correction process is performed and for a light-emission period during which the electrooptical element emits light,
wherein the power supply unit sets the power supply potential for the threshold correction period, relative to the power supply potential for the light-emission period, to a potential at which a drain-source voltage of the driving transistor after performance of the threshold correction process is made the same as a drain-source voltage of the driving transistor during light emission of the electrooptical element.

2. An electronic apparatus comprising the display device according to claim 1.

3. A display device comprising
a pixel array unit in which pixels are arranged in a matrix, the pixels each including an electrooptical element, a writing transistor for writing an image signal, a storage capacitor for storing the image signal written by the writing transistor, and a driving transistor for driving the electrooptical element in accordance with the image signal stored in the storage capacitor, the pixels each having a function of performing a threshold correction process for prior to driving the electrooptical element to emit light, changing a potential of a source of the driving transistor to a potential obtained by subtracting a threshold voltage of the driving transistor from an initial potential of a gate of the driving transistor; and
a power supply unit configured to set, as a power supply potential of a power supply line for supplying a current to the driving transistor, different potential values for a threshold correction period during which the threshold correction process is performed and for a light-emission period during which the electrooptical element emits light,
wherein a mobility correction process is performed for each of the pixels, in parallel to a writing process for writing the image signal by using the writing transistor, by providing negative feedback to a potential difference between the gate and the source of the driving transistor at a correction amount corresponding to the current flowing in the driving transistor.

4. The display device according to claim 3, wherein the power supply unit sets, as the power supply potential of the power supply line for supplying a current to the driving transistor, the same potential value for the threshold correction period during which the threshold correction process is performed and for a mobility correction period during which the mobility correction process is performed.

5. The display device according to claim 4, wherein the power supply unit sets the power supply potential for the light-emission period and the power supply potential for the threshold correction period to potentials at which the driving transistor is not used in a region where a kink phenomenon occurs during the mobility correction period.

6. The display device according to claim 3, wherein the power supply unit sets, as the power supply potential of the power supply line for supplying a current to the driving transistor, different potential values for the threshold correction period during which the threshold correction process is performed and for the mobility correction period during which the mobility correction process is performed.

7. The display device according to claim 6, wherein the power supply unit sets the power supply potential for the mobility correction period, relative to the power supply potential for each of the threshold correction period and the light-emission period, to a potential at which a drain-source voltage of the driving transistor after performance of the threshold correction process, a drain-source voltage of the driving transistor during performance of the mobility correction process, and a drain-source voltage of the driving transistor during light emission of the electrooptical element are made the same.

8. The display device according to claim 3, wherein the pixels each perform, before performance of the writing process for writing the image signal by using the writing transistor, at least one mobility correction processing operation of the mobility correction process based on a halftone voltage which is between the initial voltage and a maximum voltage of the image signal.

9. The display device according to claim 8, wherein the power supply unit sets, as the power supply potential of the power supply line for supplying a current to the driving transistor, different potential values for the threshold correction period during which the threshold correction process is performed, for a mobility correction period during which the at least one mobility correction processing operation is performed, and for another mobility correction period during which a mobility correction processing operation is performed in parallel to the writing process for writing the image signal.

10. The display device according to claim 9, wherein the power supply unit sets the power supply potential for the threshold correction period, the power supply potential for the mobility correction period during which the at least one mobility correction processing operation is performed, and the power supply potential for the other mobility correction period during which the mobility correction processing operation is performed in parallel to the writing process for writing the image signal, relative to the power supply potential for the light-emission period, to potentials at which a drain-source voltage of the driving transistor after performance of the threshold correction process, a drain-source voltage of the driving transistor during performance of the mobility correction process, and a drain-source voltage of the driving transistor during light emission of the electrooptical element are made the same.

11. The display device according to claim 3, wherein the power supply unit controls the electrooptical element to emit light or not to emit light by switching the power supply potential of the power supply line.

12. An electronic apparatus comprising the display device according to claim 3.

13. A driving method for driving a display device in which pixels are arranged in a matrix, the pixels each including an electrooptical element, a writing transistor for writing an image signal, a storage capacitor for storing the image signal written by the writing transistor, and a driving transistor for driving the electrooptical element in accordance with the image signal stored in the storage capacitor, the pixels each having a function of performing a threshold correction process for, prior to driving the electrooptical element to emit light, changing a potential of a source of the driving transistor to a potential obtained by subtracting a threshold voltage of the driving transistor from an initial potential of a gate of the driving transistor, the method comprising the steps of:

setting, as a power supply potential of a power supply line for supplying a current to the driving transistor, different potential values for a threshold correction period during which the threshold correction process is performed and for a light-emission period during which the electrooptical element emits light; and performing a mobility correction process for each of the pixels, in parallel to a writing process for writing the image signal by using the writing transistor, by providing negative feedback to a potential difference between the gate and the source of the driving transistor at a correction amount corresponding to the current flowing in the driving transistor.

* * * * *